US009246498B2

(12) United States Patent
Shimura

(10) Patent No.: US 9,246,498 B2
(45) Date of Patent: Jan. 26, 2016

(54) ELECTRONIC CIRCUIT AND CONTROL METHOD

(71) Applicant: FUJITSU LIMITED, Kawasaki-shi, Kanagawa (JP)

(72) Inventor: Toshihiro Shimura, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/451,165

(22) Filed: Aug. 4, 2014

(65) Prior Publication Data

US 2015/0061781 A1  Mar. 5, 2015

(30) Foreign Application Priority Data

Aug. 28, 2013 (JP) ................................. 2013-177399

(51) Int. Cl.
| H03L 7/00 | (2006.01) |
| H03L 7/085 | (2006.01) |
| H03L 7/10 | (2006.01) |
| H03L 7/06 | (2006.01) |
| H03L 7/087 | (2006.01) |
| H03L 7/07 | (2006.01) |
| H03L 7/08 | (2006.01) |

(Continued)

(52) U.S. Cl.
CPC .................. *H03L 7/085* (2013.01); *H03L 7/00* (2013.01); *H03L 7/06* (2013.01); *H03L 7/07* (2013.01); *H03L 7/081* (2013.01); *H03L 7/0805* (2013.01); *H03L 7/087* (2013.01); *H03L 7/10* (2013.01); *H03L 7/101* (2013.01); *H03L 7/104* (2013.01); *H03L 7/23* (2013.01)

(58) Field of Classification Search
CPC ............. H03L 7/087; H03L 7/06; H03L 7/00; H03L 7/10; H03L 7/101; H03L 7/104
USPC .......... 331/2, 12, 45, 46, 18, 16, 34; 327/156, 327/158
See application file for complete search history.

(56) References Cited

U.S. PATENT DOCUMENTS 4,847,516 A * 7/1989 Fujita et al. ................... 327/147
5,391,996 A   2/1995 Marz
(Continued)

FOREIGN PATENT DOCUMENTS

JP    04-290307 A    10/1992
JP    08-321773 A    12/1996
(Continued)

OTHER PUBLICATIONS

Extended European Search Report, dated Dec. 19, 2014, issued in corresponding European Patent Application No. 14179735.7.

*Primary Examiner* — Arnold Kinkead
(74) *Attorney, Agent, or Firm* — Arent Fox LLP

(57) ABSTRACT

An electronic circuit, includes: a first oscillator configured to generate a reference signal; a plurality of phase synchronization circuits, each including a second oscillator configured to generate an output signal having a frequency corresponding to an input, and a phase comparator configured to input, to the second oscillator, a signal corresponding to a phase difference between the output signal generated by the second oscillator and the reference signal generated by the first oscillator; and a controller configured to control relative phases of the reference signals input to the phase synchronization circuits from the first oscillator, based on the signals input to the corresponding second oscillators from the phase comparators in the phase synchronization circuits.

20 Claims, 52 Drawing Sheets

(51) Int. Cl.
*H03L 7/081* (2006.01)
*H03L 7/23* (2006.01)

(56) References Cited

U.S. PATENT DOCUMENTS

2007/0063779 A1 3/2007 Kanda et al.
2008/0265999 A1 10/2008 Wan et al.
2011/0234277 A1 9/2011 Stephens et al.

FOREIGN PATENT DOCUMENTS

JP 10-341261 A 12/1998
JP 2007-082158 A 3/2007

\* cited by examiner

ELECTRONIC CIRCUIT AND CONTROL METHOD

CROSS-REFERENCE TO RELATED APPLICATIONS

This application is based upon and claims the benefit of priority of the prior Japanese Patent Application No. 2013-177399, filed on Aug. 28, 2013, the entire contents of which are incorporated herein by reference.

FIELD

The embodiments discussed herein are related to an electronic circuit and a control method.

BACKGROUND

There are phase locked loops (PLL) (phase synchronization circuits) in which feedback control is performed based on periodic signals that are input and signals whose phases are synchronous are output from internal oscillators.

Oscillators for the PLLs are implemented by, for example, voltage-controlled oscillators (VCOs).

For example, there is a known technology in which LC-resonant voltage-controlled oscillators are used as VCOs and inductance components of connection lines between oscillation nodes thereof are relatively reduced or injection locking is performed to cause oscillation of the LC-resonant oscillators (see, for example, Japanese Laid-open Patent Publication No. 2007-82158).

In the related art described above, however, in a configuration in which a reference signal from an oscillator is distributed to a plurality of PLLs, there is a problem in that, for example, a phase mismatch occurs between the output signals of the PLLs when characteristics of the oscillators in the PLLs vary.

SUMMARY

According to an aspect of the invention, an electronic circuit, includes: a first oscillator configured to generate a reference signal; a plurality of phase synchronization circuits, each including a second oscillator configured to generate an output signal having a frequency corresponding to an input, and a phase comparator configured to input, to the second oscillator, a signal corresponding to a phase difference between the output signal generated by the second oscillator and the reference signal generated by the first oscillator; and a controller configured to control relative phases of the reference signals input to the phase synchronization circuits from the first oscillator, based on the signals input to the corresponding second oscillators from the phase comparators in the phase synchronization circuits.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of an electronic circuit and a control method according to the present disclosure will be described in detail with reference to the accompanying drawings.

First Embodiment

Example Configuration 1 of Electronic Circuit According to First Embodiment

Figure 1A:
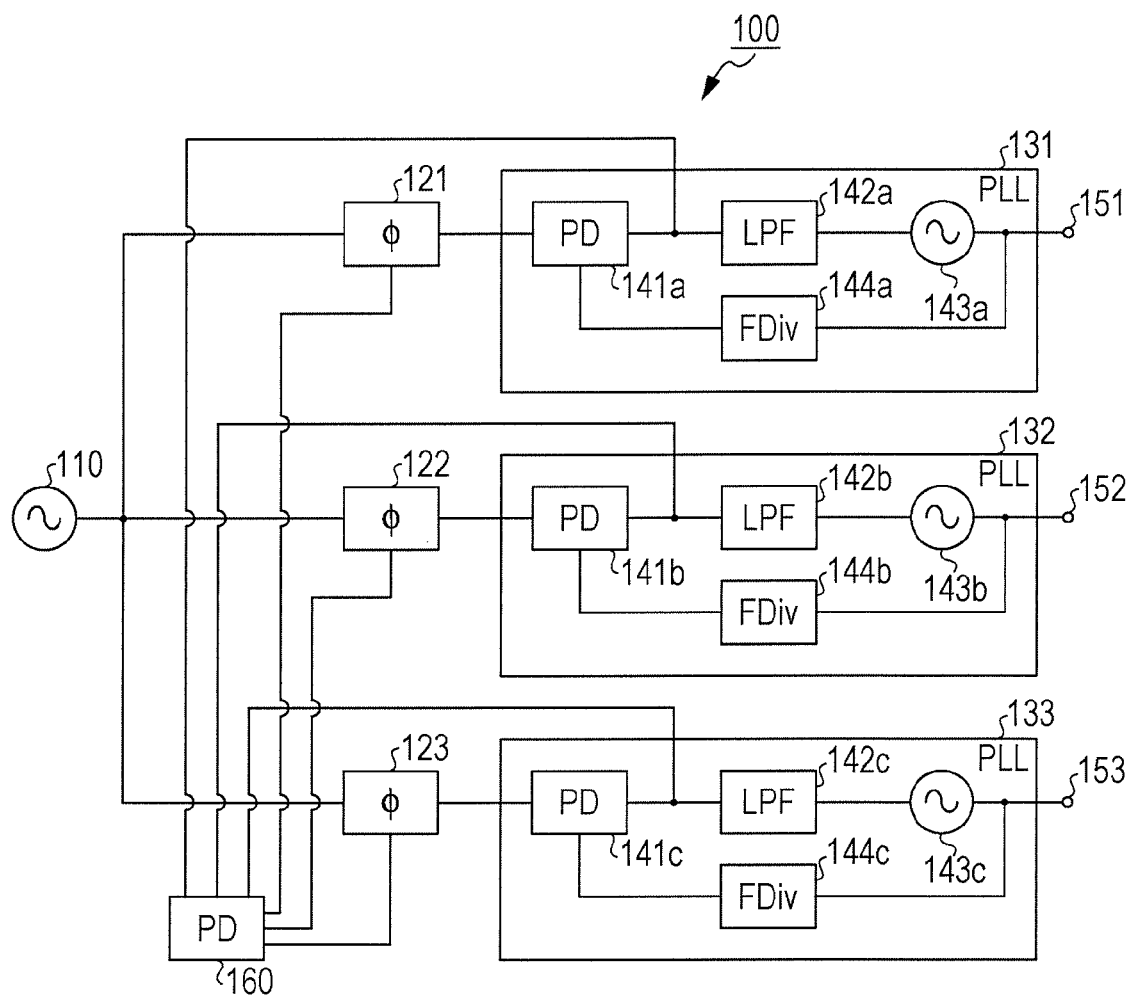
FIG. 1A is a block diagram illustrating example configuration 1 of an electronic circuit according to a first embodiment.

FIG. 1A is a block diagram illustrating example configuration 1 of an electronic circuit according to a first embodiment.

Figure 1B:
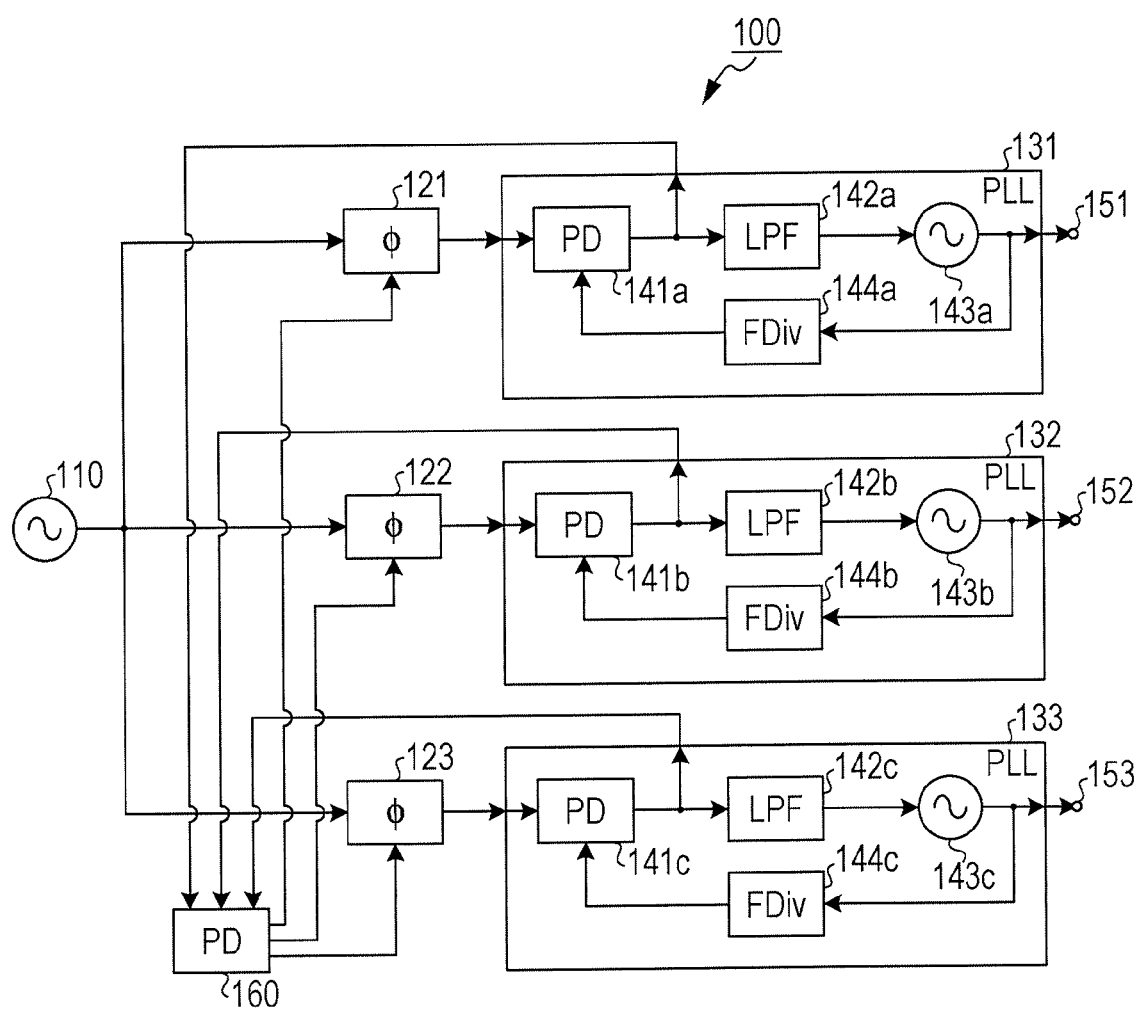
FIG. 1B is a diagram illustrating an example of flows of signals in the electronic circuit illustrated in FIG. 1A.

FIG. 1B is a diagram illustrating an example of flows of signals in the electronic circuit illustrated in FIG. 1A. As illustrated in FIGS. 1A and 1B, an electronic circuit 100 according to the first embodiment includes a reference signal oscillator 110, phase control devices (φ) 121 to 123, PLLs 131 to 133, output portions 151 to 153, and a phase comparator 160 (a phase detector: PD).

The reference signal oscillator 110 generates a reference signal. The reference signal generated by the reference signal oscillator 110 is, for example, a clock signal having a certain period. The reference signal oscillator 110 branches the generated reference signal and outputs the resulting reference signals to the phase control devices 121 to 123.

Each of the phase control devices 121 to 123 varies (adjusts) the phase of the reference signal output from the reference signal oscillator 110, by using an amount of phase corresponding to a signal output from the phase comparator 160. The phase control devices 121 to 123 then output the phase-varied reference signals having the varied phases to the PLLs 131 to 133, respectively. The phase control devices 121 to 123 may be realized by, for example, phase shifters having variable amounts of phase.

The PLLs 131 to 133 are phase synchronization circuits that output signals whose phases are synchronous with the reference signals output from the corresponding phase control devices 121 to 123, respectively. Specifically, the PLL 131 includes a phase comparator 141a (a phase detector: PD), a low-pass filter (LPF) 142a, a voltage controlled oscillator (VCO) 143a, and a frequency divider (FDiv) 144a. The PLL 132 also includes a phase comparator 141b, an LPF 142b, a VCO 143b, and a frequency divider 144b. The PLL 133 also includes a phase comparator 141c, an LPF 142c, a VCO 143c, and a frequency divider 144c. The reference signals output from the phase control devices 121 to 123 are input to the phase comparators 141a to 141c, respectively.

Although the description below is given of the phase comparator 141a, the LPF 142a, the VCO 143a, and the frequency divider 144a in the PLL 131, the same also applies to the PLLs 132 and 133. The phase comparator 141a compares the phase of the input reference signal with the phase of a frequency-divided signal output from the frequency divider 144a. The phase comparator 141a outputs a phase difference signal indicating a phase difference based on the phase comparison to the LPF 142a and the phase comparator 160. The phase comparator 141a is, for example, an exclusive-OR phase comparator.

The LPF 142a is a loop filter in a feedback loop. For example, the LPF 142a extracts only a low-frequency component of the phase difference signal output from the phase comparator 141a and outputs the extracted low-frequency component to the VCO 143a.

The VCO 143a generates a clock signal having a frequency corresponding to the phase difference signal output from the LPF 142a. The VCO 143a then outputs the generated clock signal. The frequency divider 144a frequency-divides the clock signal output from the VCO 143a. The frequency divider 144a then outputs the frequency-divided signal to the phase comparator 141a. The output portions 151 to 153 output the clock signals output from the VCOs 143a to 143c in the PLLs 131 to 133, respectively.

The phase comparator 160 (PD) performs phase comparison on the phase difference signals output from the PLLs 131 to 133. The phase comparator 160 then outputs, to the phase control devices 121 to 123, a signal indicating a phase difference based on the phase comparison. The phase comparator 160 is, for example, an exclusive-OR phase comparator.

For example, the phase comparator 160 outputs, to the phase control device 122, a signal indicating a phase difference between the phase difference signal from the PLL 131 and the phase difference signal from the PLL 132. The phase control device 122 varies the amount of phase of the reference signal so that the phase difference indicated by the signal output from the phase comparator 160 is reduced.

The phase comparator 160 also outputs, to the phase control device 123, a signal indicating a phase difference between the phase difference signal from the PLL 131 and the phase difference signal from the PLL 133. The phase control device 123 varies the amount of phase of the reference signal so that the phase difference indicated by the signal output from the phase comparator 160 is reduced.

With this arrangement, it is possible to match the phase differences in the PLLs 132 and 133 with the phase difference in the PLL 131. In this case, the phase comparator 160 may or may not output a signal to the phase control device 121. A configuration in which the phase control device 121 is omitted may also be used. The phase comparator 160, however, is not limited to such a configuration, and it suffices to control relative amounts of phase in the phase control devices 121 to 123 so that the phase difference between the phase difference signals output from the PLLs 131 to 133 is reduced.

With this arrangement, it is possible to match the output phases of the VCOs 143a to 143c. Thus, the phase comparator 160 and the phase control devices 121 to 123 serve as a controller that controls relative phases of the reference signals, input to the PLLs 131 to 133 from the reference signal oscillator 110, based on the phase difference signals of the PLLs 131 to 133.

Although the electronic circuit 100 including three PLLs (PLLs 131 to 133) therein has been described above with reference to FIGS. 1A and 1B, the electronic circuit 100 may be a device including two PLLs or a device including four or more PLLs.

As described above, in the electronic circuit 100, the phase difference signals respectively input to the phase comparators 141a to 141c from the VCOs 143a to 143c are obtained. In the electronic circuit 100, the relative phases of the reference signals input to the PLLs 131 to 133 from the reference signal oscillator 110 are controlled based on the obtained phase difference signals.

More specifically, in the electronic circuit 100, at least one of the phases of the reference signals input to the PLLs 131 to 133 from the reference signal oscillator 110 are controlled so that the phase difference between the phase difference signals is reduced. In the example illustrated in FIGS. 1A and 1B, in the electronic circuit 100, the phases of the reference signals input to the PLLs 132 and 133 are controlled.

With this arrangement, even when the frequency characteristics of the inputs to the VCOs 143a to 143c vary, it is possible to match the phases of the clock signals output from the output portions 151 to 153. That is, it is possible to suppress a phase mismatch due to variations in the characteristics of the VCOs 143a to 143c.

The electronic circuit 100 may also have a configuration in which the frequency dividers 144a to 144c are not included in the PLLs 131 to 133, and the reference signal oscillator 110 and the VCOs 143a to 143c operate at the same frequency. In this case, it is also possible to suppress phase mismatches due to variations in the characteristics of the VCOs 143a to 143c.

Example Configuration 2 of Electronic Circuit According to First Embodiment

Figure 2A:
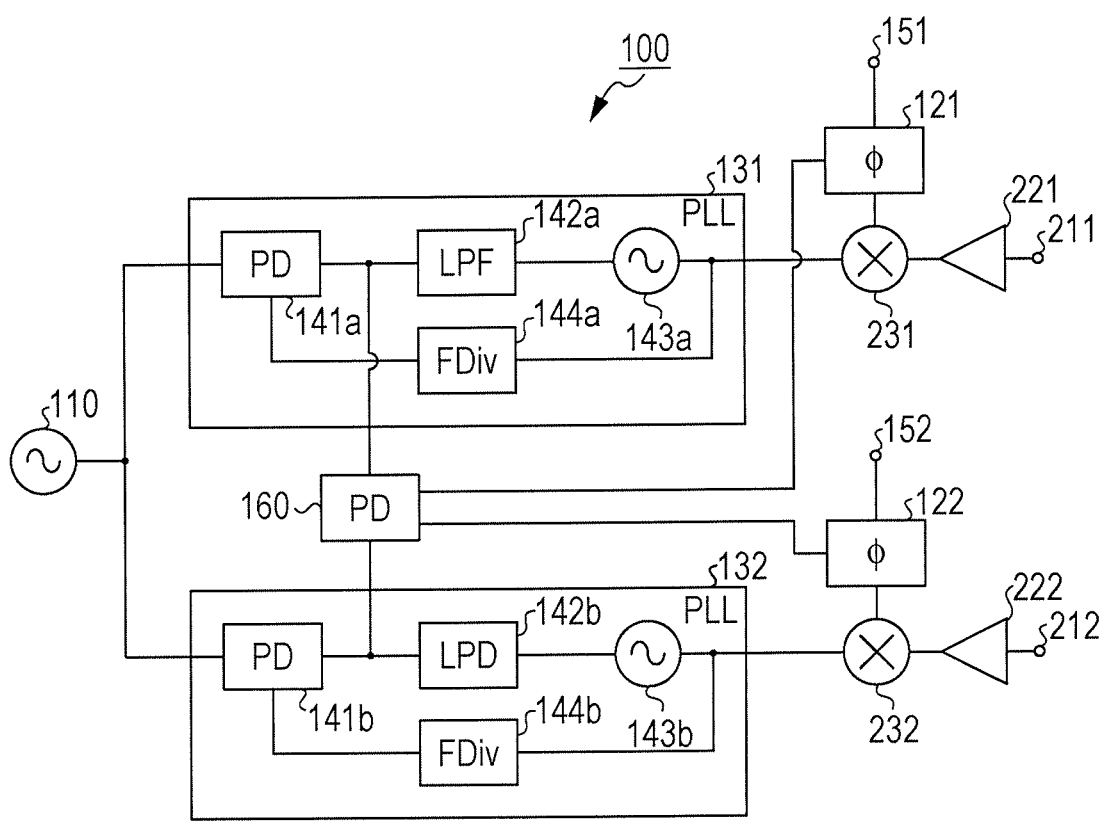
FIG. 2A is a diagram illustrating example configuration 2 of the electronic circuit according to the first embodiment.
Figure 2B:
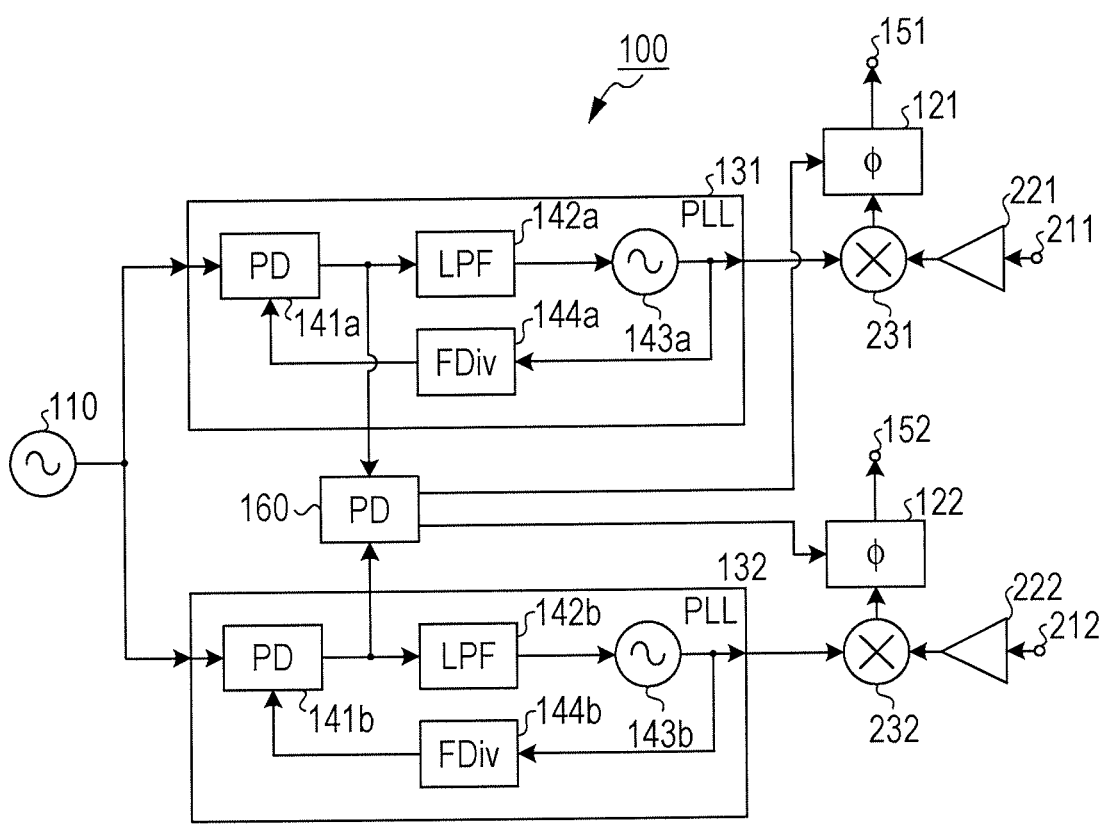
FIG. 2B is a diagram illustrating an example of flows of signals in the electronic circuit illustrated in FIG. 2A.

FIG. 2A is a diagram illustrating example configuration 2 of the electronic circuit according to the first embodiment. FIG. 2B is a diagram illustrating an example of flows of signals in the electronic circuit illustrated in FIG. 2A. In FIGS. 2A and 2B, elements that are the same as or similar to those illustrated in FIGS. 1A and 1B are denoted by the same reference numerals, and descriptions thereof are not given hereinafter. An electronic circuit 100 illustrated in FIGS. 2A and 2B is, for example, a device that is applicable to a signal reception apparatus. For example, in the electronic circuit 100, output signals of the PLLs 131 and 132 are used as local signals to convert the frequencies of reception signals.

The electronic circuit 100 illustrated in FIGS. 2A and 2B includes a reference signal oscillator 110, phase control devices 121 and 122, PLLs 131 and 132, output portions 151 and 152, and a phase comparator 160. The electronic circuit 100 further includes input portions 211 and 212, amplifiers 221 and 222, and mixers 231 and 232. In the example illustrated in FIGS. 2A and 2B, reference signals output from the reference signal oscillator 110 are input to the phase comparators 141a and 141b without the involvement of the phase control devices 121 and 122.

Reception signals received by, for example, an antenna of a reception apparatus are input to the input portions 211 and 212. The input portions 211 and 212 output the input reception signals to the amplifiers 221 and 222, respectively. The amplifiers 221 and 222 receive the reception signals output from the input portions 211 and 212, respectively. The amplifiers 221 and 222 then output amplified reception signals to the mixers 231 and 232, respectively.

The mixer 231 multiplies the reception signal output from the amplifier 221 by a clock signal output from the PLL 131 and outputs the resulting signal to the phase control device 121. The mixer 232 multiplies the reception signal output from the amplifier 222 by a clock signal output from the PLL 132 and outputs the resulting signal to the phase control device 122.

As a result, it is possible to convert the frequencies of the reception signals. For example, each of the mixers 231 and 232 converts the reception signal in a radio frequency (RF: high frequency) band into an intermediate frequency (IF) band signal or a baseband signal. The mixers 231 and 232 may be implemented by, for example, multiplication circuits.

The phase control devices 121 and 122 vary the phases of the reception signals output from the mixers 231 and 232, by using the amount of phase corresponding to a signal output from the phase comparator 160. The phase control devices 121 and 122 then output the phase-varied reception signals to the output portions 151 and 152, respectively. The output portions 151 and 152 output the reception signals output from the phase control devices 121 and 122, respectively.

For example, the phase comparator 160 outputs, to the phase control device 122, a signal indicating a phase difference between the phase difference signal from the PLL 131 and the phase difference signal from the PLL 132. The phase control device 122 varies the amount of phase of a signal so that the phase difference indicated by the signal output from the phase comparator 160 is reduced. With this arrangement, it is possible to match the phases of signals output from the output portions 151 and 152.

In this case, the phase comparator 160 may or may not output a signal to the phase control device 121. A configuration in which the phase control device 121 is omitted may also be used. The phase comparator 160, however, is not limited to such a configuration, and it suffices to control relative amounts of phase in the phase control devices 121 and 122 so that the phase difference between the phase difference signals output from the PLLs 131 and 132 is reduced. With this arrangement, the reception signals input from the input portions 211 and 212 can be frequency-converted and output from the output portions 151 and 152, and also the phases of the reception signals to be output can be made to match each other.

Although the electronic circuit 100 including two PLLs (the PLLs 131 and 132) has been described above with reference to FIGS. 2A and 2B, the electronic circuit 100 may also be a device including three or more PLLs.

As described above, in the electronic circuit 100, phase difference signals respectively input to the VCOs 143a and 143b from the phase comparators 141a and 141b are obtained. In the electronic circuit 100, the relative phases of the reception signals (target signals) output from the mixers 231 and 232 are controlled based on the obtained phase difference signals.

More specifically, in the electronic circuit 100, at least one of the phases of the reception signals output from the mixers 231 and 232 are controlled so that the phase difference between the phase difference signals is reduced. In the example illustrated in FIGS. 2A and 2B, in the electronic circuit 100, the phase of the reception signal output from the mixer 232 is controlled.

With this arrangement, even when the frequency characteristics of the inputs to the VCOs 143a and 143b vary, it is possible to match the phases of the reception signals output from the output portions 151 and 152. That is, it is possible to suppress a phase mismatch due to variations in the characteristics of the VCOs 143a and 143b.

Although a case in which reception signals are input to the input portions 211 and 212 has been described in the example illustrated in FIGS. 2A and 2B, the signals input to the input portions 211 and 212 are not limited to reception signals and may be any type of signal.

Example Configuration 3 of Electronic Circuit According to First Embodiment

Figure 3A:
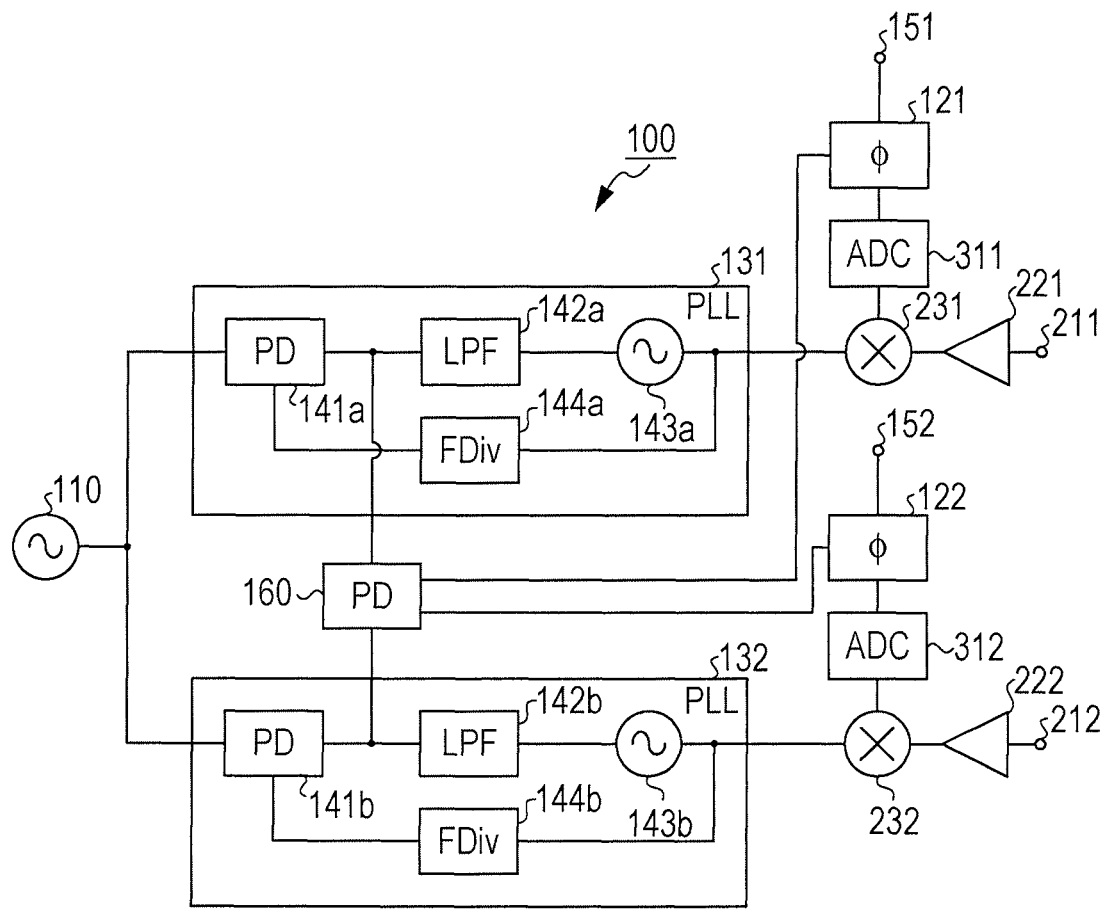
FIG. 3A is a diagram illustrating example configuration 3 of the electronic circuit according to the first embodiment.
Figure 3B:
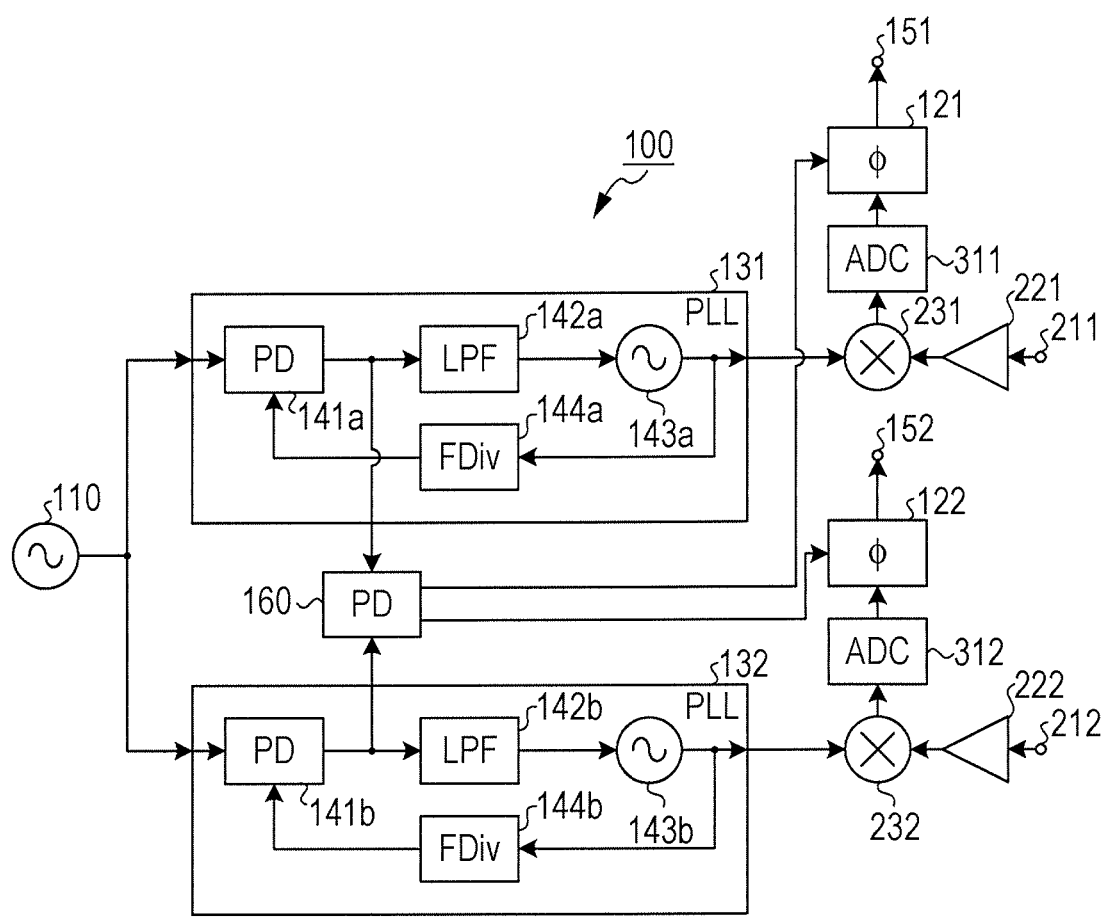
FIG. 3B is a diagram illustrating an example of flows of signals in the electronic circuit illustrated in FIG. 3A.

FIG. 3A is a diagram illustrating example configuration 3 of the electronic circuit according to the first embodiment. FIG. 3B is a diagram illustrating an example of flows of signals in the electronic circuit illustrated in FIG. 3A. In FIGS. 3A and 3B, elements that are the same as or similar to those illustrated in FIGS. 2A and 2B are denoted by the same reference numerals, and descriptions thereof are not given hereinafter. An electronic circuit 100 illustrated in FIGS. 3A and 3B includes analog-to-digital converters (ADCs) 311 and 312 in addition to the configuration illustrated in FIGS. 2A and 2B.

The ADCs 311 and 312 convert the reception signals, respectively output from the mixers 231 and 232, from analog signals to digital signals. The ADCs 311 and 312 then output the reception signals, converted into the digital signals, to the phase control devices 121 and 122, respectively.

The phase control devices 121 and 122 digitally vary the phases of the reception signals output from the ADCs 311 and 312, respectively. In such a manner, the phase control devices 121 and 122 may be implemented by digital processing units to vary the phases of the reception signals. In such a case, even when the frequency characteristics of the inputs to the VCOs 143a and 143b vary, it is also possible to match the phases of the reception signals output from output portions 151 and 152, as in the configuration illustrated in FIGS. 2A and 2B. That is, it is possible to suppress a phase mismatch due to variations in the characteristics of the VCOs 143a and 143b.

Example Configuration 4 of Electronic Circuit According to First Embodiment

Figure 4A:
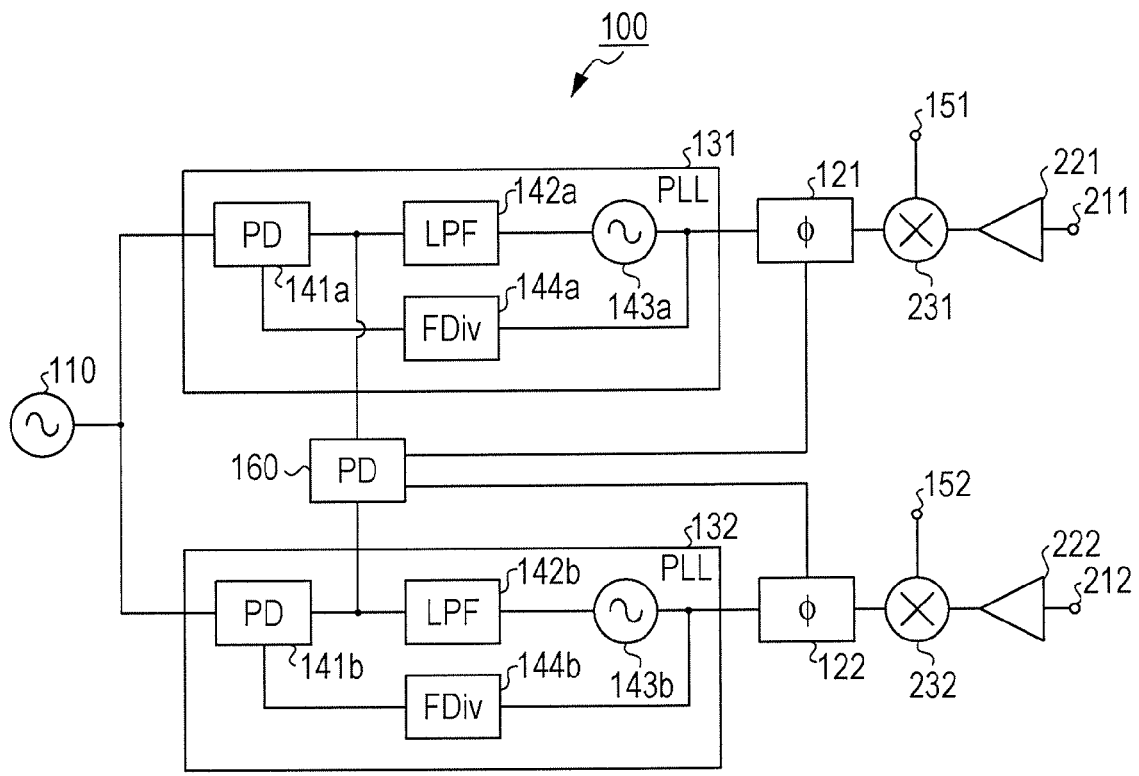
FIG. 4A is a diagram illustrating example configuration 4 of the electronic circuit according to the first embodiment.
Figure 4B:
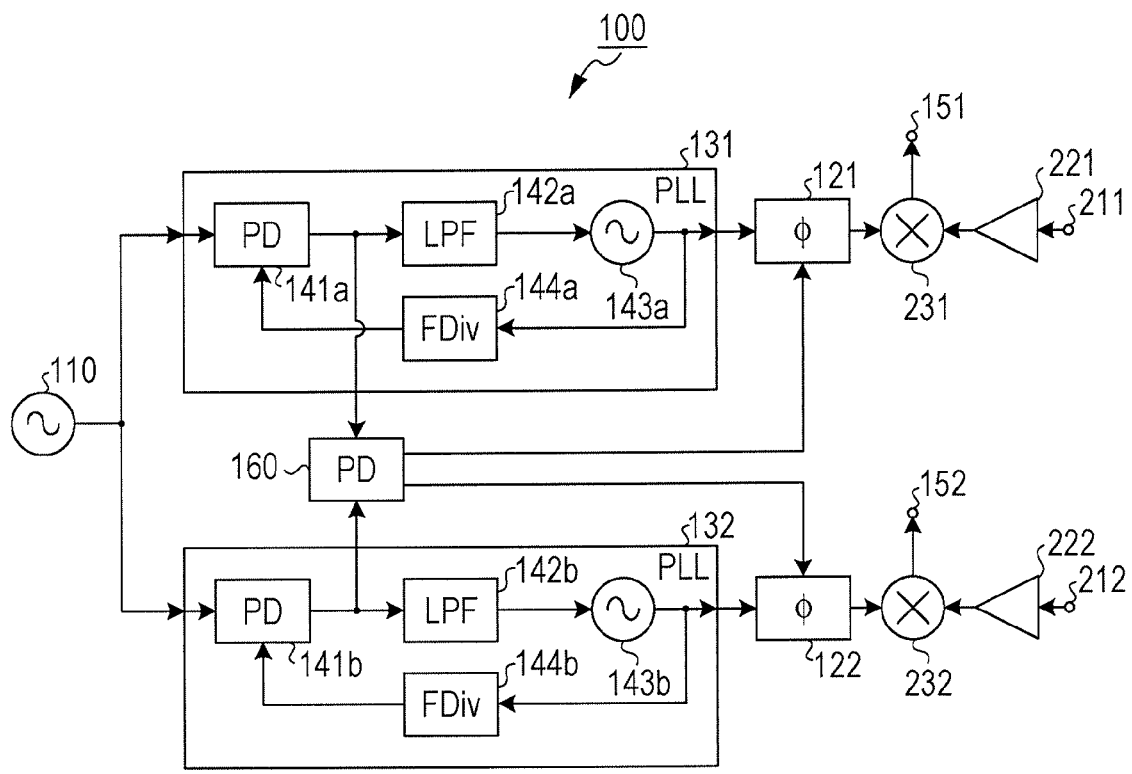
FIG. 4B is a diagram illustrating an example of flows of signals in the electronic circuit illustrated in FIG. 4A.

FIG. 4A is a diagram illustrating example configuration 4 of the electronic circuit according to the first embodiment. FIG. 4B is a diagram illustrating an example of flows of signals in the electronic circuit illustrated in FIG. 4A. In FIGS. 4A and 4B, elements that are the same as or similar to those illustrated in FIGS. 2A and 2B are denoted by the same reference numerals, and descriptions thereof are not given hereinafter.

In the example illustrated in FIGS. 4A and 4B, the phase control devices 121 and 122 vary the phases of clock signals output from the PLLs 131 and 132, respectively. The phase control devices 121 and 122 then output the phase-varied signals to the mixers 231 and 232, respectively.

The mixer 231 multiplies the reception signal output from the amplifier 221 by the clock signal output from the phase control device 121 and outputs the resulting reception signal to the output portion 151. The mixer 232 multiplies the reception signal output from the amplifier 222 by the clock signal output from the phase control device 122 and outputs the resulting reception signal to the output portion 152. The output portions 151 and 152 output the reception signals output from the mixers 231 and 232, respectively.

As described above, the phase control devices 121 and 122 may vary the phases between the PLLs 131 and 132 and the corresponding mixers 231 and 232. In this case, even when the frequency characteristics of the inputs to the VCOs 143a and 143b vary, it is also possible to match the phases of the reception signals output from the output portions 151 and 152, as in the configuration illustrated in FIGS. 2A and. 2B. That is, it is possible to suppress a phase mismatch due to variations in the characteristics of the VCOs 143a and 143b.

Example Configuration 5 of Electronic Circuit According to First Embodiment

Figure 5A:
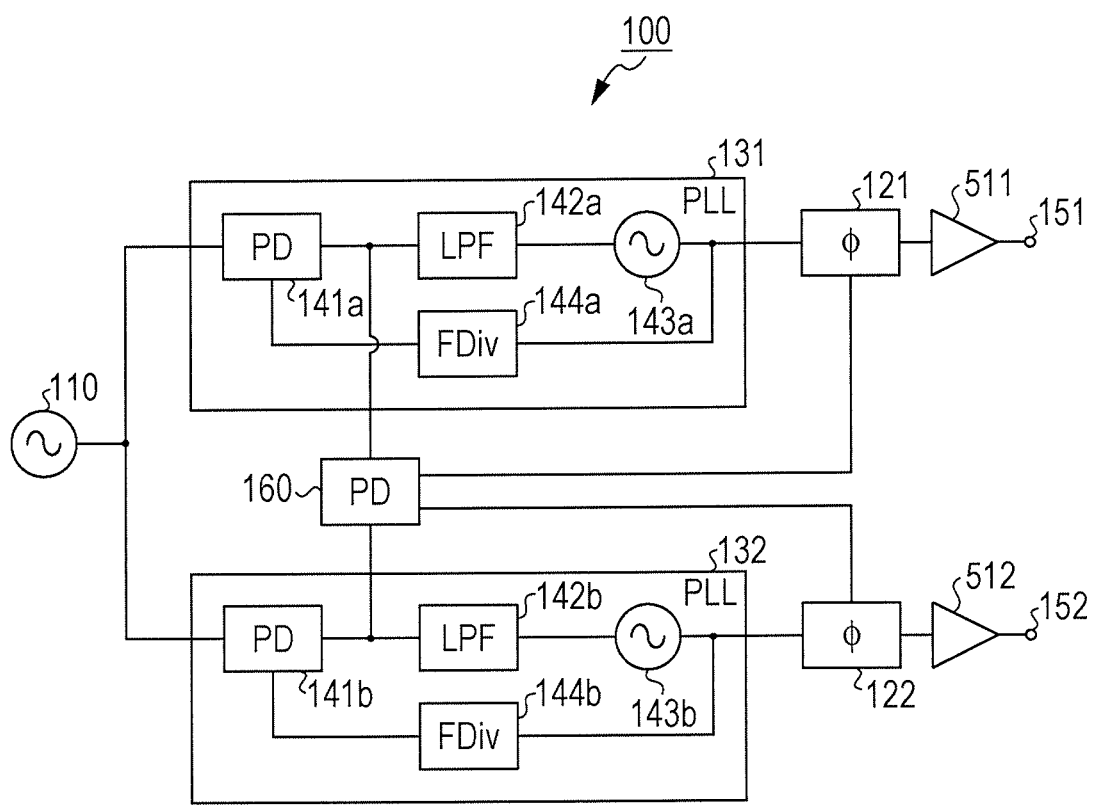
FIG. 5A is a diagram illustrating example configuration 5 of the electronic circuit according to the first embodiment.
Figure 5B:
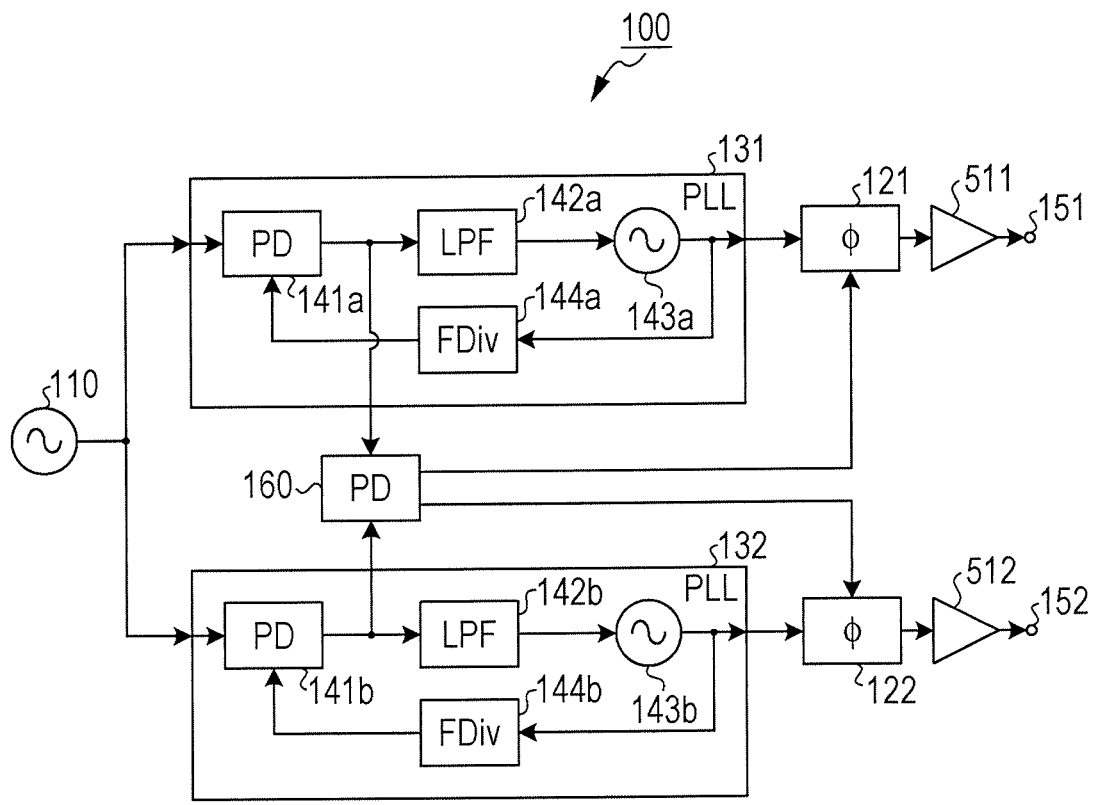
FIG. 5B is a diagram illustrating an example of flows of signals in the electronic circuit illustrated in FIG. 5A.

FIG. 5A is a diagram illustrating example configuration 5 of the electronic circuit according to the first embodiment. FIG. 5B is a diagram illustrating an example of flows of signals in the electronic circuit illustrated in FIG. 5A. In FIGS. 5A and 5B, elements that are the same as or similar to those illustrated in FIGS. 2A and 2B are denoted by the same reference numerals, and descriptions thereof are not given hereinafter. An electronic circuit 100 illustrated in FIGS. 5A and 5B is, for example, a device that is applicable to a signal transmission apparatus. For example, in the electronic circuit 100, PLLs 131 and 132 generate clock signals for generating transmission signals. Alternatively, the PLLs 131 and 132 may generate sine-wave signals (transmission carrier signals), not rectangular-wave signals typically used as digital clock signals.

The electronic circuit 100 illustrated in FIGS. 5A and 5B includes a reference signal oscillator 110, phase control devices 121 and 122, the PLLs 131 and 132, output portions 151 and 152, phase comparator 160, and amplifiers 511 and 512. In the example illustrated in FIGS. 5A and 5B, the phase control devices 121 and 122 vary the phases of clock signals output from the PLLs 131 and 132, respectively. The phase control devices 121 and 122 then output the phase-varied clock signal to the amplifiers 511 and 512, respectively.

The amplifiers 511 and 512 amplify the clock signals output from the phase control devices 121 and 122, respectively. The amplifiers 511 and 512 then output the amplified clock signals to the output portions 151 and 152, respectively. The output portions 151 and 152 output the clock signals, respectively output from the amplifiers 511 and 512, to transmitting units, which transmit signals based on the clock signals. The transmitting units include, for example, modulators 2341 and 2342, amplifiers 2351 and 2352, and antennas 2361 and 2362 illustrated in FIGS. 23C and 23D.

With this arrangement, the clock signals output from the output portions 151 and 152 are subjected to, for example, modulation, and the resulting transmission signals are transmitted from the antennas of the transmission apparatus. Thus, it is possible to match the phases of the transmission signals.

As described above, in the electronic circuit 100, the relative phases of the output signals from the PLLs 131 and 132 are controlled based on the phase difference signals. More specifically, in the electronic circuit 100, at least one of the phases of the output signals from the PLLs 131 and 132 are controlled so that the phase difference between the phase difference signals is reduced.

With this arrangement, even when the frequency characteristics of the inputs to the VCOs 143a and 143b vary, it is possible to match the phases of the transmission signals based on the output signals from the output portions 151 and 152. That is, it is possible to suppress a phase mismatch due to variations in the characteristics of the VCOs 143a and 143b.

Example Configuration 6 of Electronic Circuit According to First Embodiment

Figure 6A:
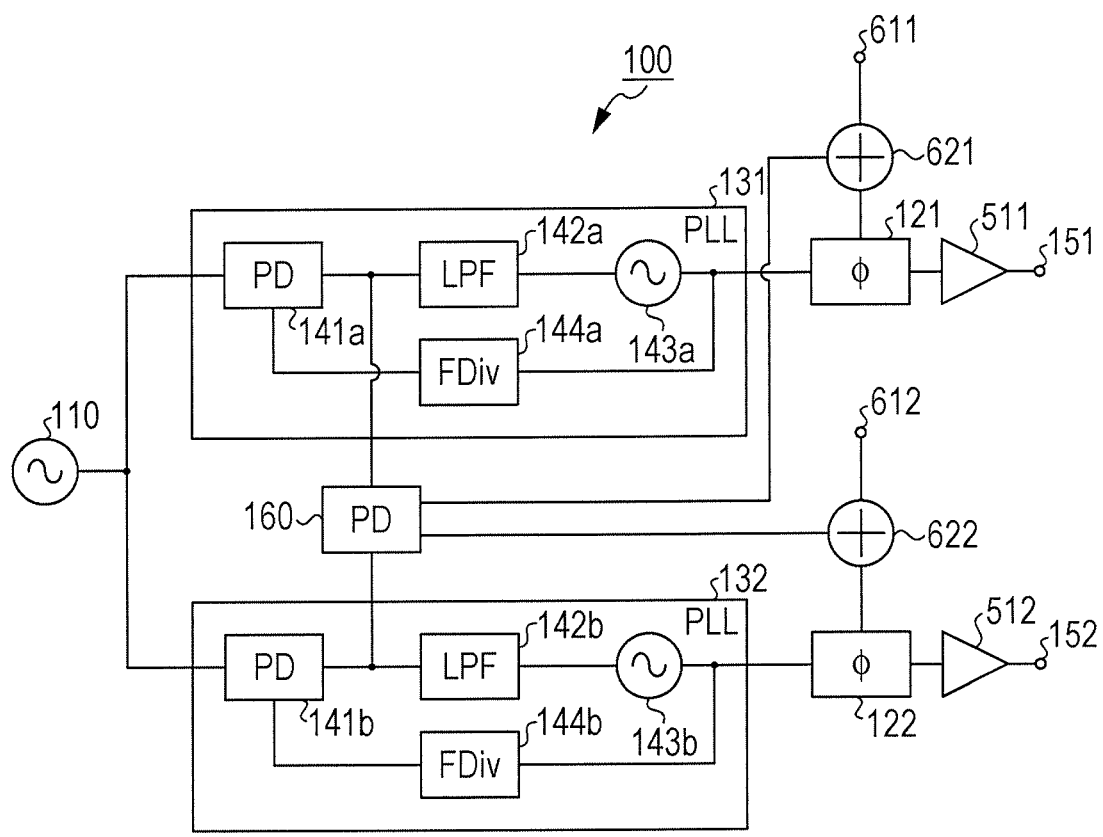
FIG. 6A is a diagram illustrating example configuration 6 of the electronic circuit according to the first embodiment.
Figure 6B:
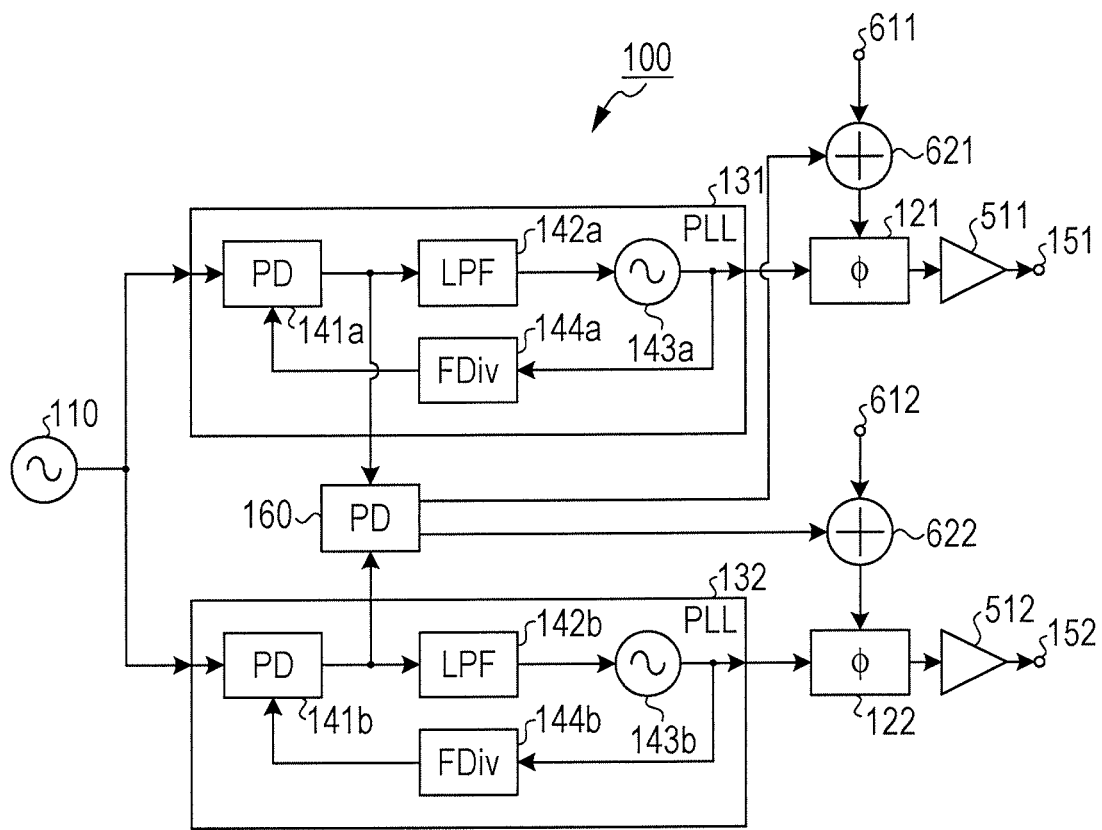
FIG. 6B is a diagram illustrating an example of flows of signals in the electronic circuit illustrated in FIG. 6A.

FIG. 6A is a diagram illustrating example configuration 6 of the electronic circuit according to the first embodiment. FIG. 6B is a diagram illustrating an example of flows of signals in the electronic circuit illustrated in FIG. 6A. In FIGS. 6A and 6B, elements that are the same as or similar to those illustrated in FIGS. 5A and 5B are denoted by the same reference numerals, and descriptions thereof are not given hereinafter.

An electronic circuit 100 illustrated in FIGS. 6A and 6B includes input portions 611 and 612 and addition units 621 and 622, in addition to the configuration illustrated in FIGS. 5A and 5B. For example, in order to perform beamforming or the like, the phase control devices 121 and 122 may also be used as phase shifters for a phased array to give a predetermined phase difference to clock signals output from the output portions 151 and 152. In this case, signals indicating an amount of phase corresponding to the predetermined phase difference are input to the input portions 611 and 612. The input portions 611 and 612 output the input signals to the addition units 621 and 622, respectively.

The addition unit 621 adds a signal output from the phase comparator 160 and the signal output from the input portion 611 and outputs the resulting signal to the phase control device 121. The addition unit 622 adds a signal output from the phase comparator 160 and the signal output from the input portion 612 and outputs the resulting signal to the phase control device 122. By using the amounts of phase corresponding to the signals respectively output from the input portions 611 and 612, the phase control devices 121 and 122 vary the phases of the signals output from the VCOs 143a and 143b, respectively.

As described above, in the electronic circuit 100, based on the phase difference signals of the PLLs 131 and 132 and the signal corresponding to the predetermined phase difference, the phase difference between the output signals of the PLLs 131 and 132 is controlled to have the predetermined phase difference. With this arrangement, even when the frequency characteristics of the inputs to the VCOs 143a and 143b vary, it is possible to make the phases of the clock signals output from the output portions 151 and 152 to have the predetermined phase difference. That is, it is possible to suppress a phase mismatch due to variations in the characteristics of the VCOs 143a and 143b.

Example Configuration 7 of Electronic Circuit According to First Embodiment

Figure 7A:
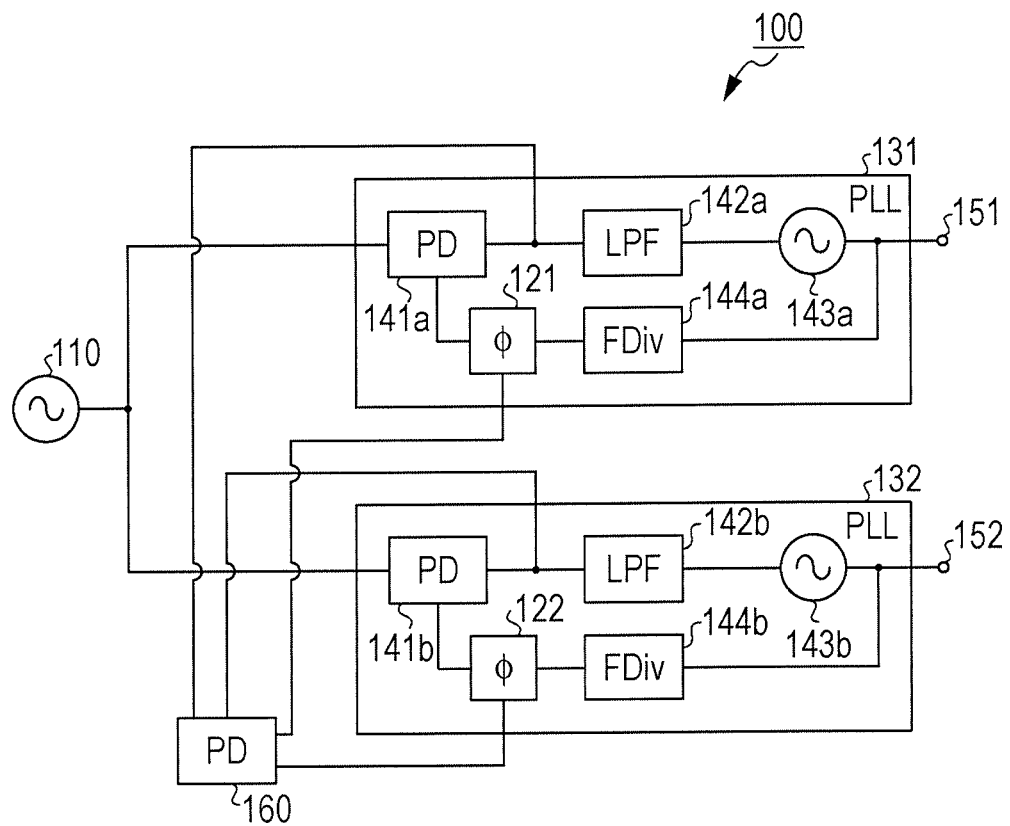
FIG. 7A is a diagram illustrating example configuration 7 of the electronic circuit according to the first embodiment.
Figure 7B:
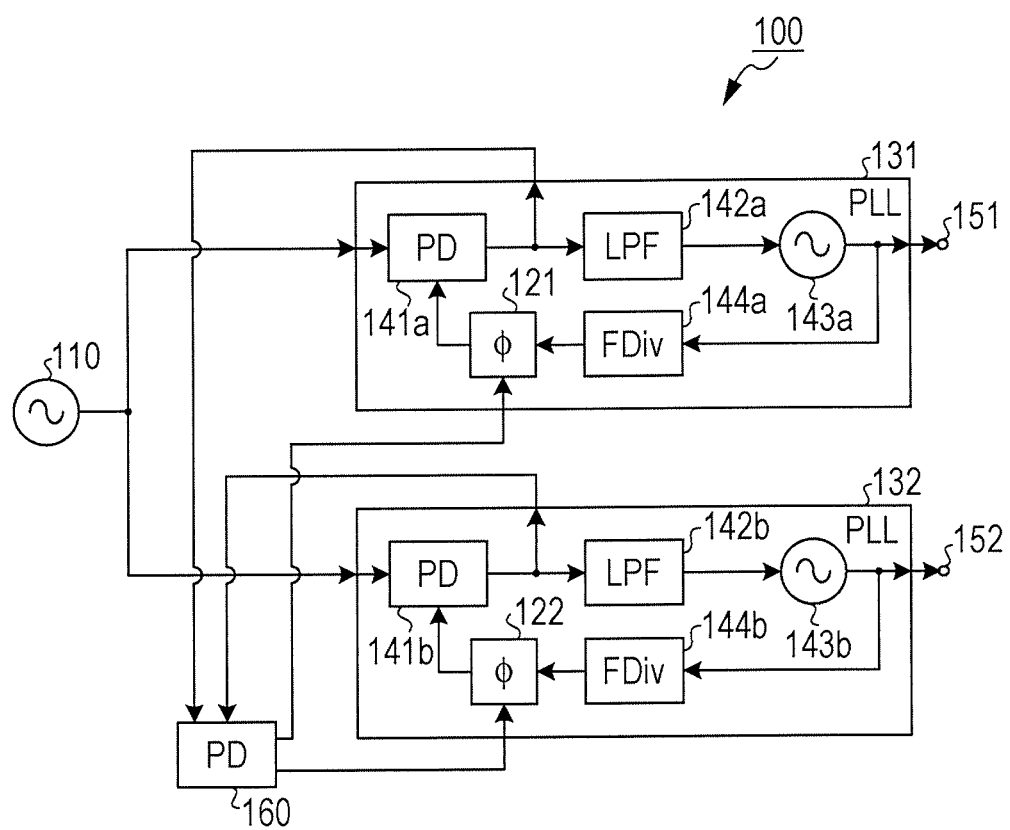
FIG. 7B is a diagram illustrating an example of flows of signals in the electronic circuit illustrated in FIG. 7A.

FIG. 7A is a diagram illustrating example configuration 7 of the electronic circuit according to the first embodiment. FIG. 7B is a diagram illustrating an example of flows of signals in the electronic circuit illustrated in FIG. 7A. In FIGS. 7A and 7B, elements that are the same as or similar to those illustrated in FIGS. 2A and 2B are denoted by the same reference numerals, and descriptions thereof are not given hereinafter.

In the example illustrated in FIGS. 7A and 7B, the phase control devices 121 and 122 are included in the PLLs 131 and 132, respectively. In the PLL 131, the phase control device 121 varies the phase of the frequency-divided signal output from the frequency divider 144a and outputs the resulting frequency-divided signal to the phase comparator 141a. In the PLL 132, the phase control device 122 varies the phase of the frequency-divided signal output from the frequency divider 144b and outputs the resulting frequency-divided signal to the phase comparator 141b.

As described above, in the electronic circuit 100, the relative phases of the output signals input to the phase comparators 141a and 141b from the VCOs 143a and 143b in the PLLs 131 and 132 are controlled based on the phase difference signals of the PLLs 131 and 132.

More specifically, in the electronic circuit 100, at least one of the phases of the output signals output from the frequency dividers 144a and 144b in the PLLs 131 and 132 to the phase comparators 141a and 141b are controlled so that the phase difference between the phase difference signals is reduced.

With this arrangement, even when the frequency characteristics of the inputs to the VCOs 143a and 143b vary, it is possible to match the phases of the clock signals output from the output portions 151 and 152. That is, it is possible to suppress a phase mismatch due to variations in the characteristics of the VCOs 143a and 143b.

Example Configuration 8 of Electronic Circuit According to First Embodiment

Figure 8A:
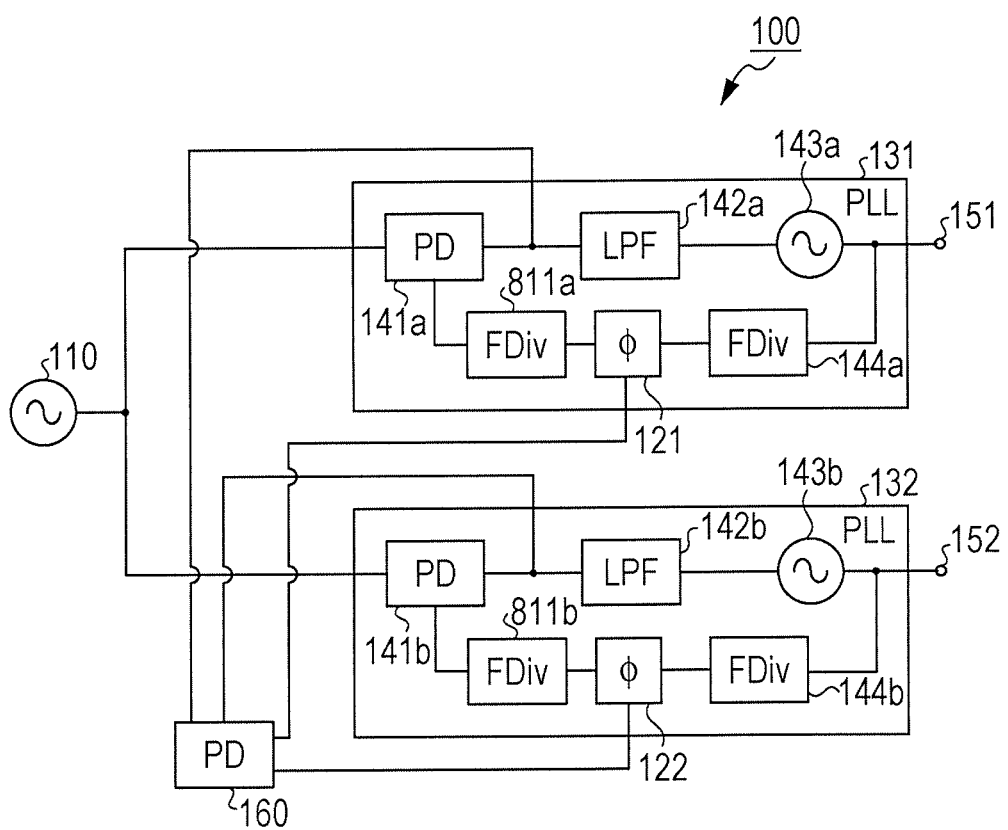
FIG. 8A is a diagram illustrating example configuration 8 of the electronic circuit according to the first embodiment.
Figure 8B:
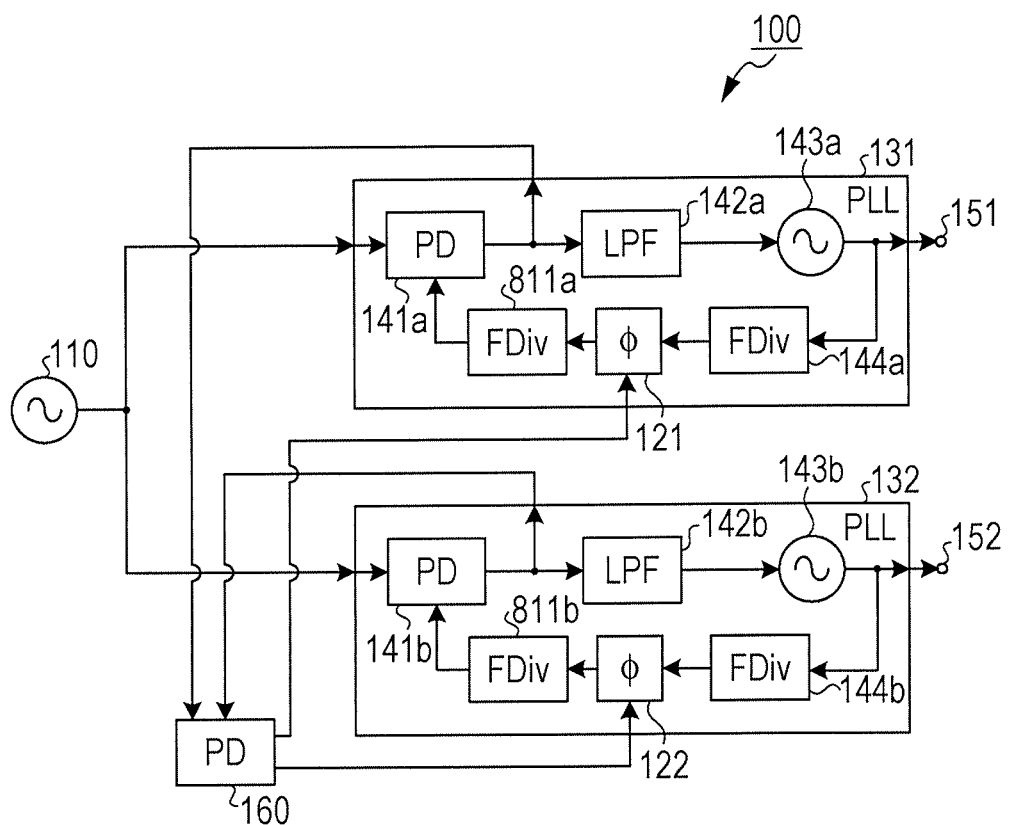
FIG. 8B is a diagram illustrating an example of flows of signals in the electronic circuit illustrated in FIG. 8A.

FIG. 8A is a diagram illustrating example configuration 8 of the electronic circuit according to the first embodiment. FIG. 8B is a diagram illustrating an example of flows of signals in the electronic circuit illustrated in FIG. 8A. In FIGS. 8A and 8B, elements that are the same as or similar to those illustrated in FIGS. 7A and 7B are denoted by the same reference numerals, and descriptions thereof are not given hereinafter.

The PLLs 131 and 132 illustrated in FIGS. 8A and 8B have respective frequency dividers 811a and 811b, in addition to the configuration illustrated in FIGS. 7A and 7B. The frequency divider 811a in the PLL 131 further frequency-divides a frequency-divided signal output from the phase control device 121 and outputs resulting frequency-divided signal to the phase comparator 141a. The frequency divider 811b in the PLL 132 further frequency-divides a frequency-divided signal output from the phase control device 122 and outputs resulting frequency-divided signal to the phase comparator 141b.

As described above, the electronic circuit 100 may also have a configuration in which the frequency divider in the loop of each of the PLLs 131 and 132 is divided into two frequency dividers and the corresponding phase control device 121 or 122 is provided between the two frequency dividers. With this arrangement, even when the frequency characteristics of the inputs to the VCOs 143a and 143b vary, it is possible to match the phases of the clock signals output from the output portions 151 and 152, as in the configuration illustrated in FIGS. 7A and 7B. That is, it is possible to suppress a phase mismatch due to variations in the characteristics of the VCOs 143*a* and 143*b*.

Example Configuration 9 of Electronic Circuit According to First Embodiment

Figure 9A:
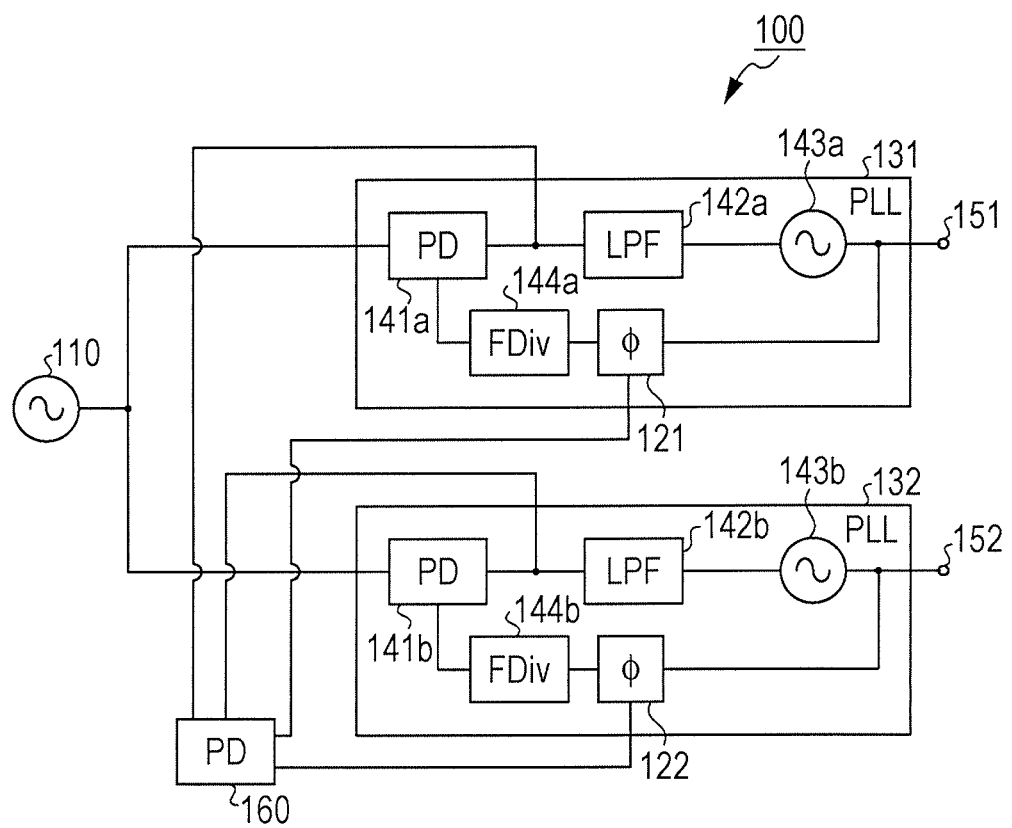
FIG. 9A is a diagram illustrating example configuration 9 of the electronic circuit according to the first embodiment.
Figure 9B:
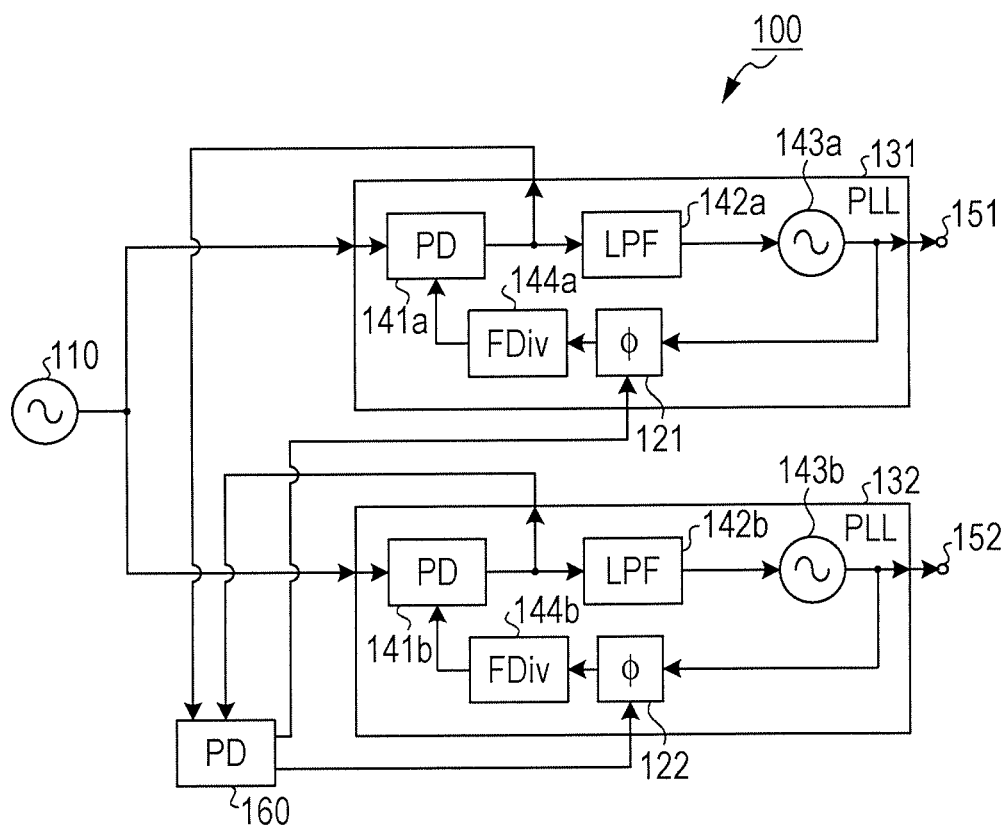
FIG. 9B is a diagram illustrating an example of flows of signals in the electronic circuit illustrated in FIG. 9A.

FIG. 9A is a diagram illustrating example configuration 9 of the electronic circuit according to the first embodiment. FIG. 9B is a diagram illustrating an example of flows of signals in the electronic circuit illustrated in FIG. 9A. In FIGS. 9A and 9B, elements that are the same as or similar to those illustrated in FIGS. 7A and 7B are denoted by the same reference numerals, and descriptions thereof are not given hereinafter.

The PLL 131 illustrated in FIGS. 9A and 9B has a configuration in which the position of the phase control device 121 and the position of the frequency divider 144*a* in the configuration illustrated in FIGS. 7A and 7B are interchanged. Also, in the PLL 132 has a configuration in which the position of the phase control device 122 and the position of the frequency divider 144*b* in the configuration illustrated in FIGS. 7A and 7B are interchanged.

In such a manner, the electronic circuit 100 may have a configuration in which the phase control device 121 is provided between the VCO 143*a* and the frequency divider 144*a* and the phase control device 122 is provided between the VCO 143*b* and the frequency divider 144*b*. With this arrangement, even when the frequency characteristics of the inputs to the VCOs 143*a* and 143*b* vary, it is possible to match the phases of the clock signals output from the output portions 151 and 152, as in the configuration illustrated in FIGS. 7A and 7B. That is, it is possible to suppress a phase mismatch due to variations in the characteristics of the VCOs 143*a* and 143*b*.

Figure 10A:
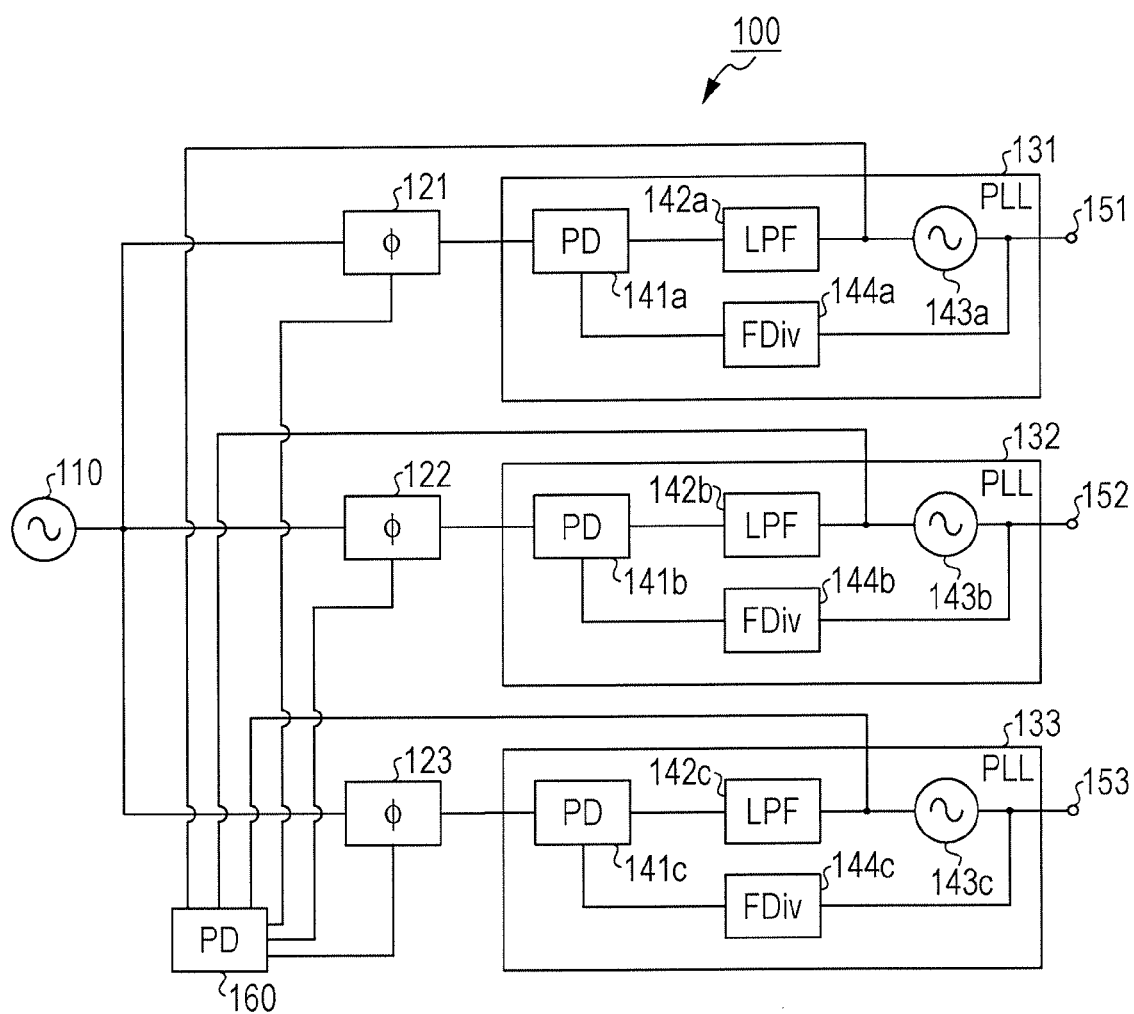
FIG. 10A is a diagram illustrating example configuration 10 of the electronic circuit according to the first embodiment.
Figure 10B:
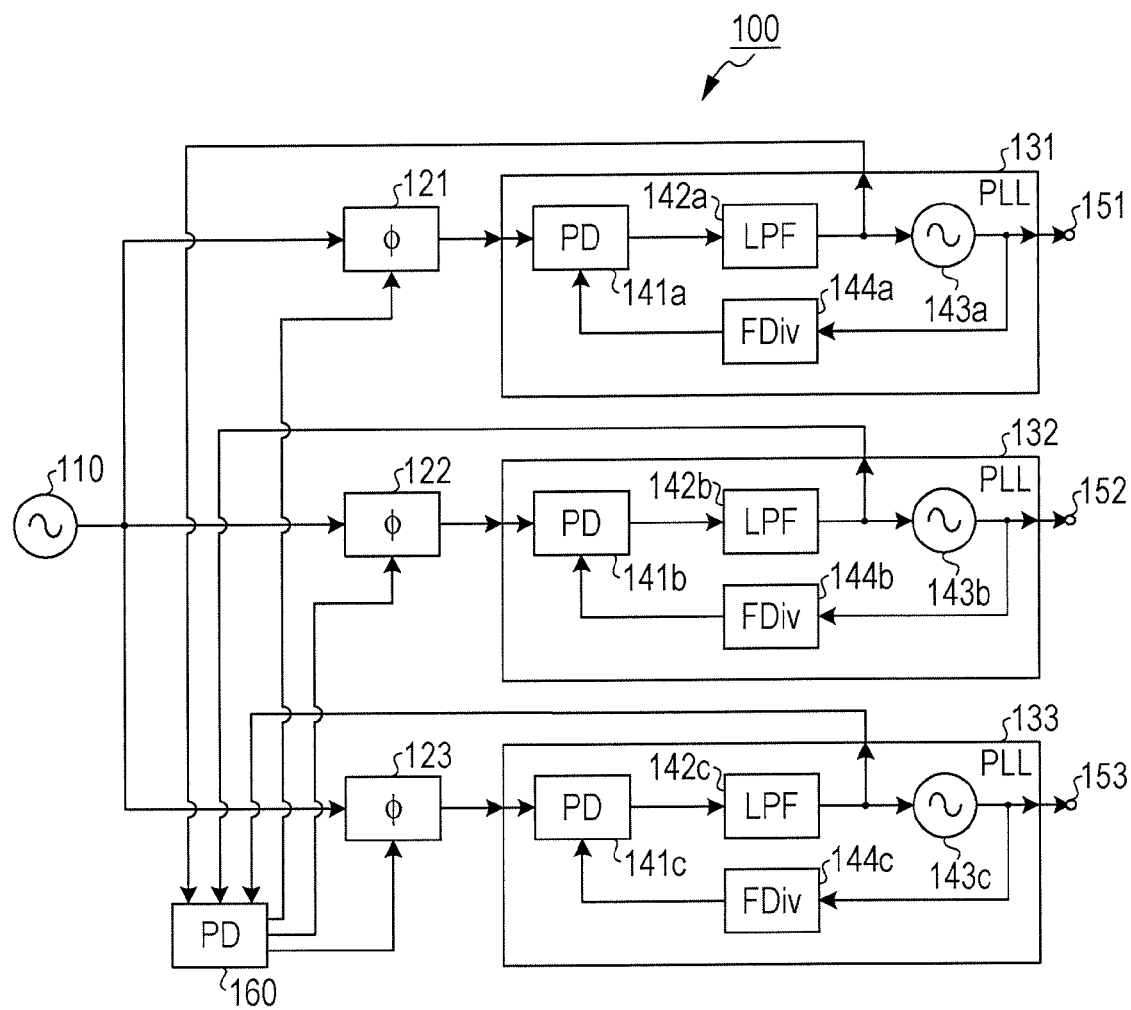
FIG. 10B is a diagram illustrating an example of flows of signals in the electronic circuit illustrated in FIG. 10A.

Example Configuration 10 of Electronic Circuit According to First Embodiment FIG. 10A is a diagram illustrating example configuration 10 of the electronic circuit according to the first embodiment. FIG. 10B is a diagram illustrating an example of flows of signals in the electronic circuit illustrated in FIG. 10A. In FIGS. 10A and 10B, elements that are the same as or similar to those illustrated in FIGS. 1A and 1B are denoted by the same reference numerals, and descriptions thereof are not given hereinafter.

In the example illustrated in FIGS. 10A and 10B, the LPF 142*a* to 143*c* extract only low-frequency components of the phase difference signals output from the phase comparators 141*a* to 141*c*, respectively, and output the corresponding low-frequency components to the VCOs 143*a* to 143*c* and the phase comparator 160. In this case, the phase comparators 141*a* to 141*c* may or may not output the phase difference signals to the phase comparator 160.

As described above, the PLLs 131 to 133 may have a configuration in which the phase difference signals that have passed through the LPFs 142*a* to 142*c* are output to the phase comparator 160. In this case, since the VCOs 143*a* to 143*c* are connected subsequent to the LPFs 142*a* to 142*c*, circuits connected at subsequent stages of the LPFs 142*a* to 142*c* to extract phase difference signals may have an impedance that is sufficiently higher than the output impedances of the LPFs 142*a* to 142*c*. Thus, it is possible to suppress an influence on the inputs to the VCOs 143*a* to 143*c*.

Also, the impedance of the circuits that are connected at the subsequent stage of the LPFs 142*a* to 142*c* to extract the phase difference signals may be set higher than the input impedances of the VCOs 143*a* to 143*c*. This arrangement makes it possible to suppress an influence on the inputs to the VCOs 143*a* to 143*c*.

In each configuration illustrated in FIGS. 2A to 9B, the electronic circuit may also have a configuration in which the PLLs 131 and 132 output, to the phase comparator 160, the phase difference signals that have passed through the LPFs 142*a* and 142*b*, as in the example illustrated in FIGS. 10A and 10B.

Second Embodiment

Figure 11A:
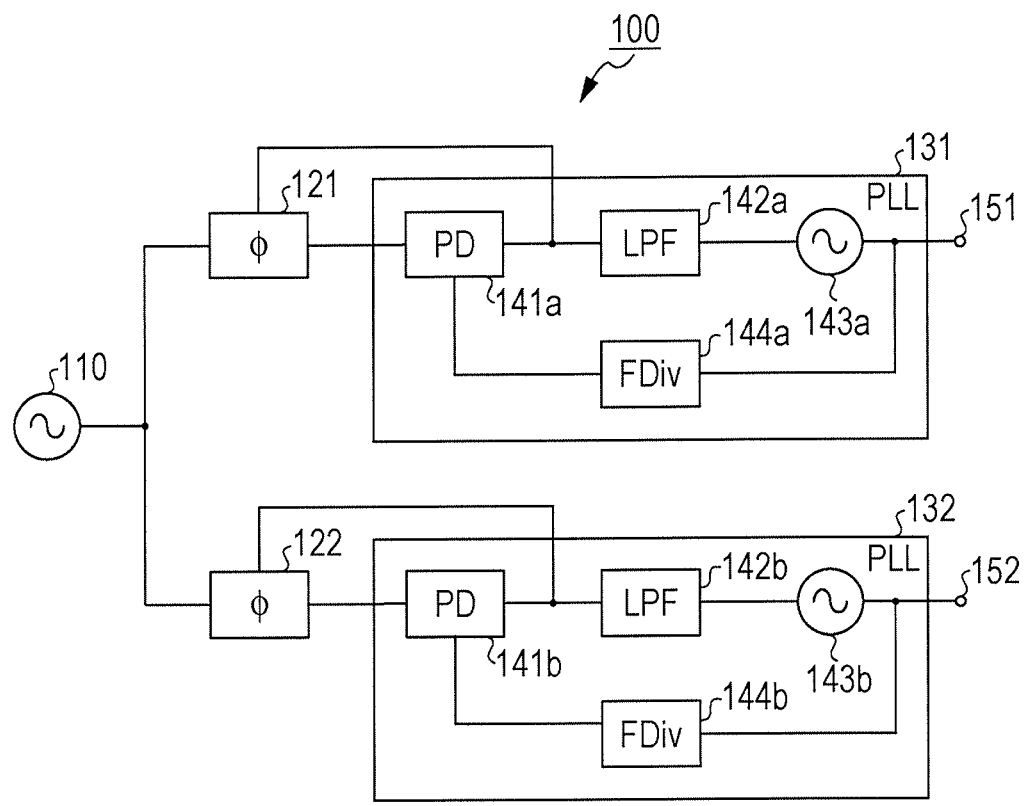
FIG. 11A is a diagram illustrating example configuration 1 of an electronic circuit according to a second embodiment.
Figure 11B:
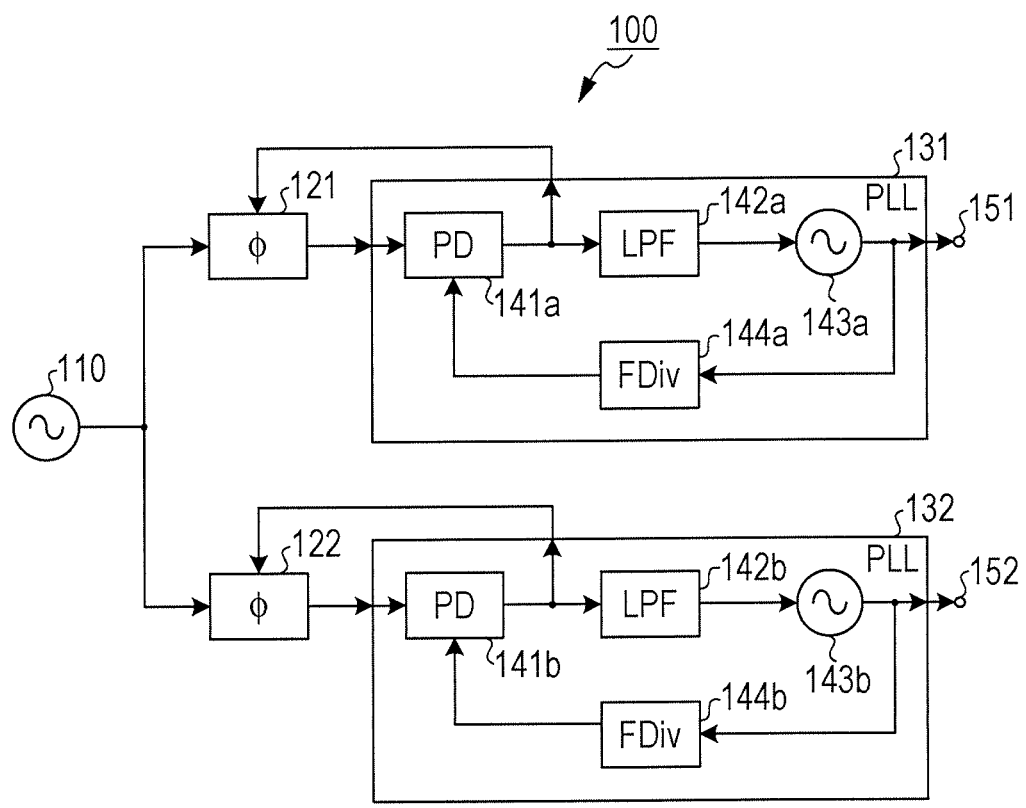
FIG. 11B is a diagram illustrating an example of flows of signals in the electronic circuit illustrated in FIG. 11A.

Example Configuration 1 of Electronic Circuit According to Second Embodiment FIG. 11A is a diagram illustrating example configuration 1 of an electronic circuit according to a second embodiment. FIG. 11B is a diagram illustrating an example of flows of signals in the electronic circuit illustrated in FIG. 11A. In FIGS. 11A and 11B, elements that are the same as or similar to those illustrated in FIGS. 1A and 1B are denoted by the same reference numerals, and descriptions thereof are not given hereinafter.

As illustrated in FIGS. 11A and 11B, an electronic circuit 100 according to the second embodiment includes a reference signal oscillator 110, phase control devices 121 and 122, PLLs 131 and 132, and output portions 151 and 152. In such a manner, in the second embodiment, the electronic circuit 100 may have a configuration in which the phase comparator 160 is omitted.

By using the amount of phase corresponding to the phase difference signal output from the PLL 131, the phase control device 122 varies the phase of the reference signal output from the reference signal oscillator 110. By using the amount of phase corresponding to the phase difference signal output from the PLL 132, the phase control device 122 varies the phase of the reference signal output from the reference signal oscillator 110. The phase control devices 121 and 122 serve as a controller that controls relative phases of the reference signals, input to the PLLs 131 and 132 from the reference signal oscillator 110, based on the phase difference signals of the PLLs 131 and 132.

More specifically, the phase control device 121 derives an amount of phase for setting the phase of an output signal of the PLL 131 to a predetermined phase, based on the phase difference signal output from the PLL 131, and gives the derived amount of phase to the reference signal. The phase control device 122 derives an amount of phase for setting the phase of an output signal output of the PLL 132 to a predetermined phase, based on the phase difference signal output from the PLL 132, and gives the derived amount of phase to the reference signal.

For example, the electronic circuit 100 has a memory in which association information indicating the amount of phase for setting the phases of the signals output from the PLLs 131 and 132 to a predetermined phase is stored for each of the values of the phase difference signals in the PLLs 131 and 132. The association information may also be created, for example, through prior experiment. Based on the phase difference signals output from the PLLs 131 and 132 and the association information stored in the memory, the phase control devices 121 and 122 derive the amounts of phase for setting the phases of the signals output from the PLLs 131 and 132 to a predetermined phase. However, the method for the phase control devices 121 and 122 to derive the amounts of phase is not limited to a case in which the association information is used, and may be any type of method, such as an arithmetic operation using a predetermined equation.

As described above, in the electronic circuit 100, the phases of the reference signals input to the corresponding PLLs 131 and 132 are controlled based on the phase difference signals obtained from the corresponding PLLs 131 and 132.

With this arrangement, even when the frequency characteristics of the inputs to the VCOs 143a and 143b vary, it is possible to match the phases of the clock signals output from the output portions 151 and 152. That is, it is possible to suppress a phase mismatch due to variations in the characteristics of the VCOs 143a and 143b. Also, since this arrangement allows the phase comparator 160 to be omitted, thus making it possible to simplify the circuit.

Example Configuration 2 of Electronic Circuit According to Second Embodiment

Figure 12A:
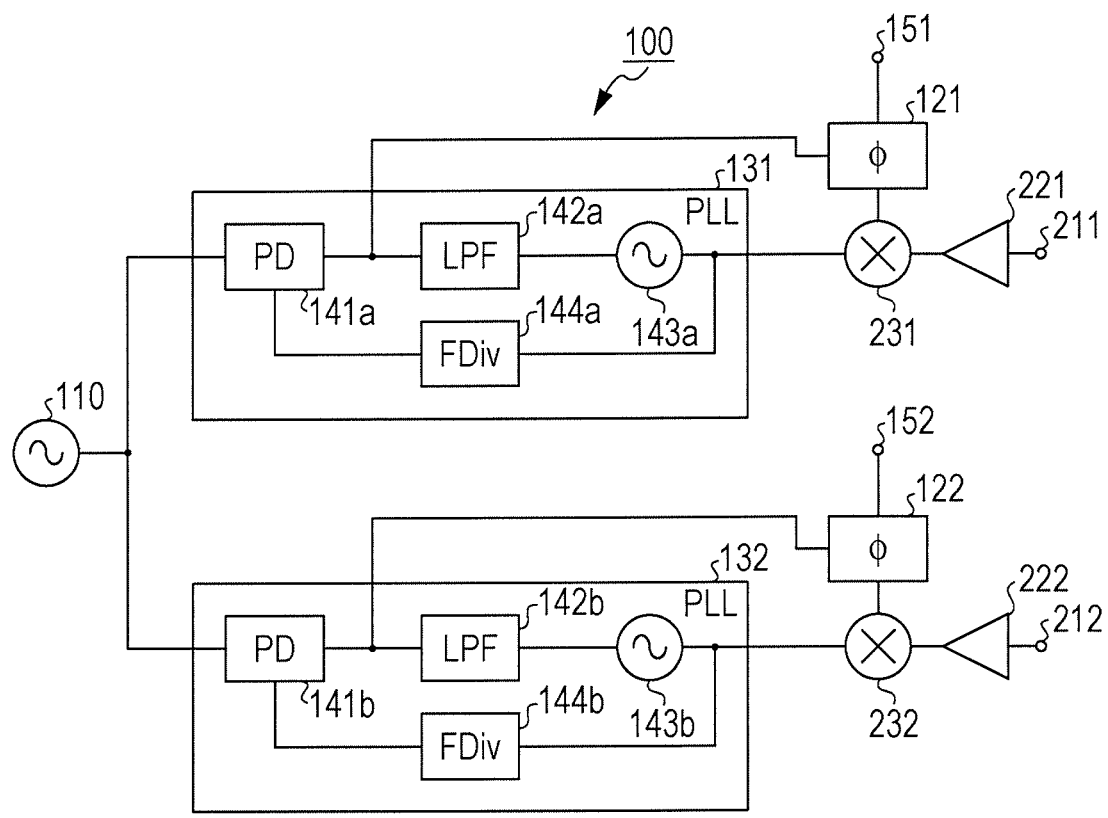
FIG. 12A is a diagram illustrating example configuration 2 of the electronic circuit according to the second embodiment.
Figure 12B:
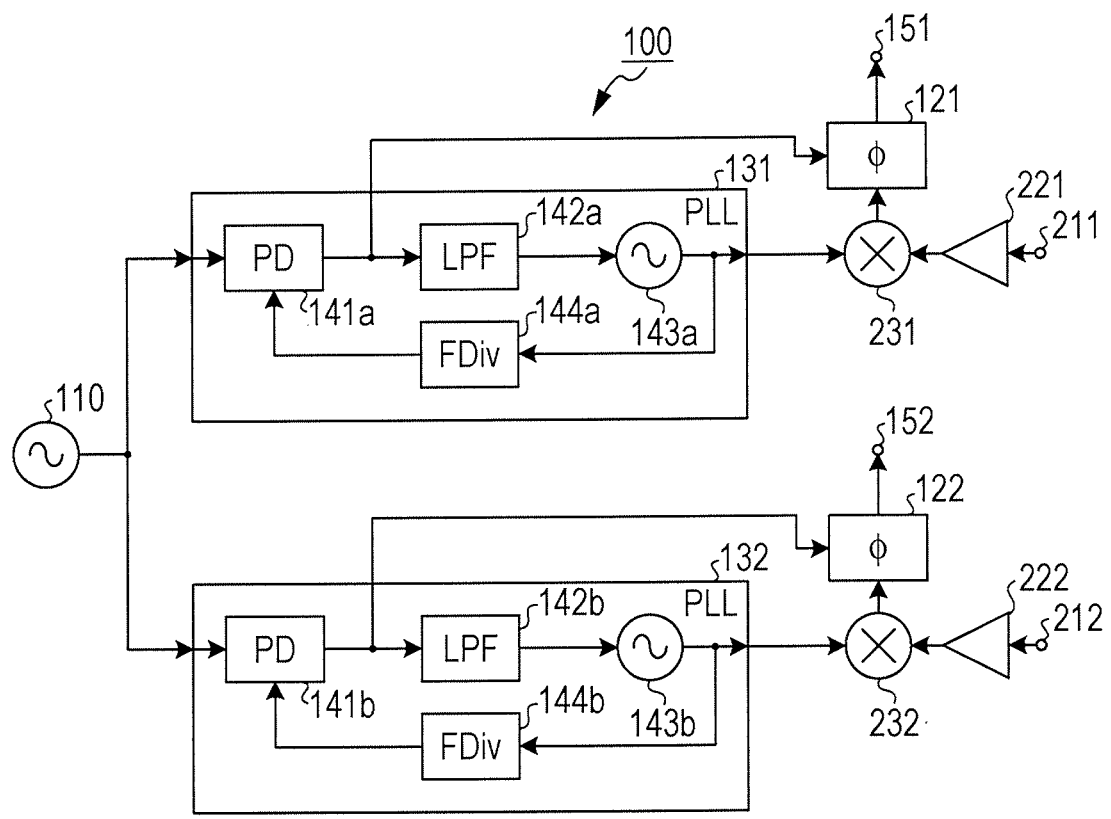
FIG. 12B is a diagram illustrating an example of flows of signals in the electronic circuit illustrated in FIG. 12A.

FIG. 12A is a diagram illustrating example configuration 2 of the electronic circuit according to the second embodiment. FIG. 12B is a diagram illustrating an example of flows of signals in the electronic circuit illustrated in FIG. 12A. In FIGS. 12A and 12B, elements that are the same as or similar to those illustrated in FIGS. 11A and 11B are denoted by the same reference numerals, and descriptions thereof are not given hereinafter. An electronic circuit 100 illustrated in FIGS. 12A and 12B is, for example, a device that is applicable to a signal reception apparatus. For example, in the electronic circuit 100, the output signals of the PLLs 131 and 132 are used as local signals to convert the frequencies of reception signals.

The electronic circuit 100 illustrated in FIGS. 12A and 12B includes a reference signal oscillator 110, phase control devices 121 and 122, PLLs 131 and 132, output portions 151 and 152, input portions 211 and 212, amplifiers 221 and 222, and mixers 231 and 232. In the example illustrated in FIGS. 12A and 12B, a reference signal output from the reference signal oscillator 110 is input to the phase comparators 141a and 141b in the PLLs 131 and 132 without the involvement of the phase control devices 121 and 122.

For example, reception signals received via antennas of a reception apparatus are input to the input portions 211 and 212. The input portions 211 and 212 output the input reception signals to the amplifiers 221 and 222, respectively. The amplifiers 221 and 222 receive the reception signals output from the input portions 211 and 212, respectively. The amplifiers 221 and 222 then output amplified reception signals to the mixers 231 and 232, respectively.

The mixer 231 multiplies the reception signal output from the amplifier 221 by a clock signal output from the PLL 131 and outputs the resulting signal to the phase control device 121. The mixer 232 multiplies the reception signal output from the amplifier 222 by a clock signal output from the PLL 132 and outputs the resulting signal to the phase control device 122.

Thus, it is possible to frequency-convert the reception signals. For example, each of the mixers 231 and 232 converts an RF-band reception signal into an IF-band signal or a baseband signal. The mixers 231 and 232 may be implemented by, for example, multiplication circuits.

The phase control devices 121 and 122 vary the phases of the reception signals output from the mixers 231 and 232, based on the phase difference signals output from the PLLs 131 and 132, respectively. The phase control devices 121 and 122 then output the phase-varied reception signals to the output portions 151 and 152, respectively. The output portions 151 and 152 output the reception signals output from the phase control devices 121 and 122, respectively. With this arrangement, the reception signals input from the input portions 211 and 212 can be frequency-converted and output from the output portions 151 and 152, and also the phases of the reception signals to be output can be made to match each other.

Although the electronic circuit 100 including two PLLs (the PLLs 131 and 132) has been described above with reference to FIGS. 12A and 12B, the electronic circuit 100 may also be a device including three or more PLLs.

As described above, in the electronic circuit 100, the phases of the output signals from the mixers 231 and 232 corresponding to the PLLs 131 and 132 are controlled based on the phase difference signals obtained from the corresponding PLLs 131 and 132.

With this arrangement, even when the frequency characteristics of the inputs to the VCOs 143a and 143b vary, it is possible to match the phases of the reception signals output from the output portions 151 and 152. That is, it is possible to suppress a phase mismatch due to variations in the characteristics of the VCOs 143a and 143b. Also, since this arrangement allows the phase comparator 160 to be omitted, thus making it possible to simplify the circuit.

Although a case in which reception signals are input to the input portions 211 and 212 has been described in the example illustrated in FIGS. 12A and 12B, the signals input to the input portions 211 and 212 are not limited to reception signals and may be any type of signal.

Example Configuration 3 of Electronic Circuit According to Second Embodiment

Figure 13A:
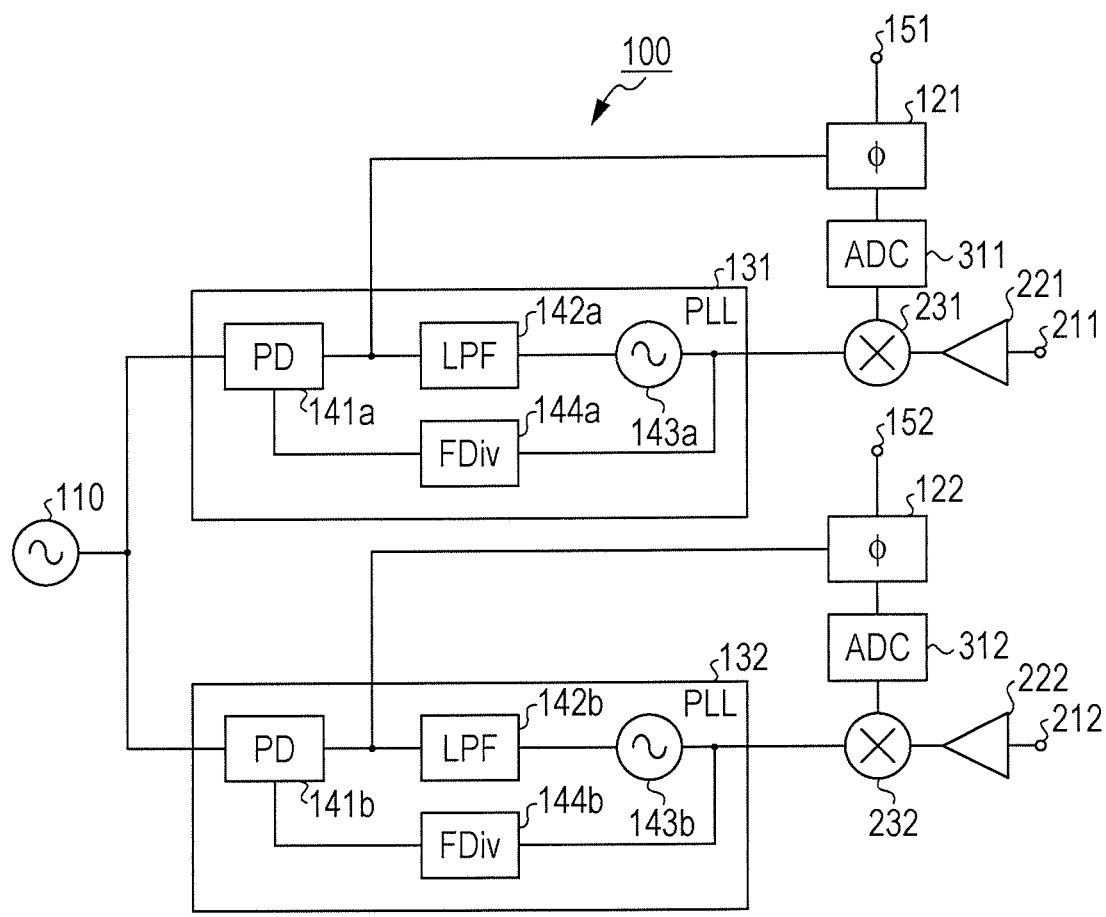
FIG. 13A is a diagram illustrating example configuration 3 of the electronic circuit according to the second embodiment.
Figure 13B:
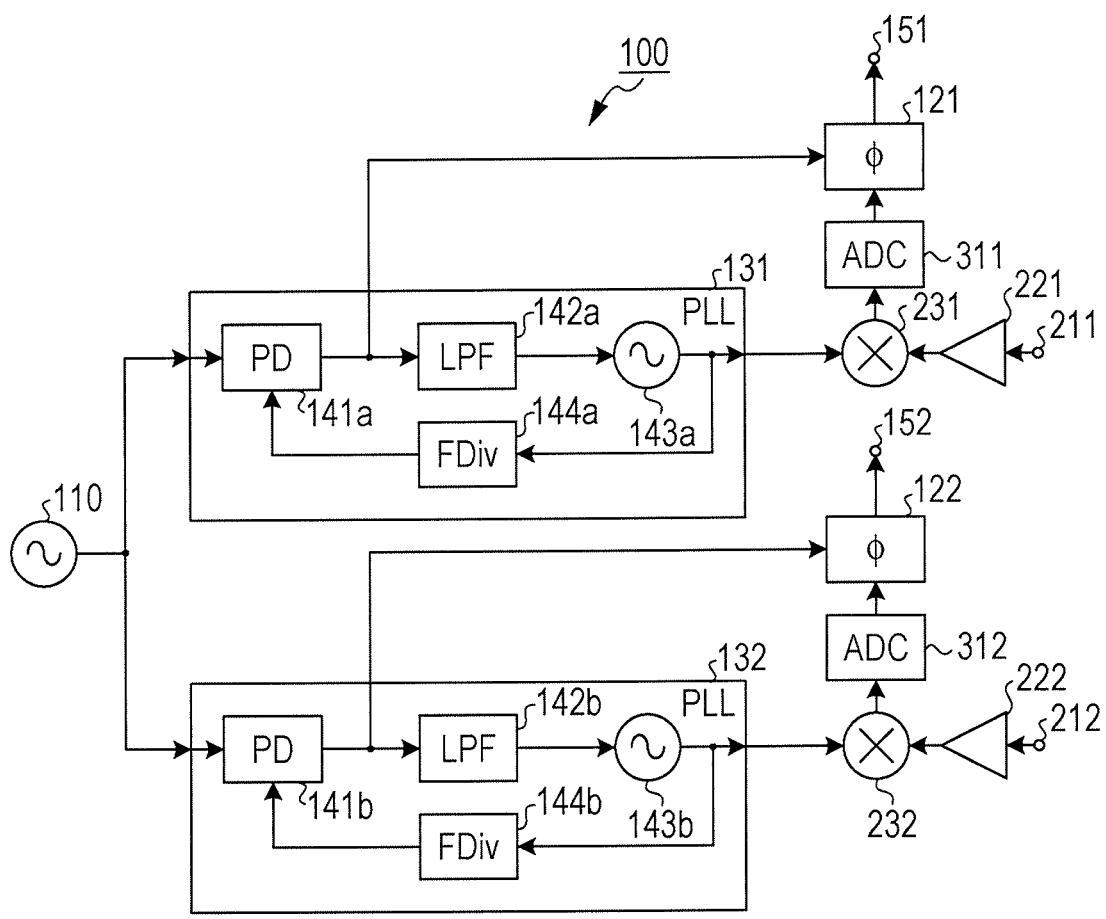
FIG. 13B is a diagram illustrating an example of flows of signals in the electronic circuit illustrated in FIG. 13A.

FIG. 13A is a diagram illustrating example configuration 3 of the electronic circuit according to the second embodiment. FIG. 13B is a diagram illustrating an example of flows of signals in the electronic circuit illustrated in FIG. 13A. In FIGS. 13A and 13B, elements that are the same as or similar to those illustrated in FIGS. 12A and 12B are denoted by the same reference numerals, and descriptions thereof are not given hereinafter. An electronic circuit 100 illustrated in FIGS. 13A and 13B includes ADCs 311 and 312, in addition to the configuration illustrated in FIGS. 12A and 12B.

The ADCs 311 and 312 convert the reception signals, respectively output from the mixers 231 and 232, from analog signals to digital signals. The ADCs 311 and 312 then output the reception signals, converted into the digital signals, to the phase control devices 121 and 122, respectively.

The phase control devices 121 and 122 digitally vary the phases of the reception signals output from the ADCs 311 and 312, respectively. In such a manner, the phase control devices 121 and 122 may be implemented by digital processing units to vary the phases of the reception signals. In this case, even when the frequency characteristics of the inputs to the VCOs 143a and 143b vary, it is also possible to match the phases of the reception signals output from the output portions 151 and 152, as in the configuration illustrated in FIGS. 12A and 12B. That is, it is possible to suppress a phase mismatch due to variations in the characteristics of the VCOs 143a and 143b. Also, since this arrangement allows the phase comparator 160 to be omitted, thus making it possible to simplify the circuit.

Example Configuration 4 of Electronic Circuit. According to Second Embodiment

Figure 14A:
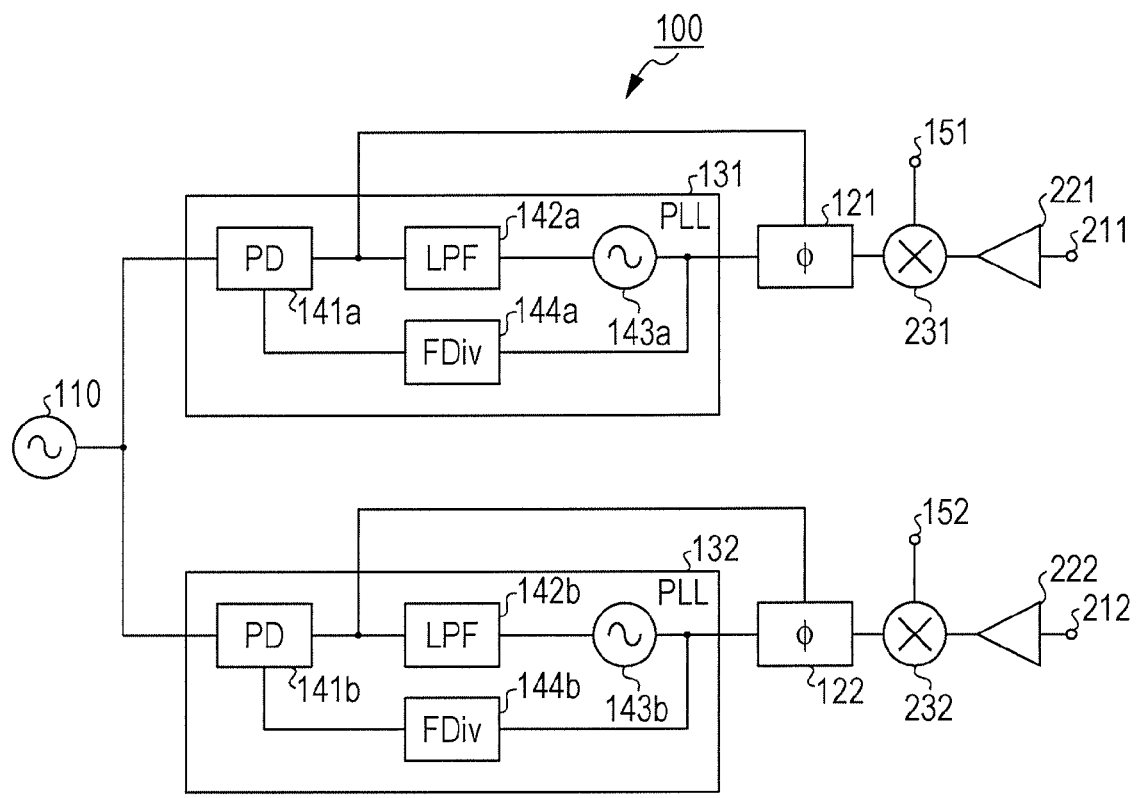
FIG. 14A is a diagram illustrating example configuration 4 of the electronic circuit according to the second embodiment.

FIG. 14A is a diagram illustrating example configuration 4 of the electronic circuit according to the second embodiment.

Figure 14B:
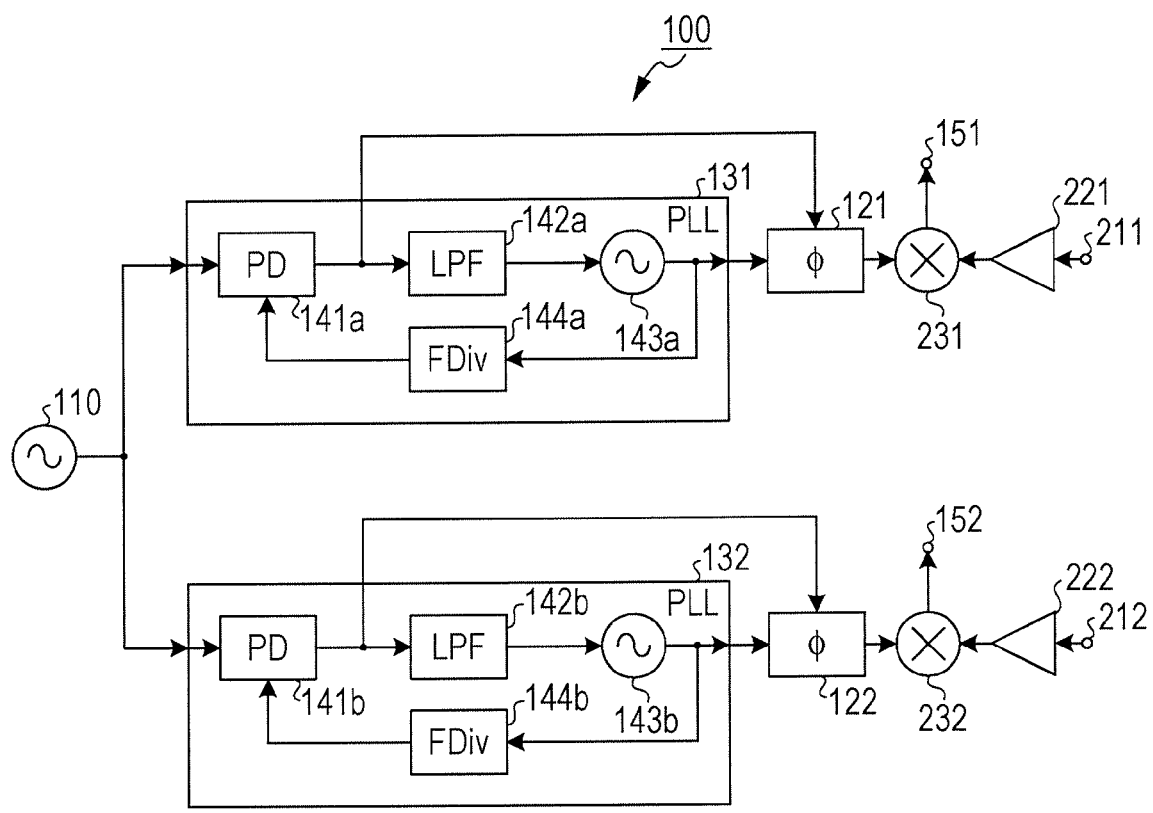
FIG. 14B is a diagram illustrating an example of flows of signals in the electronic circuit illustrated in FIG. 14A.

FIG. 14B is a diagram illustrating an example of flows of signals in the electronic circuit illustrated in FIG. 14A. In FIGS. 14A and 14B, elements that are the same as or similar to those illustrated in FIGS. 12A and 12B are denoted by the same reference numerals, and descriptions thereof are not given hereinafter.

In the example illustrated in FIGS. 14A and 14B, the phase control devices 121 and 122 vary the phases of clock signals output from the PLLs 131 and 132, respectively. The phase control devices 121 and 122 then output the phase-varied signals to the mixers 231 and 232, respectively.

The mixer 231 multiplies a reception signal output from the amplifier 221 by a clock signal output from the phase control device 121 and outputs the resulting reception signal to the output portion 151. The mixer 232 multiplies a reception signal output from the amplifier 222 by a clock signal output from the phase control device 122 and outputs the resulting reception signal to the output portion 152. The output portions 151 and 152 output the reception signals output from the mixers 231 and 232, respectively.

As described above, the phase control devices 121 and 122 may vary the phases between the PLLs 131 and 132 and the corresponding mixers 231 and 232. In this case, even when the frequency characteristics of the inputs to the VCOs 143a and 143b vary, it is also possible to match the phases of the reception signals output from the output portions 151 and 152, as in the configuration illustrated in FIGS. 12A and. 12B. That is, it is possible to suppress a phase mismatch due to variations in the characteristics of the VCOs 143a and 143b. Also, since this arrangement allows the phase comparator 160 to be omitted, thus making it possible to simplify the circuit.

Example Configuration 5 of Electronic Circuit According to Second Embodiment

Figure 15A:
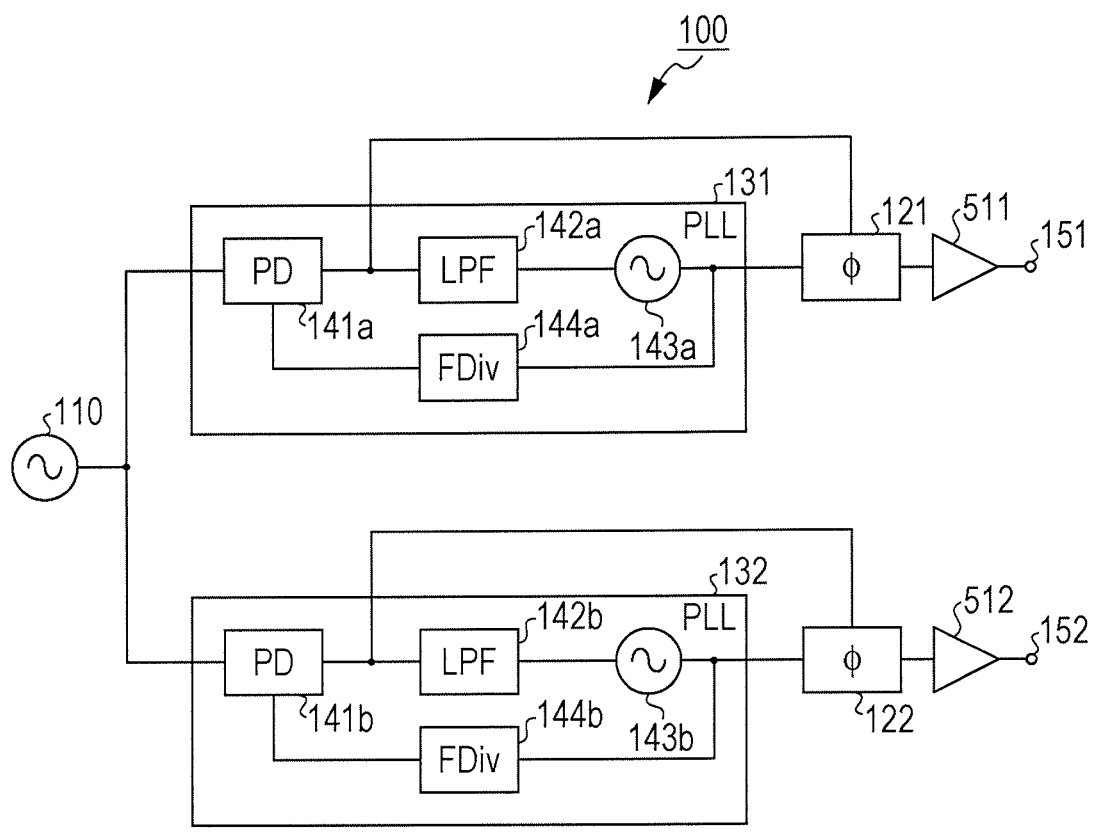
FIG. 15A is a diagram illustrating example configuration 5 of the electronic circuit according to the second embodiment.
Figure 15B:
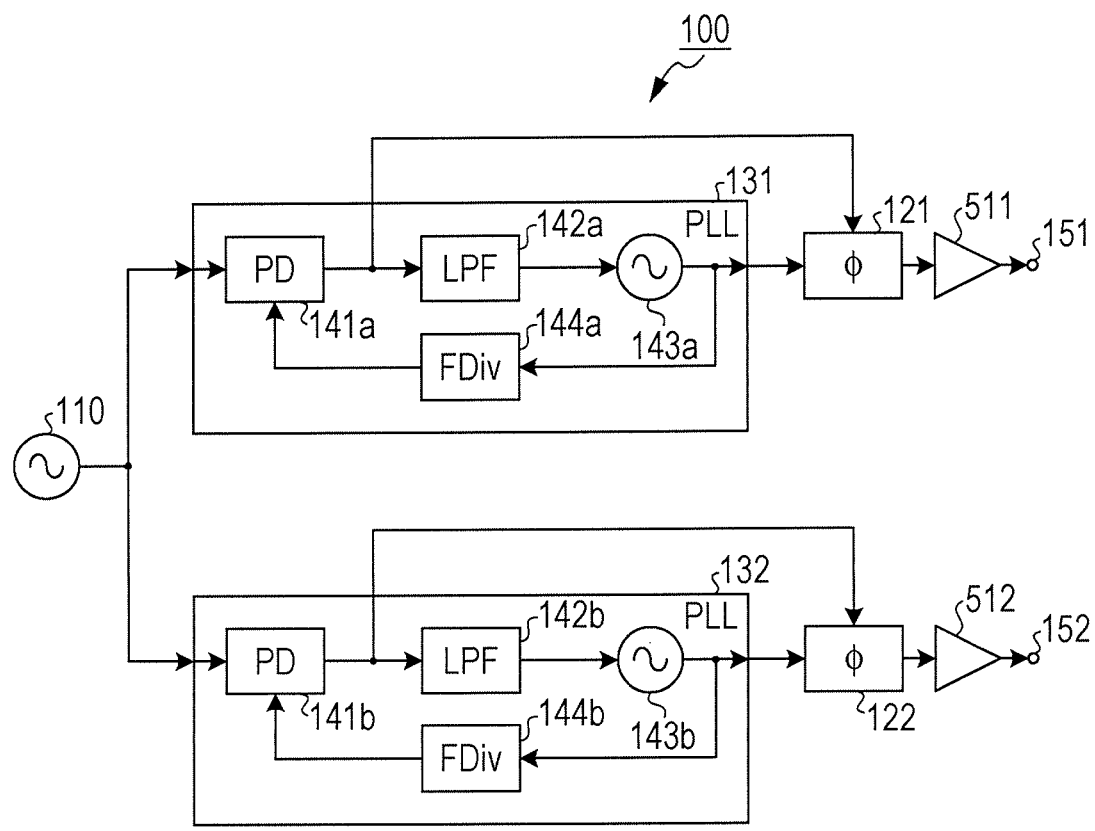
FIG. 15B is a diagram illustrating an example of flows of signals in the electronic circuit illustrated in FIG. 15A.

FIG. 15A is a diagram illustrating example configuration 5 of the electronic circuit according to the second embodiment. FIG. 15B is a diagram illustrating an example of flows of signals in the electronic circuit illustrated in FIG. 15A. In FIGS. 15A and 15B, elements that are the same as or similar to those illustrated in FIGS. 12A and 12B are denoted by the same reference numerals, and descriptions thereof are not given hereinafter. An electronic circuit 100 illustrated in FIGS. 15A and 15B is, for example, a device that is applicable to a signal transmission apparatus. For example, in the electronic circuit 100, the PLLs 131 and 132 generate clock signals for generating transmission signals.

The electronic circuit 100 illustrated in FIGS. 15A and 15B includes a reference signal oscillator 110, phase control devices 121 and 122, PLLs 131 and 132, output portions 151 and 152, and amplifiers 511 and 512. In the example illustrated in FIGS. 15A and 15B, the phase control devices 121 and 122 vary the phases of clock signals output from the PLLs 131 and 132, respectively. The phase control devices 121 and 122 then output the phase-varied clock signal to the amplifiers 511 and 512, respectively.

The amplifiers 511 and 512 amplify the clock signals output from the phase control devices 121 and 122, respectively. The amplifiers 511 and 512 then output the amplified clock signals to the output portions 151 and 152, respectively. The output portions 151 and 152 output the clock signals, respectively output from the amplifiers 511 and 512, to transmitting units, which transmit signals based on the clock signals. With this arrangement, the clock signals output from the output portions 151 and 152 are subjected to, for example, modulation, and the resulting transmission signals are transmitted from the antennas of the transmission apparatus. Thus, it is possible to match the phases of the transmission signals.

As described above, in the electronic circuit 100, the phases of the output signals from the PLLs 131 and 132 are controlled based on the phase difference signals. With this arrangement, even when the frequency characteristics of the inputs to the VCOs 143a and 143b vary, it is possible to match the phases of the transmission signals based on the signal outputs from the output portions 151 and 152. That is, it is possible to suppress a phase mismatch due to variations in the characteristics of the VCOs 143a and 143b. Also, since this arrangement allows the phase comparator 160 to be omitted, thus making it possible to simplify the circuit.

Example Configuration 6 of Electronic Circuit According to Second Embodiment

Figure 16A:
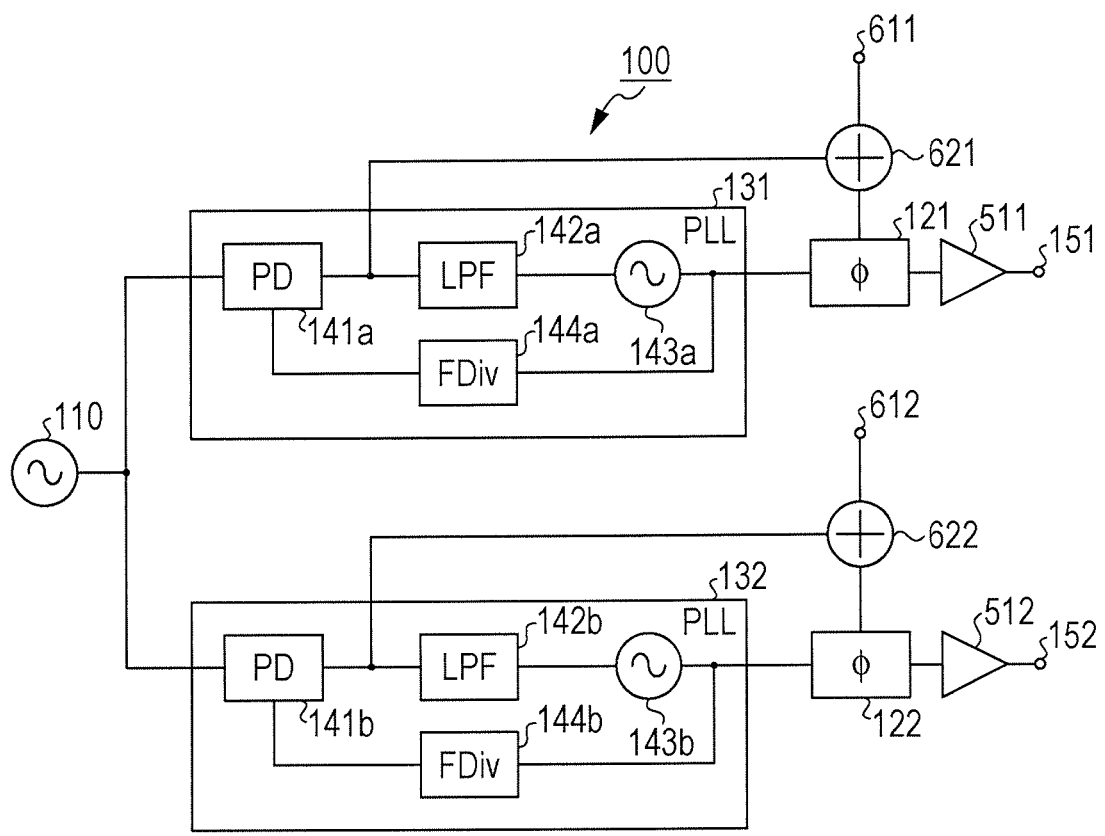
FIG. 16A is a diagram illustrating example configuration 6 of the electronic circuit according to the second embodiment.
Figure 16B:
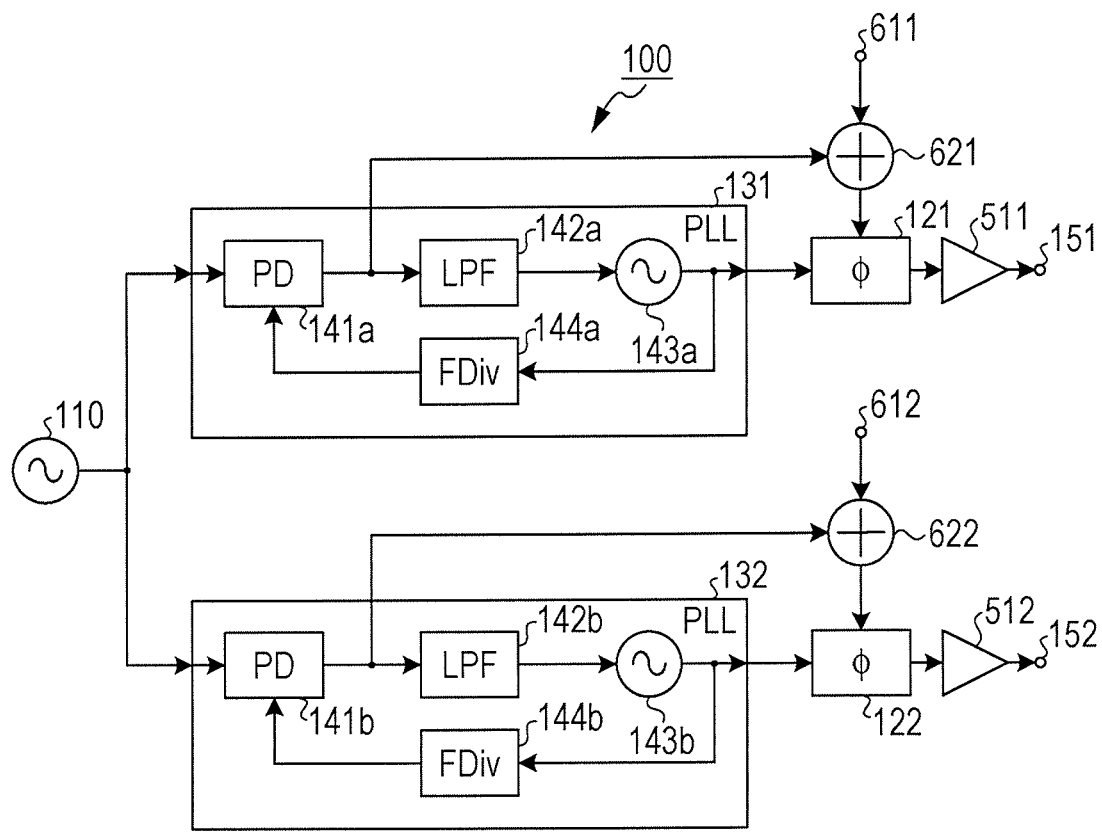
FIG. 16B is a diagram illustrating an example of flows of signals in the electronic circuit illustrated in FIG. 16A.

FIG. 16A is a diagram illustrating example configuration 6 of the electronic circuit according to the second embodiment. FIG. 16B is a diagram illustrating an example of flows of signals in the electronic circuit illustrated in FIG. 16A. In FIGS. 16A and 16B, elements that are the same as or similar to those illustrated in FIGS. 15A and 15B are denoted by the same reference numerals, and descriptions thereof are not given hereinafter.

An electronic circuit 100 illustrated in FIGS. 16A and 16B includes input portions 611 and 612 and addition units 621 and 622, in addition to the configuration illustrated in FIGS. 15A and 15B. For example, in order to perform beamforming or the like, the phase control devices 121 and 122 may also be used as phase shifters for a phased array to give a predetermined phase difference to clock signals output from the output portions 151 and 152. In this case, signals indicating an amount of phase corresponding to the predetermined phase difference are input to the input portions 611 and 612. The input portions 611 and 612 output the input signals to the addition units 621 and 622.

The addition unit 621 adds the phase difference signal output from the PLL 131 and the signal output from the input portion 611 and outputs the resulting signal to the phase control device 121. The addition unit 622 adds the phase difference signal output from the PLL 132 and the signal output from the input portion 612 and outputs the resulting signal to the phase control device 122. By using the amounts of phase corresponding to the signals respectively output from the input portions 611 and 612, the phase control devices 121 and 122 vary the phases of the signals output from the VCOs 143a and 143b, respectively.

Thus, in the electronic circuit 100, based on the phase difference signals of the PLLs 131 and 132 and the signal corresponding to the predetermined phase difference, the phase difference between the output signals of the PLLs 131 and 132 is controlled to have the predetermined phase difference. With this arrangement, even when the frequency characteristics of the inputs to the VCOs 143a and 143b vary, it is possible to make the phases of the clock signals output from the output portions 151 and 152 to have the predetermined phase difference. That is, it is possible to suppress a phase mismatch due to variations in the characteristics of the VCOs 143a and 143b. Also, since this arrangement allows the phase comparator 160 to be omitted, thus making it possible to simplify the circuit.

Example Configuration 7 of Electronic Circuit According to Second Embodiment

Figure 17A:
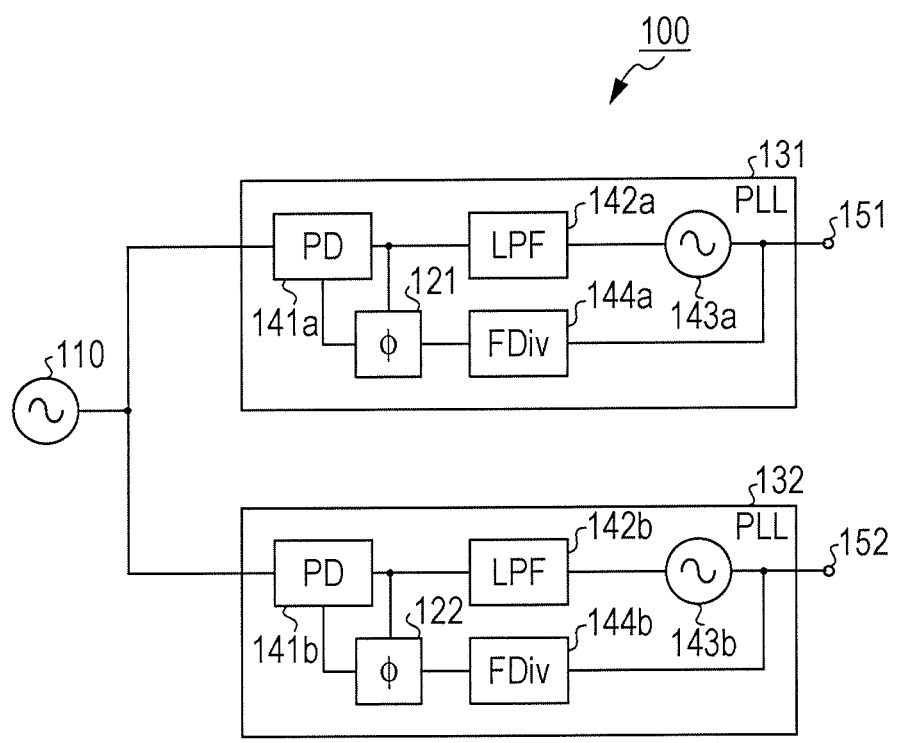
FIG. 17A is a diagram illustrating example configuration 7 of the electronic circuit according to the second embodiment.

FIG. 17A is a diagram illustrating example configuration 7 of the electronic circuit according to the second embodiment.

Figure 17B:
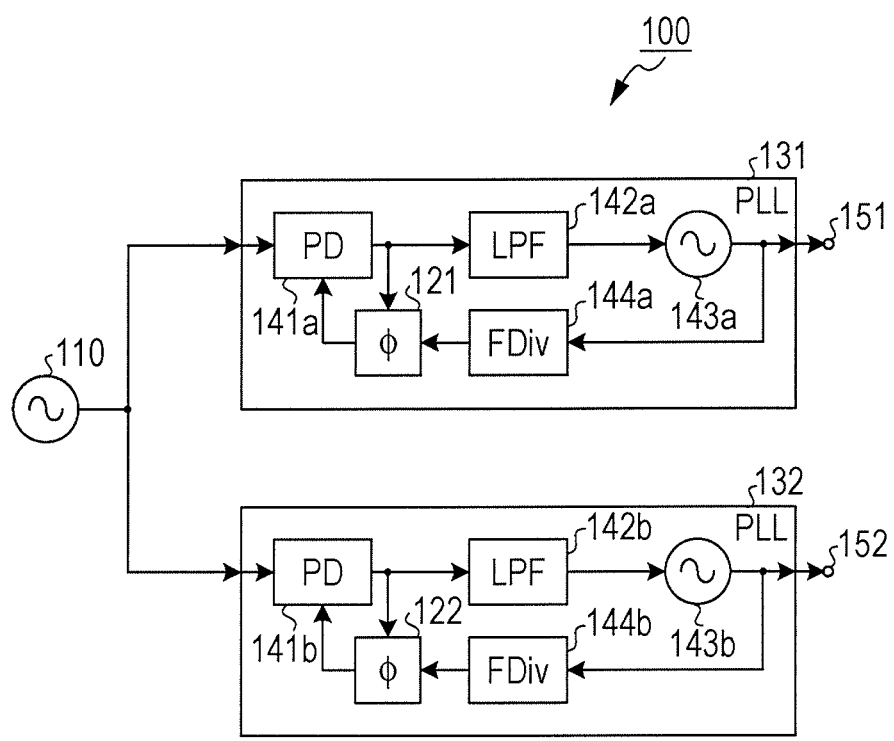
FIG. 17B is a diagram illustrating an example of flows of signals in the electronic circuit illustrated in FIG. 17A.

FIG. 17B is a diagram illustrating an example of flows of signals in the electronic circuit illustrated in FIG. 17A. In FIGS. 17A and 17B, elements that are the same as or similar to those illustrated in FIGS. 12A and 12B are denoted by the same reference numerals, and descriptions thereof are not given hereinafter.

In the example illustrated in FIGS. 17A and 17B, the phase control devices 121 and 122 are included in the PLLs 131 and 132, respectively. In the PLL 131, the phase control device 121 varies the phase of the frequency-divided signal output from the frequency divider 144a and outputs the resulting frequency-divided signal to the phase comparator 141a. In the PLL 132, the phase control device 122 varies the phase of the frequency-divided signal output from the frequency divider 144b and outputs the resulting frequency-divided signal to the phase comparator 141b.

Thus, in the electronic circuit 100, the phases of the output signals input to the phase comparators 141a and 141b in the PLLs 131 and 132 from the VCOs 143a and 143b are controlled based on the phase difference signals of the PLLs 131 and 132. With this arrangement, even when the frequency characteristics of the inputs to the VCOs 143a and 143b vary, it is possible to match the phases of the clock signals output from the output portions 151 and 152. That is, it is possible to suppress a phase mismatch due to variations in the characteristics of the VCOs 143a and 143b. Also, since this arrangement allows the phase comparator 160 to be omitted, thus making it possible to simplify the circuit.

Example Configuration 8 of Electronic Circuit According to Second Embodiment

Figure 18A:
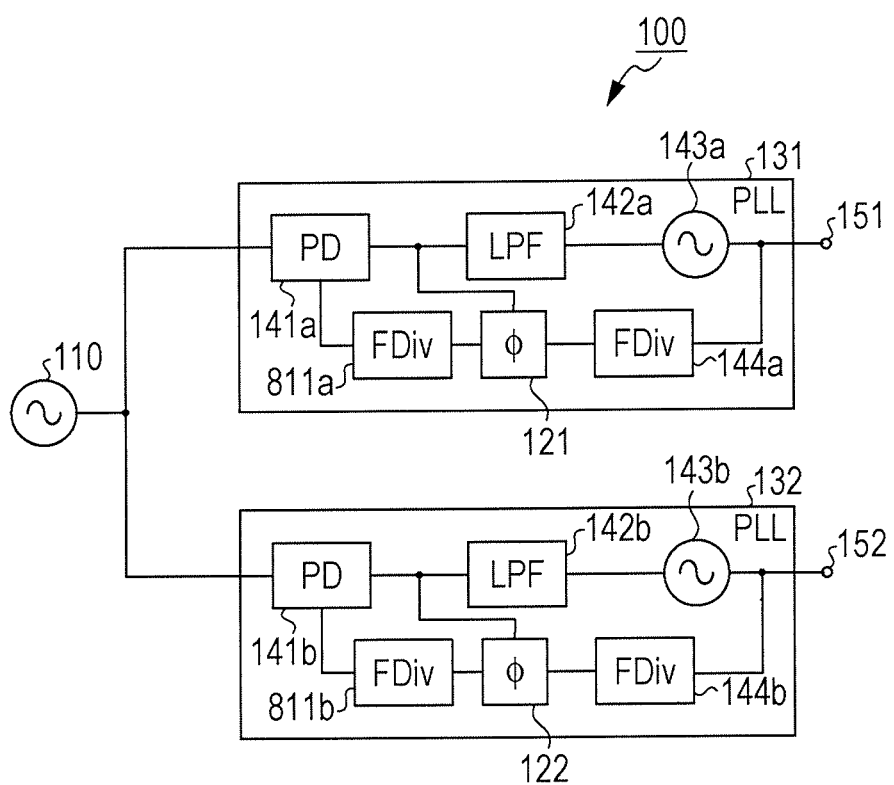
FIG. 18A is a diagram illustrating example configuration 8 of the electronic circuit according to the second embodiment.
Figure 18B:
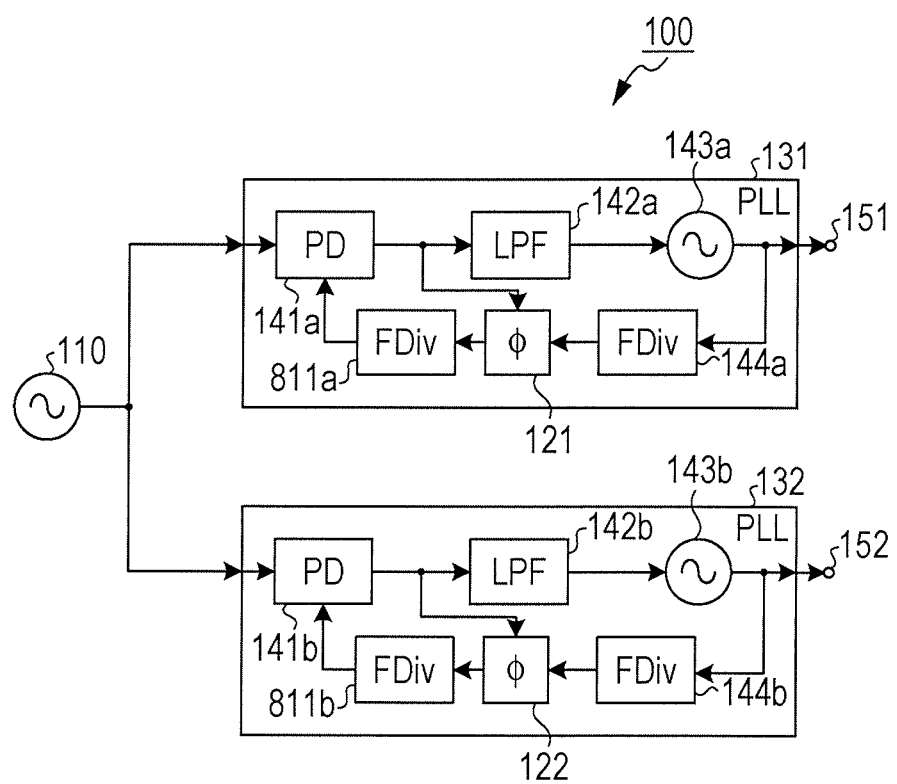
FIG. 18B is a diagram illustrating an example of flows of signals in the electronic circuit illustrated in FIG. 18A.

FIG. 18A is a diagram illustrating example configuration 8 of the electronic circuit according to the second embodiment. FIG. 18B is a diagram illustrating an example of flows of signals in the electronic circuit illustrated in FIG. 18A. In FIGS. 18A and 18B, elements that are the same as or similar to those illustrated in FIGS. 17A and 17B are denoted by the same reference numerals, and descriptions thereof are not given hereinafter.

The PLLs 131 and 132 illustrated in FIGS. 18A and 18B have respective frequency dividers 811a and 811b, in addition to the configuration illustrated in FIGS. 17A and 17B. The frequency divider 811a in the PLL 131 further frequency-divides a frequency-divided signal output from the phase control device 121 and outputs resulting frequency-divided signal to the phase comparator 141a. The frequency divider 811b in the PLL 132 further frequency-divides a frequency-divided signal output from the phase control device 122 and outputs resulting frequency-divided signal to the phase comparator 141b.

As described above, the electronic circuit 100 may also have a configuration in which the frequency divider in the loop of each of the PLLs 131 and 132 is divided into two frequency dividers and the corresponding phase control device 121 or 122 is provided between the two frequency dividers. With this arrangement, even when the frequency characteristics of the inputs to the VCOs 143a and 143b vary, it is possible to match the phases of the clock signals output from the output portions 151 and 152, as in the configuration illustrated in FIGS. 17A and 17B. That is, it is possible to suppress a phase mismatch due to variations in the characteristics of the VCOs 143a and 143b. Also, since this arrangement allows the phase comparator 160 to be omitted, thus making it possible to simplify the circuit.

Example Configuration 9 of Electronic Circuit According to Second Embodiment

Figure 19A:
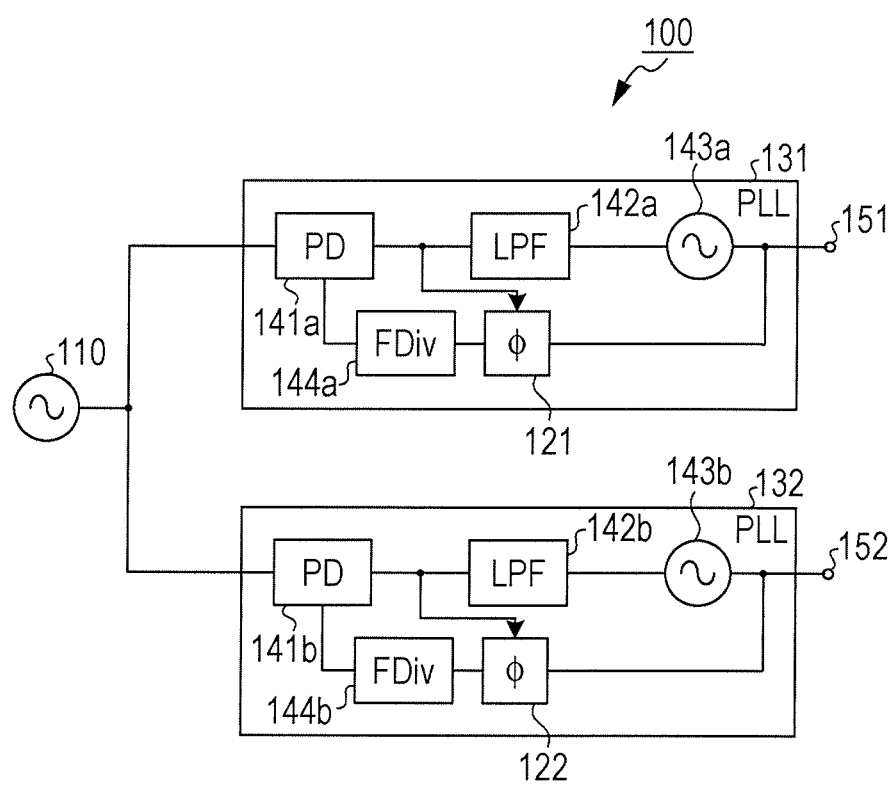
FIG. 19A is a diagram illustrating example configuration 9 of the electronic circuit according to the second embodiment.
Figure 19B:
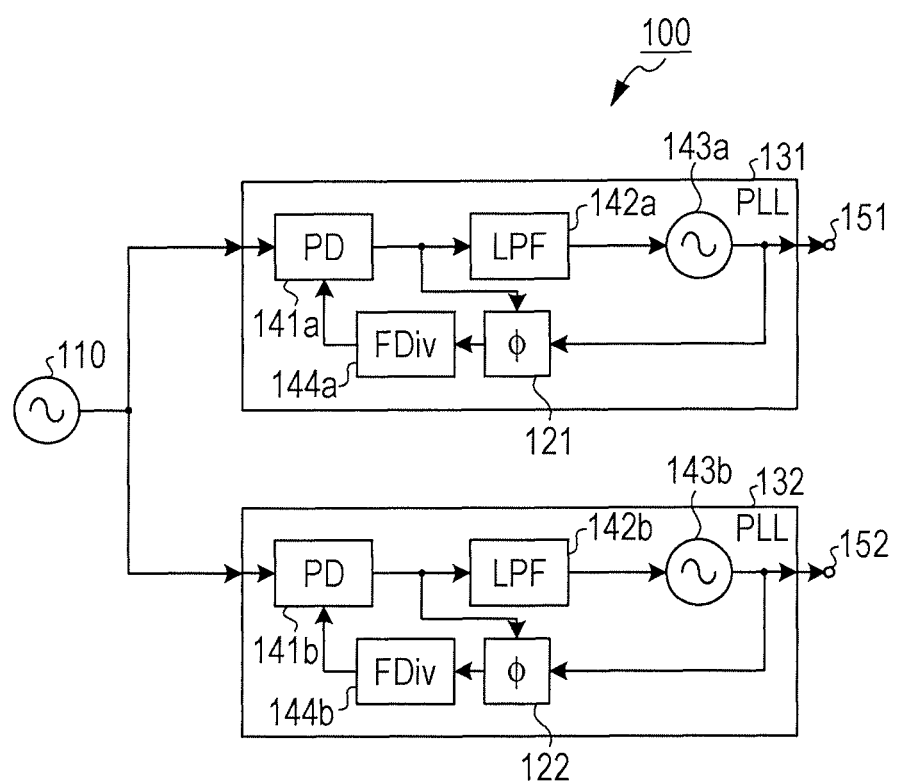
FIG. 19B is a diagram illustrating an example of flows of signals in the electronic circuit illustrated in FIG. 19A.

FIG. 19A is a diagram illustrating example configuration 9 of the electronic circuit according to the second embodiment. FIG. 19B is a diagram illustrating an example of flows of signals in the electronic circuit illustrated in FIG. 19A. In FIGS. 19A and 19B, elements that are the same as or similar to those illustrated in FIGS. 17A and 17B are denoted by the same reference numerals, and descriptions thereof are not given hereinafter.

The PLL 131 illustrated in FIGS. 19A and 19B has a configuration in which the position of the phase control device 121 and the position of the frequency divider 144a in the configuration illustrated in FIGS. 17A and 17B are interchanged. Also, the PLL 132 has a configuration in which the position of the phase control device 122 and the position of the frequency divider 144b in the configuration illustrated in FIGS. 17A and 17B are interchanged.

In such a manner, the electronic circuit 100 may have a configuration in which the phase control device 121 is provided between the VCO 143a and the frequency divider 144a and the phase control device 122 is provided between the VCO 143b and the frequency divider 144. With this arrangement, even when the frequency characteristics of the inputs to the VCOs 143a and 143b vary, it is possible to match the phases of the clock signals output from the output portions 151 and 152, as in the configuration illustrated in FIGS. 17A and 17B. That is, it is possible to suppress a phase mismatch due to variations in the characteristics of the VCOs 143a and 143b. Also, since this arrangement allows the phase comparator 160 to be omitted, thus making it possible to simplify the circuit. (Example Configuration 10 of Electronic Circuit According to Second Embodiment)

Figure 20A:
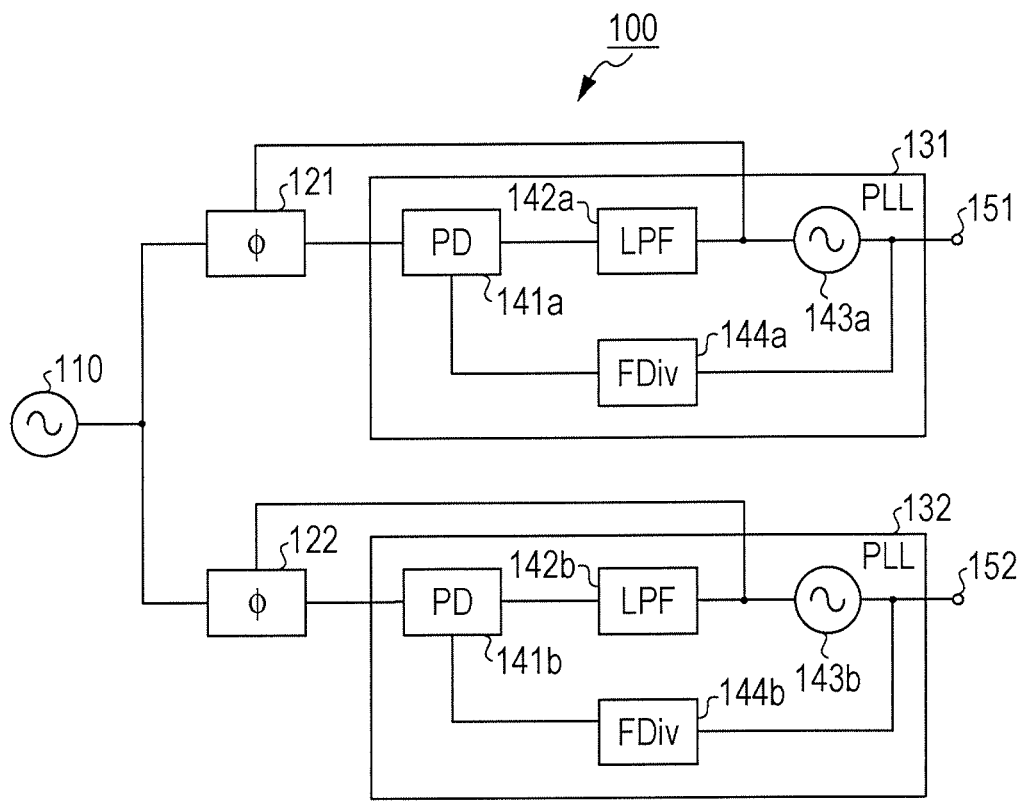
FIG. 20A is a diagram illustrating example configuration 10 of the electronic circuit according to the second embodiment.
Figure 20B:
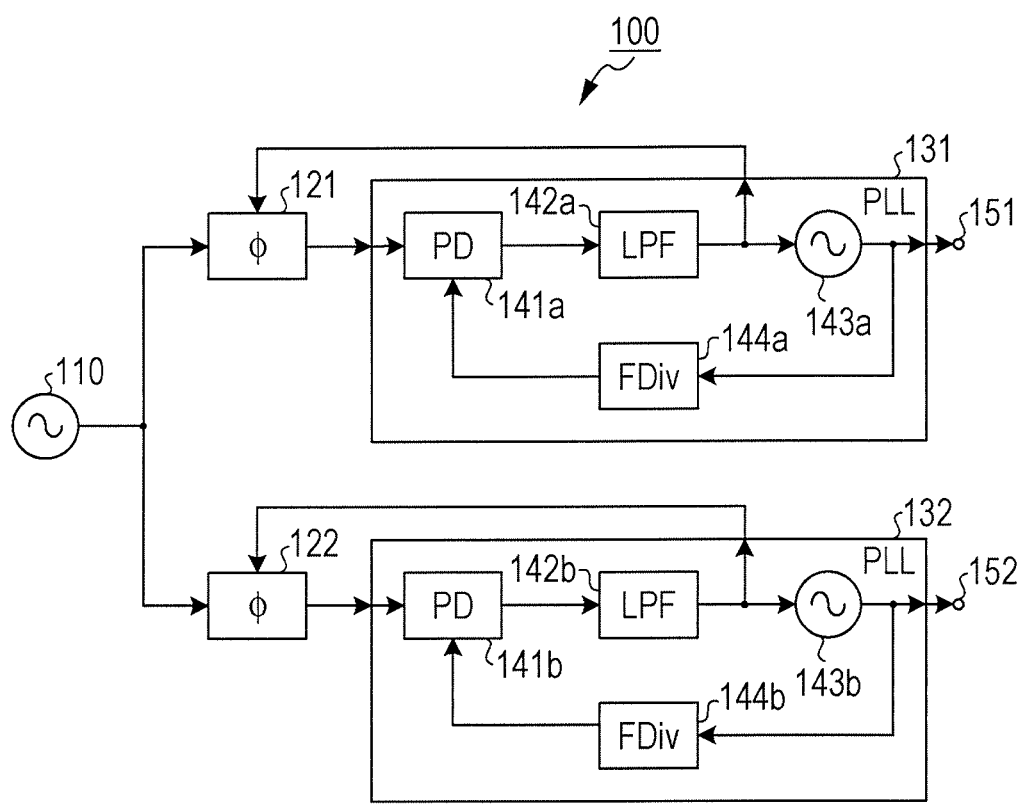
FIG. 20B is a diagram illustrating an example of flows of signals in the electronic circuit illustrated in FIG. 20A.

FIG. 20A is a diagram illustrating example configuration 10 of the electronic circuit according to the second embodiment. FIG. 20B is a diagram illustrating an example of flows of signals in the electronic circuit illustrated in FIG. 20A. In FIGS. 20A and 20B, elements that are the same as or similar to those illustrated in FIGS. 11A and 11B are denoted by the same reference numerals, and descriptions thereof are not given hereinafter.

In the example illustrated in FIGS. 20A and 20B, the LPF 142a in the PLL 131 extracts only a low-frequency component of the phase difference signal output from the phase comparator 141a and outputs the low-frequency component to the VCO 143a and the phase control device 121. In this case, the phase comparator 141a may or may not output the phase difference signal to the phase control device 121. The LPF 142b in the PLL 132 extracts only a low-frequency component of the phase difference signal output from the phase comparator 141b and outputs the low-frequency component to the VCO 143b and the phase control device 122. In this case, the phase comparator 141b may or may not output the phase difference signal to the phase control device 122.

As described above, the PLLs 131 and 132 may have a configuration in which the phase difference signals that have passed through the LPFs 142a and 142b are output to the phase control devices 121 and 122. In such a case, since the VCOs 143a and 143b are connected subsequent to the LPFs 142a and 142b, circuits that are connected at subsequent stages of the LPFs 142a and 142b to extract phase difference signals may have an impedance that is sufficiently higher than the output impedances of the LPFs 142a and 142b. This arrangement makes it possible to suppress an influence on the inputs to the VCOs 143a and 143b.

Also, the impedance of the circuits that are connected at subsequent stages of the LPFs 142a and 142b to extract phase difference signals may be set higher than the input impedances of the VCOs 143a and 143b. This arrangement makes it possible to suppress an influence on the inputs to the VCOs 143a and 143b.

In the configuration illustrated in FIGS. 12A to 19B, the LPFs 142a and 142b may also have a configuration in which the phase difference signals that have passed through the PLLs 131 and 132 are output to the phase control devices 121 and 122, as in the example illustrated in FIGS. 20A and 20B.

(Configuration of Phase Control Device)

Figure 21A:
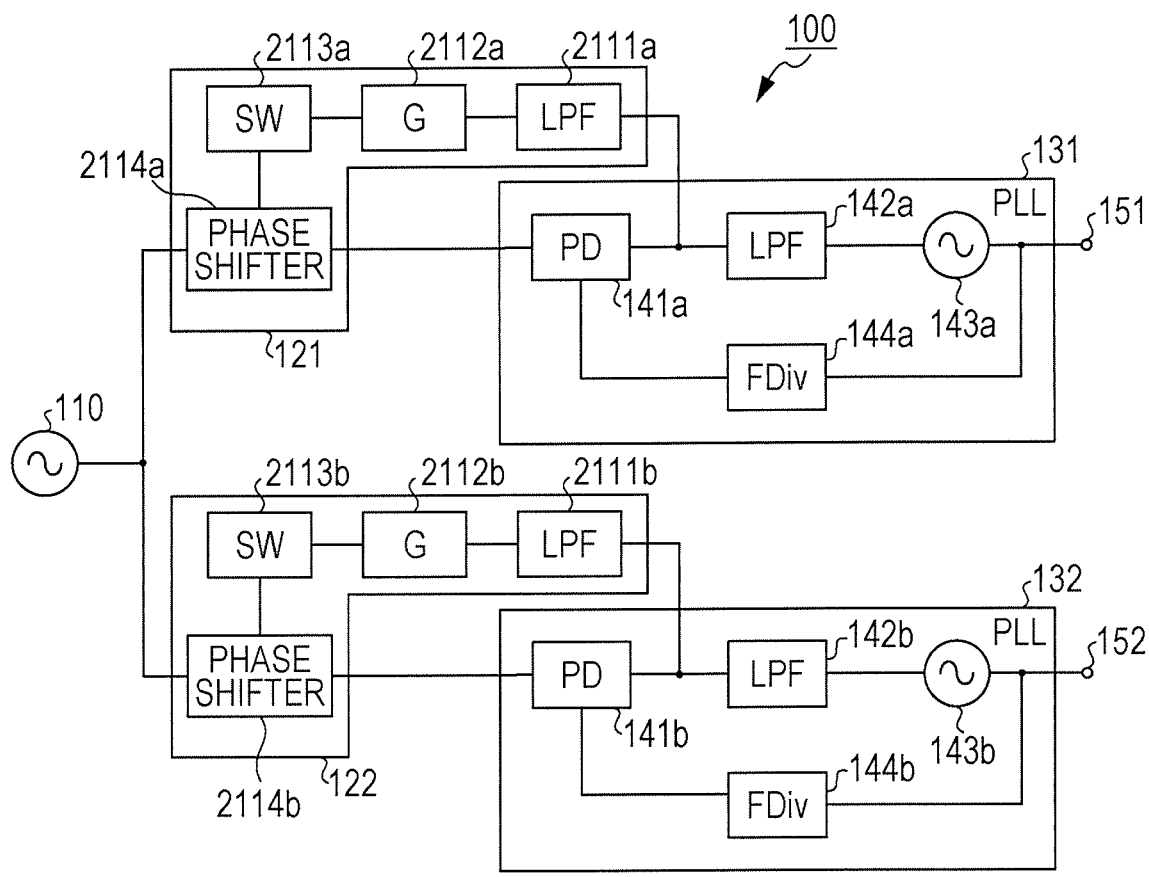
FIG. 21A is a diagram illustrating an example of the configuration of a phase control device.
Figure 21B:
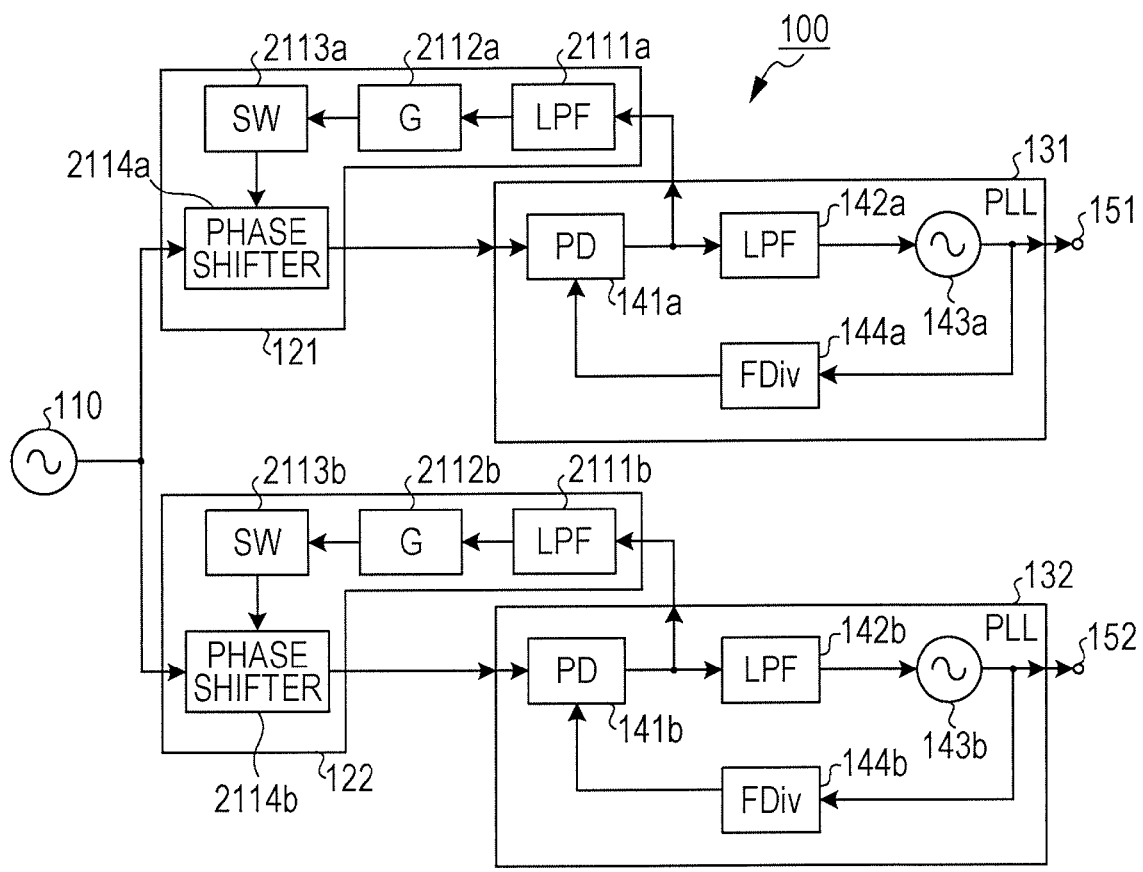
FIG. 21B is a diagram illustrating an example of flows of signals in the configuration of the phase control device illustrated in FIG. 21A.

FIG. 21A is a diagram illustrating an example of the configuration of a phase control device. FIG. 21B is a diagram illustrating an example of flows of signals in the configuration of the phase control device illustrated in FIG. 21A. In FIGS. 21A and 21B, elements that are the same as or similar to those illustrated in FIGS. 11A and 11B are denoted by the same reference numerals, and descriptions thereof are not given hereinafter. The phase control device 121 illustrated in FIGS. 21A and 21B includes an LPF 2111a, a level conversion circuit 2112a, a switch 2113a, and a phase shifter 2114a. The phase control device 122 includes an LPF 2111b, a level conversion circuit 2112b, a switch 2113b, and a phase shifter 2114b.

Although the configuration of the phase control device 121 is described below, the configuration of the phase control device 122 is also substantially the same. The LPF 2111a permits only a predetermined low-frequency component of a phase difference signal output from the phase comparator 141a in the PLL 131 to pass to the level conversion circuit 2112a.

The level conversion circuit 2112a (G) adjusts the level of the phase difference signal output from the LPF 2111a and outputs the resulting phase difference signal to the switch 2113a. For example, the level conversion circuit 2112a adjusts a direct-current (DC) voltage offset and a gain of the phase difference signal from the LPF 2111a so that the phase difference signal reaches the level of an input of a control terminal of the phase shifter 2114a.

The switch 2113a (SW) turns on/off the outputting of the phase difference signal, output from the level conversion circuit 2112a, to the phase shifter 2114a. The phase shifter 2114a varies the phase of the reference signal input to the PLL 131 from the reference signal oscillator 110, by using the amount of phase corresponding to the phase difference signal output from the switch 2113a.

For example, the band of the LPF 2111a is set smaller than the band of the LPF 142a. As a result, the time constant of a loop for phase control performed by the phase control device 121 can be set slower compared with that of the internal loop in the PLL 131.

With this arrangement, when the internal loops in the PLLs 131 and 132 are in a stable state in which frequency and phase bouncing for the transient response settles down, the phase control devices 121 and 122 can perform phase control based on the phase difference signals. Thus, a stable state is reached within the time constants of the PLLs 131 and 132, thus making it possible to stably suppress a phase mismatch due to variations in the characteristics of the VCOs 143a and 143b.

For example, the on/off state of the switch 2113a in the phase control device 121 is intermittently controlled by a control circuit (not illustrated) in the electronic circuit 100. The switch 2113a has a latch function for maintaining, when the output of the phase difference signal to the phase shifter 2114a is switched from the on state to the off state, an output value of the phase shifter 2114a when the output of the phase difference signal was on last time.

With this arrangement, when the internal loops in the PLLs 131 and 132 are in a stable state in which frequency and phase bouncing in the transient response settles down, the phase control devices 121 and 122 can perform phase control based on the phase difference signals. Thus, a stable state is reached within the time constants of the PLLs 131 and 132, thus making it possible to stably suppress a phase mismatch due to variations in the characteristics of the VCOs 143a and 143b.

As described above, as a result of the provision of the LPFs 2111a and 2111b, the loop of the phase control performed by the phase control device 121 becomes a slow loop (with a considerably narrow loop band) compared with the internal loop of each PLL. However, when multiple PLLs are provided (two PLLs 131 and 132 in this case), they may not make the completely same transient response including the direction, even when the transition time is substantially the same.

In contrast, as a result of the provision of the switches 2113a and 2113b, the phase control device 121 can perform phase control after the loop of the phase control by the phase control device 121 becomes stable. Thus, before the loop of the phase control by the phase control device 121 becomes stable, it is possible to ensure that variations in the loop for the phase control by the phase control device 121 does not appear in the output of each PLL. Then, after the loop for the phase control by the phase control device 121 becomes stable, the switch 2113a is turned on/off so as to allow variations (in the transition process) in the loop for the phase control by the phase control device 121 to appear in the output of each PLL only within the time in which variations in the internal loop in each PLL occurs. In such a manner, the phase control by the phase control device 121 can be performed with an influence of short-duration variations on the outputs to the PLLs. It is also possible to simultaneously perform the phase control on the PLLs.

Figure 21C:
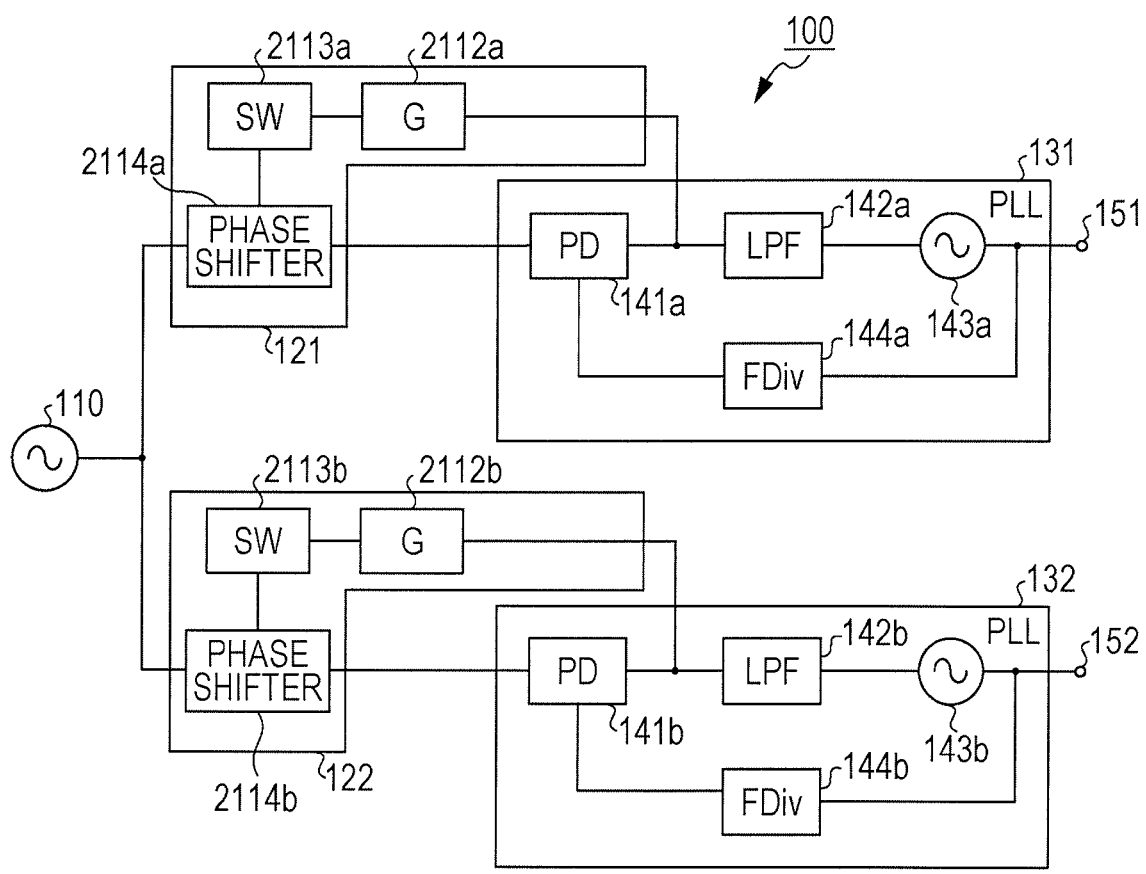
FIG. 21C is a diagram illustrating a first modification of the configuration of the phase control device.
Figure 21D:
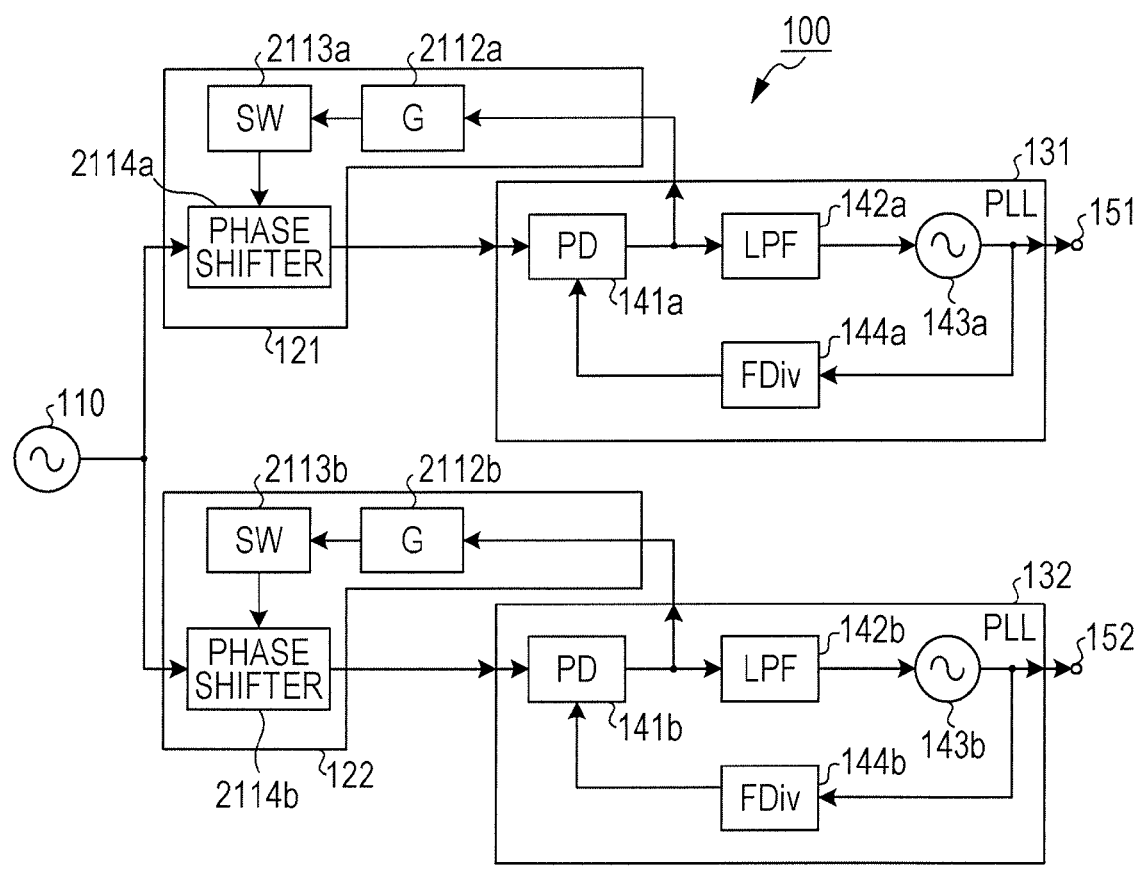
FIG. 21D is a diagram illustrating an example of flows of signals in the configuration of the phase control device illustrated in FIG. 21C.

FIG. 21C is a diagram illustrating a first modification of the configuration of the phase control device. FIG. 21D is a diagram illustrating an example of flows of signals in the configuration of the phase control device illustrated in FIG. 21C. In FIGS. 21C and 21D, elements that are the same as or similar to those in FIGS. 21A and 21B are denoted by the same reference numerals, and descriptions thereof are not given hereinafter. As illustrated in FIGS. 21C and 21D, the phase control devices 121 and 122 may have configurations in which the LPFs 2111a and 2111b are omitted, respectively. In such a case, a stable state is also reached within the time constants of the PLLs 131 and 132, thus making it possible to stably suppress a phase mismatch due to variations in the characteristics of the VCOs 143a and 143b.

Figure 21E:
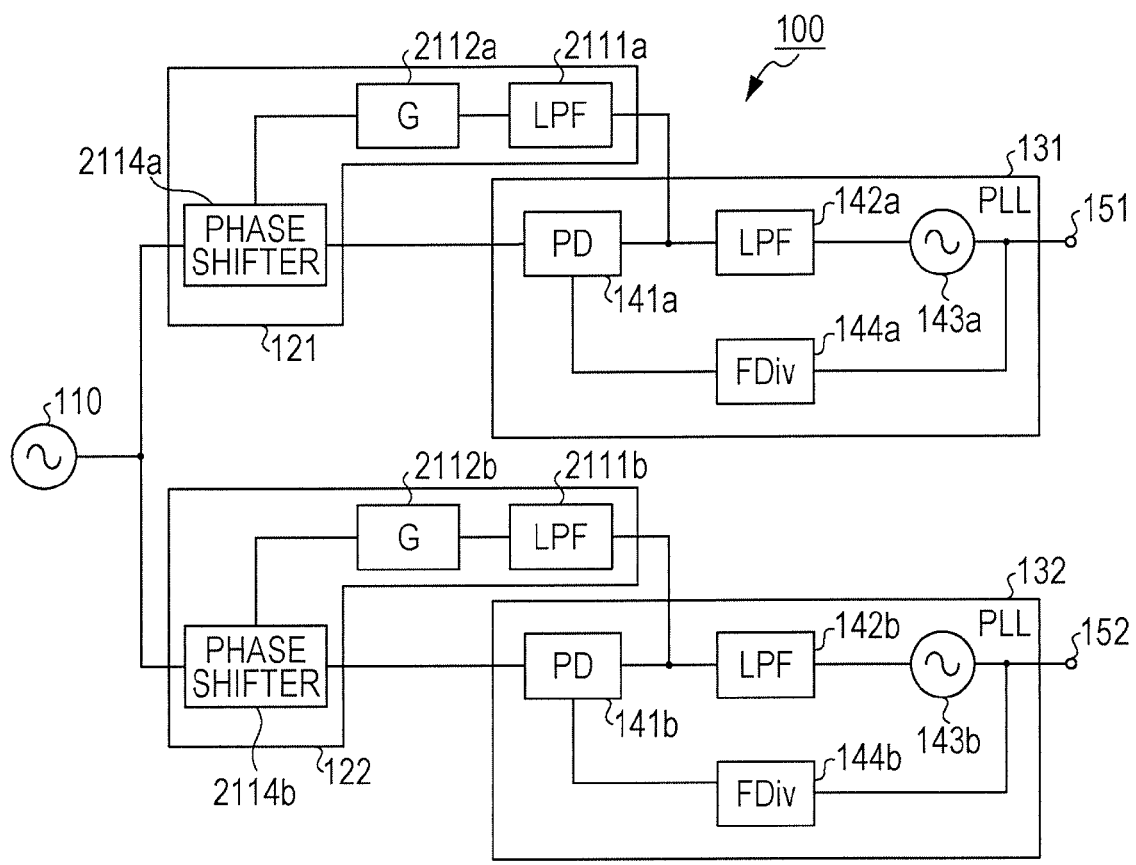
FIG. 21E is a diagram illustrating a second modification of the configuration of the phase control device.
Figure 21F:
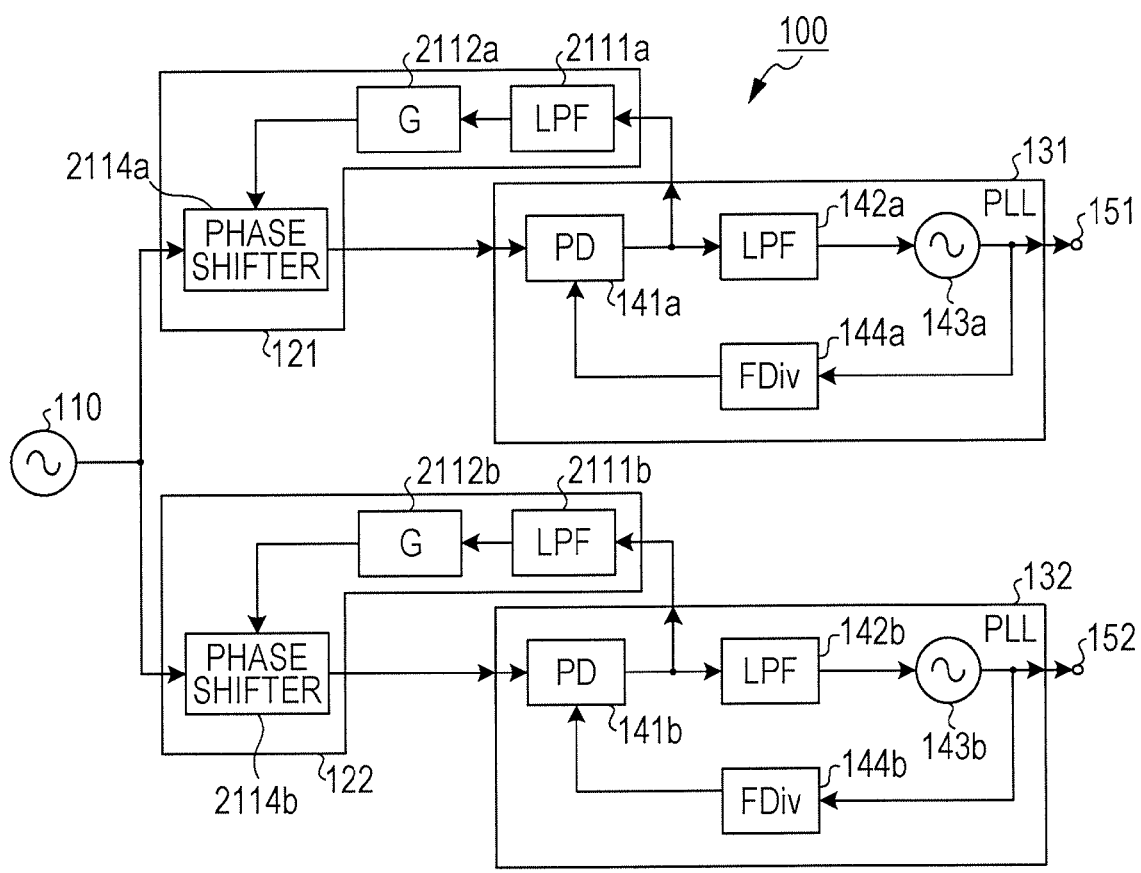
FIG. 21F is a diagram illustrating an example of flows of signals in the configuration of the phase control device illustrated in FIG. 21E.

FIG. 21E is a diagram illustrating a second modification of the configuration of the phase control device. FIG. 21F is a diagram illustrating an example of flows of signals in the configuration of the phase control device illustrated in FIG. 21E. In FIGS. 21E and 21F, elements that are the same as or similar to those in FIGS. 21A and 21B are denoted by the same reference numerals, and descriptions thereof are not given hereinafter. As illustrated in FIGS. 21E and 21F, the phase control devices 121 and 122 may have configurations in which the switches 2113a and 2113b are omitted, respectively. In such a case, a stable state is also reached within the time constants of the PLLs 131 and 132, thus making it possible to stably suppress a phase mismatch due to variations in the characteristics of the VCOs 143a and 143b.

As illustrated in FIG. 21A to FIG. 21F, the control loops of the phases based on the phase difference signals, the control loops being formed by the phase control devices 121 and 122, may be made slow compared with the time constants of the loops of the PLLs 131 and 132, or may be subjected to intermittent operation. Thus, it is possible to stably suppress a phase mismatch due to variations in the characteristics of the VCOs 143*a* and 143*b*.

Also, the on/off operation of the switches 2113*a* and 2113*b* in the phase control devices 121 and 122 may also be performed at the same time (for example, at the same time at a degree that is substantially the same as or smaller than the time constants of the PLLs 131 and 132). With this arrangement, since the phase control devices 121 and 122 can simultaneously perform the phase control based on the phase difference signals, it is possible to suppress a phase mismatch due to variations in the characteristics of the VCOs 143*a* and 143*b*.

Although the above description has been given of the configuration of the phase control devices 121 and 122 illustrated in FIGS. 11A and 11B, the same also applies to the phase control devices 121 to 123 according to the example configuration in each embodiment described above.

(Time Chart when Output Phases of PLLs are Made to Match)

Figure 22:
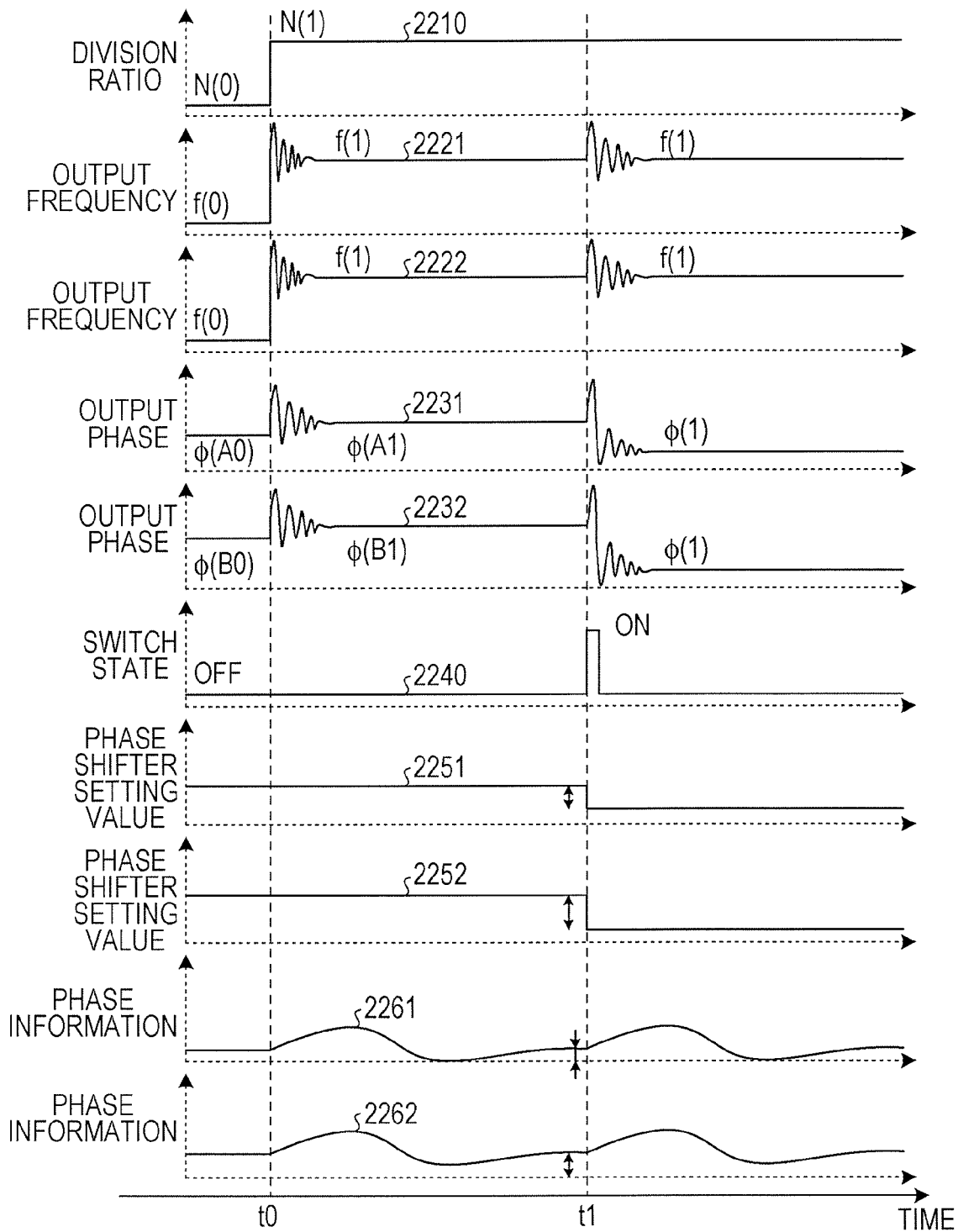
FIG. 22 is an example of a time chart when output phases of PLLs are made to match each other.

FIG. 22 is an example of a time chart when output phases of PLLs are made to match each other. In FIG. 22, the electronic circuit 100 illustrated in FIGS. 21A and 21B is described by way of example.

A division ratio 2210 indicates a division ratio in the frequency dividers 144*a* and 144*b* in the PLLs 131 and 132. In the example illustrated in FIG. 22, for convenience of description, at time t0, the division ratio of the frequency dividers 144*a* and 144*b* is changed from N(0) to N(1).

Output frequencies 2221 and 2222 represent the frequencies of output signals of the PLLs 131 and 132, respectively. At time t0, the output frequencies 2221 and 2222 both change from frequency f(0) to frequency f(1).

Output phases 2231 and 2232 represent the phases of output signals of the PLLs 131 and 132, respectively. At time t0, the output phase 2231 changes from phase φ (A0) to phase φ (A1). Also, at time t0, the output phase 2232 changes from phase φ (B0) to phase φ (B1). These changes indicate phase differences due to variations (individual differences) in the VCOs 143*a* and 143*b* in the PLLs 131 and 132.

The phase difference signals output from the phase comparators 141*a* and 141*b* in the PLLs 131 and 132 include information corresponding to phase differences due to variations (individual differences) or the like in the PLLs 131 and 132 in the VCOs 143*a* and 143*b*. The phase difference signals from the phase comparators 141*a* and 141*b* in the LPFs 2111*a* and 2111*b* are input to the PLLs 131 and 132 in the phase control devices 121 and 122, respectively. Stable signals are input to the phase shifters 2114*a* and 2114*b* in the phase control devices 121 and 122 at a time constant that is slower than that of the internal loops of the PLLs 131 and 132.

A switch state 2240 indicates the on/off states of the switches 2113*a* and 2113*b* in the phase control devices 121 and 122. Phase-shifter setting values 2251 and 2252 indicate, in the phase control devices 121 and 122, setting values input to the phase shifters 2114*a* and 2114*b* from the switches 2113*a* and 2113*b*. The phase-shifter setting values 2251 and 2252 are values corresponding to the output phases 2231 and 2232, respectively. Phase information 2261 and 2262 indicate phase difference signals output from the LPFs 2111*a* and 2111*b* in the phase control devices 121 and 122. The phase information 2261 and 2262 has values corresponding to the output phases 2231 and 2232, respectively.

At time t1, the switches 2113*a* and 2113*b* in the phase control devices 121 and 122 are controlled to be turned on at the same time. The phase difference signals of the phase comparators 141*a* and 141*b* are subjected to level adjustment by the level conversion circuits 2112*a* and 2112*b*, respectively, and the resulting phase difference signals are input to the control terminals of the phase shifter 2114*a* and 2114*b*, so that the setting values of the phase control devices 121 and 122 change.

Thereafter, the switches 2113*a* and 2113*b* in the phase control devices 121 and 122 are controlled to be turned off immediately (that is, sufficiently faster than the time constant of a loop of a function for matching the phases of the PLLs 131 and 132). In this case, even after the switches 2113*a* and 2113*b* are turned off, the setting values input to the phase shifters 2114*a* and 2114*b* are maintained. Thereafter, after the time indicated by the time constant of the internal loops of the PLLs 131 and 132 passes, the PLLs 131 and 132 both enter a state in which they operate stably at an output frequency f(1) and at an output phase φ (1).

(Configuration of Transmission/Reception Apparatus to which Electronic Circuit is Applied)

Figure 23A:
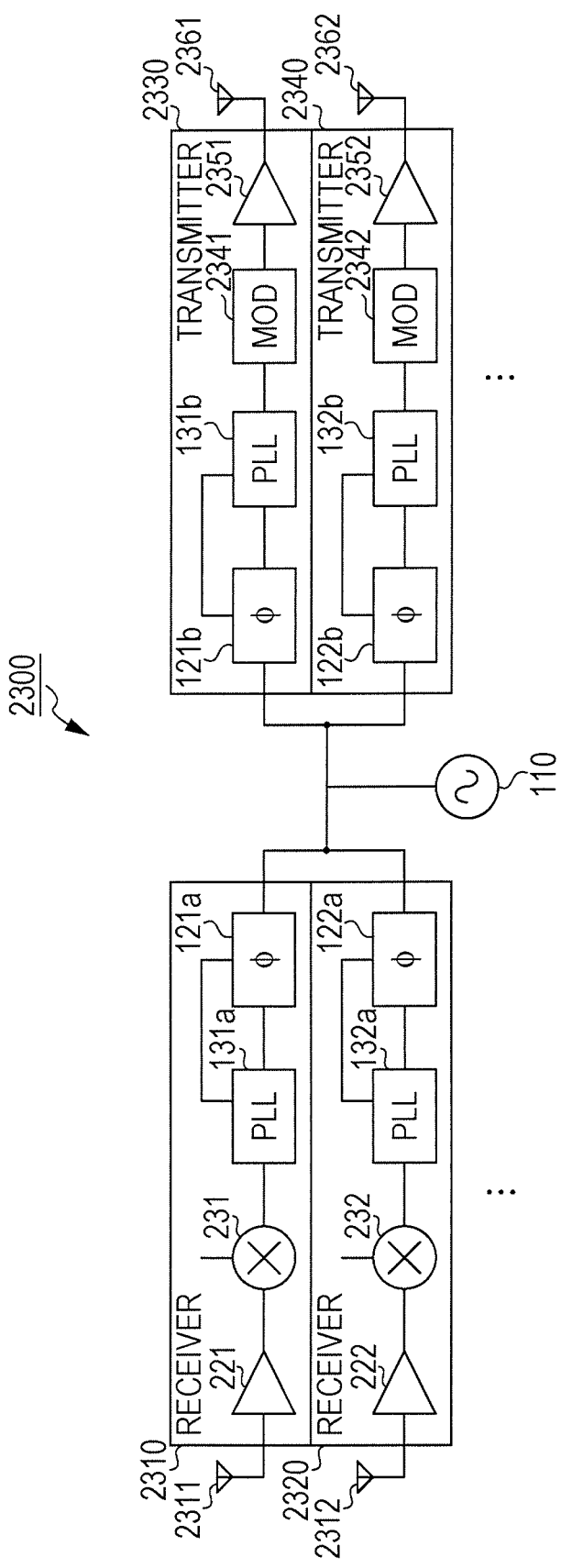
FIG. 23A is a diagram illustrating an example configuration of a transmission/reception apparatus to which the electronic circuit is applied.
Figure 23B:
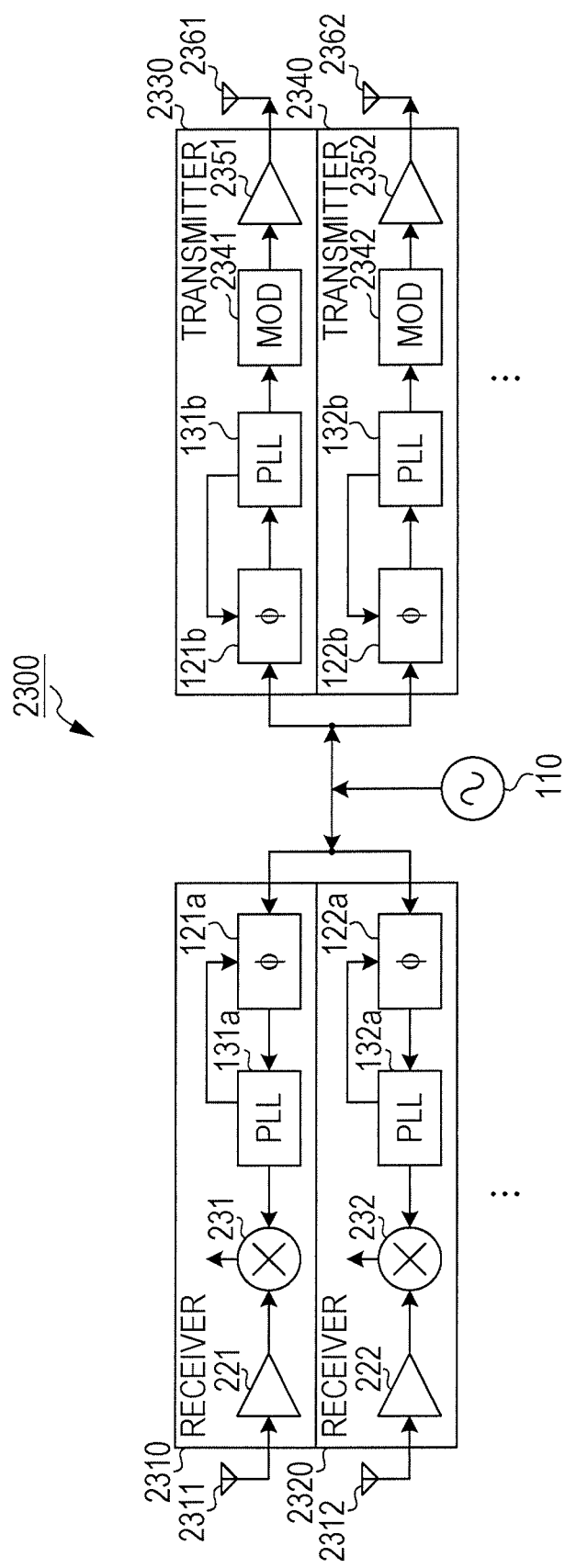
FIG. 23B is a diagram illustrating an example of flows of signals in the configuration of the transmission/reception apparatus illustrated in FIG. 23A.

FIG. 23A is a diagram illustrating an example configuration of a transmission/reception apparatus to which the electronic circuit is applied. FIG. 23B is a diagram illustrating an example of flows of signals in the configuration of the transmission/reception apparatus illustrated in FIG. 23A. A transmission/reception apparatus 2300 to which the electronic circuit 100 illustrated in FIGS. 12A and 12B and the electronic circuit 100 illustrated in FIGS. 15A and 15B are applied will be described as one example with reference to FIGS. 23A and 23B.

The transmission/reception apparatus 2300 includes a reference signal oscillator 110, receivers 2310 and 2320, and transmitters 2330 and 2340. The reference signal oscillator 110 branches a generated reference signal and distributes the resulting reference signals to the receivers 2310 and 2320 and the transmitters 2330 and 2340.

The receiver 2310 includes an antenna 2311, an amplifier 221, a mixer 231, a phase control device 121*a*, and a PLL 131*a*. The antenna 2311 receives a signal wirelessly transmitted from another communication apparatus and outputs the signal to the amplifier 221. The amplifier 221 amplifies the signal output from the antenna 2311 and outputs the resulting signal to the mixer 231. The phase control device 121*a* is, for example, the phase control device 121 illustrated in FIGS. 12A and 12B. The PLL 131*a* is, for example, the PLL 131 illustrated in FIGS. 12A and 12B.

The receiver 2320 includes an antenna 2312, an amplifier 222, a mixer 232, a phase control device 122*a*, and a PLL 132*a*. The antenna 2312 receives a signal wirelessly transmitted from another communication apparatus and outputs the signal to the amplifier 222. The amplifier 222 amplifies the signal output from the antenna 2312 and outputs the resulting signal to the mixer 232. The phase control device 122*a* is, for example, the phase control device 122 illustrated in FIGS. 12A and 12B. The PLL 132*a* is, for example, the PLL 132 illustrated in FIGS. 12A and 12B.

The transmitter 2330 includes a phase control device 121*b*, a PLL 131*b*, a modulator 2341, an amplifier 2351, and an antenna 2361. The modulator 2341 modulates an output signal of the PLL 131*b* and outputs the modulated signal to the amplifier 2351. The amplifier 2351 amplifies the signal output from the modulator 2341 and outputs the amplified signal to the antenna 2361. The antenna 2361 wirelessly transmits the signal output from the amplifier 2351.

The transmitter 2340 includes a phase control device 122*b*, a PLL 132*b*, a modulator 2342, an amplifier 2352, and an antenna 2362. The modulator 2342 modulates an output signal of the PLL 132*b* and outputs the modulated signal to the amplifier 2352. The amplifier 2352 amplifies the signal output from the modulator 2342 and outputs the amplified signal to the antenna 2362. The antenna 2362 wirelessly transmits the signal output from the amplifier 2352.

Although the above description has been given of the transmission/reception apparatus 2300 to which the electronic circuit 100 illustrated in FIGS. 12A and 12B and the electronic circuit 100 illustrated in FIGS. 15A and 15B are applied, the example configuration of each embodiment may also be applied to the transmission/reception apparatus 2300.

Figure 23C:
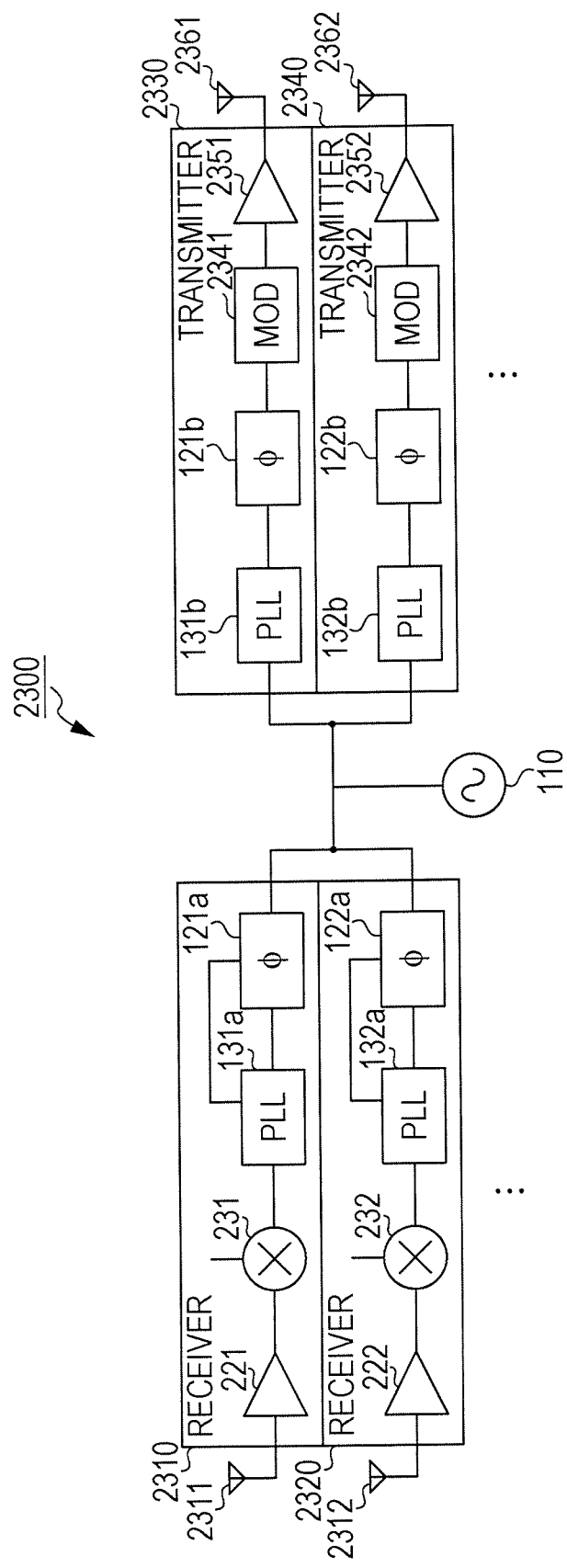
FIG. 23C is a diagram illustrating a modification of the configuration of a transmission/reception apparatus to which the electronic circuit is applied.
Figure 23D:
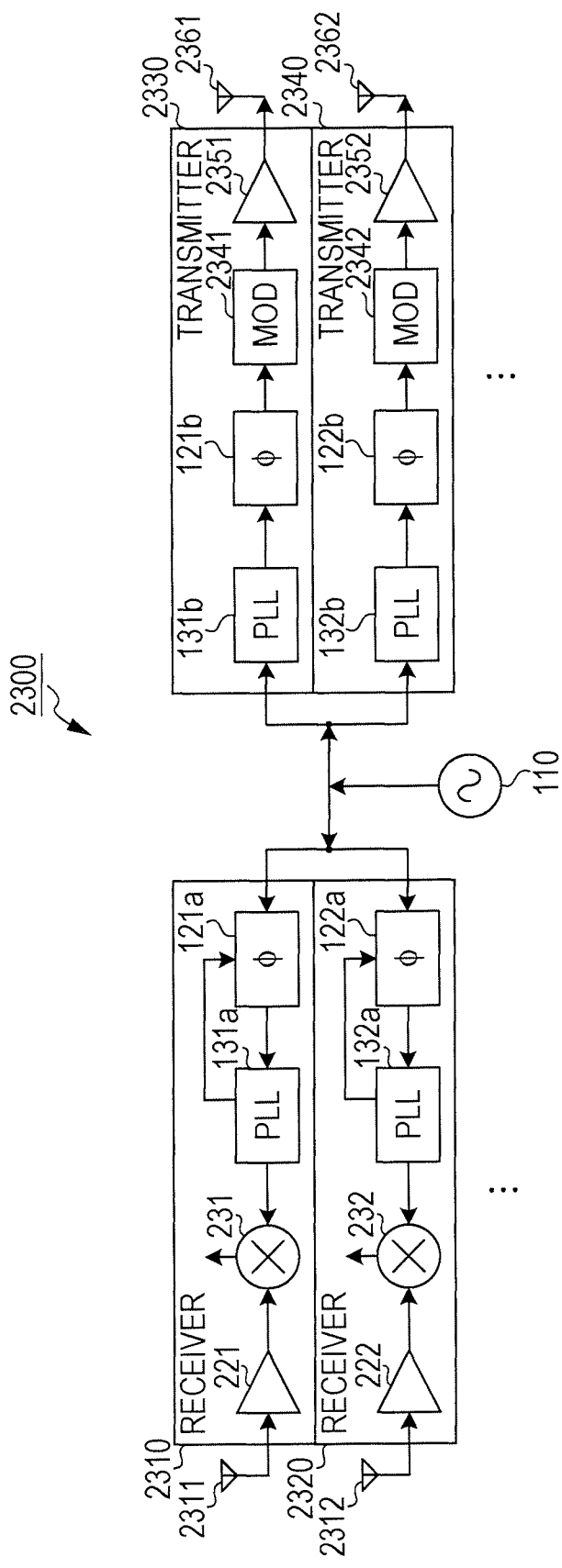
FIG. 23D is a diagram illustrating an example of flows of signals in the configuration of the transmission/reception apparatus illustrated in FIG. 23C.

FIG. 23C is a diagram illustrating a modification of the configuration of a transmission/reception apparatus to which the electronic circuit is applied. FIG. 23D is a diagram illustrating an example of flows of signals in the configuration of the transmission/reception apparatus illustrated in FIG. 23C. In FIGS. 23C and 23D, elements that are the same as or similar to those in FIGS. 23A and 23B are denoted by the same reference numerals, and descriptions thereof are not given hereinafter. The transmission/reception apparatus 2300 illustrated in FIGS. 23C and 23D has a configuration in which the position of the phase control device 121b and the position of the PLL 131b are interchanged and the position of the phase control device 122b and the position of the PLL 132b are interchanged in the configuration illustrated in FIGS. 23C and 23D.

The PLLs 131b and 132b are, for example, the PLLs 131 and 132 illustrated in FIGS. 5A and 5B. The phase control devices 121b and 122b are, for example, the phase control devices 121 and 122 illustrated in FIGS. 5A and 5B.

Although the above description has been given of the transmission/reception apparatus 2300 including two receivers (receivers 2310 and 2320) and two transmitters (2330 and 2340), the transmission/reception apparatus 2300 may also include three or more receivers and three or more transmitters. The reference signal oscillator 110 distributes the generated reference signal to the receivers and the transmitters.

(Application Example Other than Transmission/Reception Apparatus)

Although a case in which the electronic circuit 100 is applied to the signal transmission/reception apparatus 2300 has been described above, the electronic circuit 100 may also be applied to a radar or the like that measures a distance to a subject and the direction thereof by radiating radio waves to the subject and measuring reflection waves of the radiated radio waves. The electronic circuit 100 may also be applied to a configuration in which PLLs are provided in a plurality of transceivers used for wired communication, such as electrical communication or optical communication.

As described above, according to the electronic circuit and the control method, it is possible to suppress a phase mismatch due to variations in the characteristics of the oscillators in a plurality of phase synchronization circuits.

For example, in recent years, there are demands for using a plurality of transmitters or receivers in equipment using electromagnetic waves, in order to realize a beam steering function, multiple-input and multiple-output (MIMO), and so on. When the number of transmitters/receivers increases, there are cases in which it is preferable to divide a circuit chip for realizing them into a plurality of chips.

For example, since the amount of loss in a transmission path increases as the transmission frequency increases, it is conceivable to divide the circuit to implement the transmitters/receivers with a plurality of chips in order to reduce the lengths of transmission paths between the integrated circuits (ICs) included in the transmitter/receivers and the antennas.

When a plurality of transmitters/receivers are implemented by a plurality of chips, signals for synchronization between the chips (for example, the receivers 2310 and 2320 and the transmitters 2330 and 2340 illustrated in FIGS. 23A and 23B) are used. For example, when a plurality of transmitters/receivers are implemented by one chip, a local signal for synchronization may be a high-frequency signal that is similar to a transmission signal when the amount of transmission path loss in the chip is small. However, when a plurality of transmitters/receivers are implemented by a plurality of chips, another high frequency amplifier is used, since the amount of loss increases when the local signal is transmitted in a high-frequency band.

Accordingly, the PLLs are arranged in the respective transmitters/receivers, and the reference signal is distributed to the transmitters/receivers and is used as a synchronization signal (see, for example FIGS. 23A and 23B). This arrangement makes it possible to reduce the amount of high-frequency loss due to the distribution of the local signals. However, for example, when manufacturing variations, temperature characteristic variations due to a thermal gradient, or the like occurs in the chip circuits, there is a problem in that, at one point in time, synchronization is performed when the output phases of the VCOs in the PLLs are different each other.

Consequently, for example, when a plurality of transmitters transmit signals, the signals are combined in a state in which the transmission beams are not in a proper state. Also, for example, when a plurality of receivers receive signals, the phases of the local signals of the mixers are different from each other, and thus an uncertainty is involved in combining reception signals.

(Phase Mismatch Due to VCO Characteristics)

Figure 24:
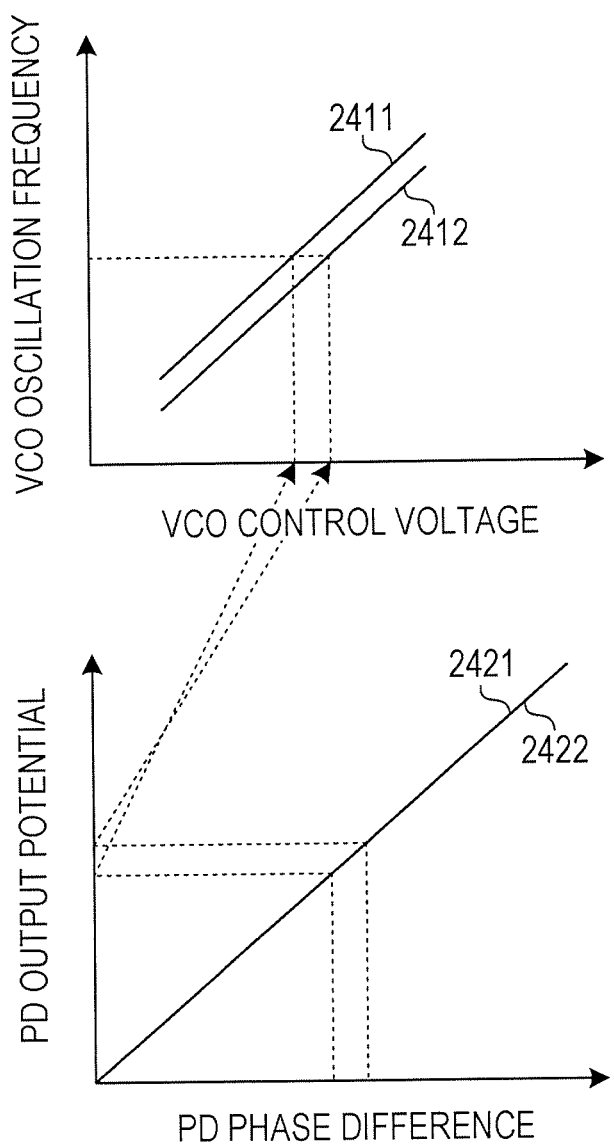
FIG. 24 is a diagram illustrating an example of a phase mismatch due to VCO characteristics.

FIG. 24 is a diagram illustrating an example of a phase mismatch due to VCO characteristics. A configuration for distributing a reference signal to two PLLs will now be described with reference to FIG. 24. VCO characteristics 2411 and 2412 illustrated in FIG. 24 indicate, in the VCOs in the two PLLs, characteristics of an oscillation frequency relative to a control voltage. As a result of variations in the VCOs in the two PLLs, the VCO characteristics 2411 and 2412 are different from each other. Thus, when the two PLLs enter a stable state, a mismatch occurs between the control voltages of the VCOs in the two PLLs.

PD characteristics 2421 and 2422 indicate, in the phase comparators in the two PLLs, a characteristic of an output potential relative to a phase difference between input signals. In the example illustrated in FIG. 24, the PD characteristics 2421 and 2422 match each other. However, since a mismatch occurs between the control voltages of the VCOs in the two PLLs, that is, between the output potentials of the phase comparators in the two PLLs, a mismatch occurs between the phase differences in the phase comparators in the two PLLs. Consequently, a phase mismatch occurs between the output signals of the two PLLs.

In contrast, according to the electronic circuit 100, since it controls the phases of the reference signals, the output signals, or the like in the PLLs by using the phase difference signals of the PLLs, it is possible to suppress a phase mismatch of the output signals of the PLLs or the like, the phase mismatch being caused by the characteristic difference in the VCOs in the PLLs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

APPENDIX

Appendix 1, an electronic circuit, comprising:
 a first oscillator configured to generate a reference signal;
 a plurality of phase synchronization circuits, each including
  a second oscillator configured to generate an output signal having a frequency corresponding to an input, and
  a phase comparator configured to input, to the second oscillator, a signal corresponding to a phase difference between the output signal generated by the second oscillator and the reference signal generated by the first oscillator; and
 a controller configured to control relative phases of the reference signals input to the phase synchronization circuits from the first oscillator, based on the signals input to the corresponding second oscillators from the phase comparators in the phase synchronization circuits.

Appendix 2, the electronic circuit according to Appendix 1, wherein the controller controls at least one of phases of the reference signals, input to the phase synchronization circuits from the first oscillator, so that a phase difference between the signals input to the second oscillators is reduced.

Appendix 3, the electronic circuit according to claim Appendix 1, wherein, with respect to the phase synchronization circuits, the controller controls the phases of the reference signals input to the phase synchronization circuits from the first oscillator, based on the signals input to the corresponding second oscillators from the phase comparators in the phase synchronization circuits.

Appendix 4, an electronic circuit comprising:
 a first oscillator configured to generate a reference signal;
 a plurality of phase synchronization circuits, each including
  a second oscillator configured to generate an output signal having a frequency corresponding to an input, and
  a phase comparator configured to input, to the second oscillator, a signal corresponding to a phase difference between the output signal generated by the second oscillator and the reference signal generated by the first oscillator;
 a plurality of mixers provided so as to correspond to the respective phase synchronization circuits and configured to multiply target signals, output from the mixers, by the output signals of the corresponding phase synchronization circuits; and
 a controller configured to control relative phases of the target signals output from the mixers, based on the signals input to the second oscillators from the phase comparators in the phase synchronization circuits.

Appendix 5, the electronic circuit according to Appendix 4 wherein the controller controls at least one of phases of the target signals, output from the mixers, so that a phase difference between the signals input to the second oscillators is reduced.

Appendix 6, the electronic circuit according to Appendix 4, wherein, with respect to the phase synchronization circuits, the controller controls phases of the target signals output from the mixers corresponding to the phase synchronization circuits, based on the signals input to the corresponding second oscillators from the phase comparators in the phase synchronization circuits.

Appendix 7, the electronic circuit according to one of Appendices 4 to 6, further comprising:
 a plurality of digital converters configured to convert the target signals, output from the corresponding mixers, from analog signals to digital signals,
 wherein the controller controls relative phases of target signals output from the mixers and converted into digital signals by the digital converters.

Appendix 8, the electronic circuit comprising:
 a first oscillator configured to generate a reference signal;
 a plurality of phase synchronization circuits, each including
  a second oscillator configured to generate an output signal having a frequency corresponding to an input, and
  a phase comparator configured to input, to the second oscillator, a signal corresponding to a phase difference between the output signal generated by the second oscillator and the reference signal generated by the first oscillator; and
 a controller configured to control relative phases of output signals output from the phase synchronization circuits, based on the signals input to the corresponding second oscillators from the phase comparators in the phase synchronization circuits.

Appendix 9, the electronic circuit according to Appendix 8, further comprising:
 a plurality of mixers provided so as to correspond to the respective phase synchronization circuits and configured to multiply target signals, output from the mixers, by the output signals of the corresponding phase synchronization circuits, and
 wherein the controller controls relative phases of the output signals input to the mixers from the corresponding phase synchronization circuits.

Appendix 10, the electronic circuit according to Appendix 9, wherein the controller controls at least one of phases of the output signals, input to the mixers from the phase synchronization circuits, so that a phase difference between the signals input to the second oscillators is reduced.

Appendix 11, the electronic circuit according to Appendix 9, wherein, with respect to the phase synchronization circuits, the controller controls phases of the output signals input to the mixers from the phase synchronization circuits, based on the signals input to the corresponding second oscillators from the phase comparators in the phase synchronization circuits.

Appendix 12, the electronic circuit according to Appendix 8, wherein output signals whose relative phases are controlled by the controller are output to transmitting units that transmit signals based on the output signals.

Appendix 13, the electronic circuit according to Appendix 12, wherein the controller controls at least one of phases of the output signals, input to the transmission units from the phase synchronization circuits, so that a phase difference between the signals input to the second oscillators is reduced.

Appendix 14, the electronic circuit according to Appendix 12, wherein, with respect to the phase synchronization circuits, the controller controls phases of the output signals output from the phase synchronization circuits to the transmission units, based on the signals input to the corresponding second oscillators from the phase comparators in the phase synchronization circuits.

Appendix 15, the electronic circuit according to one of Appendices 12 to 14, wherein, based on the signals input to the second oscillators from the phase comparators in the phase synchronization circuits and a signal corresponding to a predetermined phase difference, the controller controls a phase difference between output signals, output from the phase synchronization circuits, so that the phase difference reaches the predetermined phase difference.

Appendix 16, an electronic circuit comprising:

a first oscillator configured to generate a reference signal;

a plurality of phase synchronization circuits, each including a second oscillator configured to generate an output signal having a frequency corresponding to an input, and a phase comparator configured to input, to the second oscillator, a signal corresponding to a phase difference between the output signal generated by the second oscillator and the reference signal generated by the first oscillator; and a controller configured to control relative phases of output signals input to the phase comparators from the second oscillators in the phase synchronization circuits, based on the signals input to the corresponding second oscillators from the phase comparators in the phase synchronization circuits.

Appendix 17, the electronic circuit according to Appendix 16, wherein the controller controls at least one of phases of the output signals, input to the phase comparators from the second oscillators in the phase synchronization circuits, so that a phase difference between the signals input to the second oscillators is reduced.

Appendix 18, the electronic circuit according to Appendix 16, wherein, with respect to the phase synchronization circuits, the controller controls phases of the output signals input to the corresponding phase comparators from the second oscillators, based on the signals input to the corresponding second oscillators from the phase comparators in the phase synchronization circuits.

Appendix 19, the electronic circuit according to one of Appendices 16 to 18, wherein the phase synchronization circuits include corresponding frequency dividers configured to frequency-divide output signals generated by the second oscillators and input the frequency-divided output signals to the corresponding phase comparators, wherein the controller controls relative phases of the output signals input to the phase comparators from the frequency dividers in the phase synchronization circuits or relative phases of output signals input to the frequency dividers from the second oscillators in the phase synchronization circuits.

Appendix 20, the electronic circuit according to claim 1 one of Appendices 1 to 19, wherein the phase synchronization circuits include corresponding low-pass filters configured to permit only a predetermined frequency component of a signal corresponding to the phase difference output from the phase comparators to pass to the second oscillators, and wherein, based on signals input to the low-pass filters from the phase comparators in the phase synchronization circuits or signals input to the second oscillators from the low-pass filters in the phase synchronization circuits, the controller performs the relative phase control.

Appendix 21, the electronic circuit according to one of Appendices 1 to 20, wherein the controller performs the relative phase control based on the signals input to the second oscillators, by using a time constant that is slower than loops of the phase synchronization circuits.

Appendix 22, the electronic circuit according to one of Appendices 1 to 21, wherein the controller intermittently performs the relative phase control based on the signals input to the second oscillators.

Appendix 23, the electronic circuit according to one of Appendices 1 to 22, wherein the controller performs the relative phase control by controlling phases of signals at the same time or with a time difference that is the same as or smaller than a time constant of loops of the phase synchronization circuits.

Appendix 24, a control method for an electronic circuit including a first oscillator configured to generate a reference signal, and a plurality of phase synchronization circuits, each including a second oscillator configured to generate an output signal having a frequency corresponding to an input, and a phase comparator configured to input, to the second oscillator, a signal corresponding to a phase difference between the output signal generated by the second oscillator and the reference signal generated by the first oscillator, the control method comprising:

obtaining the signals input to the corresponding second oscillators from the phase comparators in the phase synchronization circuits; and controlling relative phases of the reference signals input to the phase synchronization circuits from the first oscillator, based on the obtained signals.

Appendix 25, a control method for an electronic circuit including a first oscillator configured to generate a reference signal, a plurality of phase synchronization circuits, each including a second oscillator configured to generate an output signal having a frequency corresponding to an input, a phase comparator configured to input, to the second oscillator, a signal corresponding to a phase difference between the output signal generated by the second oscillator and the reference signal generated by the first oscillator, and a plurality of mixers provided so as to correspond to the respective phase synchronization circuits and configured to multiply target signals, output from the mixers, by the output signals of the corresponding phase synchronization circuits, the control method comprising:

obtaining the signals input to the corresponding second oscillators from the phase comparators in the phase synchronization circuits; and controlling relative phases of the target signals output from the mixers, based on the obtained signal.

Appendix 26, a control method for an electronic circuit including a first oscillator configured to generate a reference signal, and a plurality of phase synchronization circuits, each including a second oscillator configured to generate an output signal having a frequency corresponding to an input, and a phase comparator configured to input, to the second oscillator, a signal corresponding to a phase difference between the output signal generated by the second oscillator and the reference signal generated by the first oscillator, the control method comprising:

obtaining the signals input to the corresponding second oscillators from the phase comparators in the phase synchronization circuits; and controlling relative phases of output signals output from the phase synchronization circuits, based on the obtained signals.

Appendix 27, a control method for an electronic circuit including a first oscillator configured to generate a reference signal, and a plurality of phase synchronization circuits, each including a second oscillator configured to generate an output signal having a frequency corresponding to an input, and a phase comparator configured to input, to the second oscillator, a signal corresponding to a phase difference between the output signal generated by the second oscillator and the reference signal generated by the first oscillator, the control method comprising:

obtaining the signals input to the corresponding second oscillators from the phase comparators in the phase synchronization circuits; and controlling relative phases of output signals input to the phase comparators from the second oscillators in the phase synchronization circuits, based on the obtained signals.

What is claimed is:

1. An electronic circuit, comprising:
   a first oscillator configured to generate a plurality of first reference signals;
   a plurality of phase synchronization circuits, each phase synchronization circuit being operable to receive one of the first reference signals and including:
     a second oscillator configured to generate an output signal having a frequency corresponding to an input to the second oscillator, and
     a phase comparator configured to input, to the second oscillator, a signal corresponding to a phase difference between the output signal of the second oscillator and a corresponding one of a plurality of second reference signals; and
   a controller configured to control the plurality of first reference signals so as to generate the plurality of second reference signals having relative phases input to each of the plurality of phase synchronization circuits, based on the signals that are input to the corresponding second oscillators from the phase comparators in the plurality of phase synchronization circuits.

2. The electronic circuit according to claim 1, wherein the controller is further configured to control at least one of phases of the first reference signals, which are input to the phase synchronization circuits from the first oscillator, so as to reduce a phase difference between the signals that are input to the second oscillators.

3. The electronic circuit according to claim 1, wherein, with respect to the phase synchronization circuits, the controller is further configured to control the phases of the first reference signals that are input to the phase synchronization circuits from the first oscillator, based on the signals that are input to the corresponding second oscillators from the phase comparators in the phase synchronization circuits.

4. The electronic circuit according to claim 1, further comprising:
   a plurality of mixers, each of the plurality of mixers corresponding to one of the phase synchronization circuits, configured to multiply target signals by the output signals of the corresponding phase synchronization circuits, and
   wherein the controller controls relative phases of signals that are output from the mixers, based on the signals input to the second oscillators from the phase comparators in the phase synchronization circuits.

5. The electronic circuit according to claim 4, wherein the controller is further configured to control at least one of phases of the target signals, which are output from the mixers, so as to reduce a phase difference between the signals input to the second oscillators.

6. The electronic circuit according to claim 4, wherein, with respect to the phase synchronization circuits, the controller is further configured to control phases of the target signals that are output from the mixers corresponding to the phase synchronization circuits, based on the signals that are input to the corresponding second oscillators from the phase comparators in the phase synchronization circuits.

7. The electronic circuit according to claim 4, further comprising:
   a plurality of digital converters configured to convert the target signals, which are output from the corresponding mixers, from analog signals to digital signals,
   wherein the controller is further configured to control relative phases of target signals that are output from the mixers and converted into digital signals by the digital converters.

8. An electronic circuit comprising:
   a first oscillator configured to generate a reference signal;
   a plurality of phase synchronization circuits, each phase synchronization circuit being operable to receive the reference signal and including
     a second oscillator configured to generate an output signal having a frequency corresponding to an input to the second oscillator, and
     a phase comparator configured to input, to the second oscillator, a signal corresponding to a phase difference between the output signal of the second oscillator and the reference signal of the first oscillator; and
   a controller configured to control relative phases of output signals that are output from the second oscillator to the phase comparator, based on the signals that are input to the corresponding second oscillators from the phase comparators in the plurality of phase synchronization circuits.

9. The electronic circuit according to claim 8, further comprising:
   a plurality of mixers, each of the plurality of mixers corresponding to one of the phase synchronization circuits, configured to multiply target signals by the output signals of the corresponding phase synchronization circuits, and
   wherein the controller is further configured to control relative phases of the output signals that are input to the mixers from the corresponding phase synchronization circuits.

10. The electronic circuit according to claim 9, wherein the controller is further configured to control at least one of phases of the output signals, which are input to the mixers from the phase synchronization circuits, so as to reduce a phase difference between the signals that are input to the second oscillators.

11. The electronic circuit according to claim 9, wherein, with respect to the phase synchronization circuits, the controller is further configured to control phases of the output signals that are input to the mixers from the phase synchronization circuits, based on the signals that are input to the corresponding second oscillators from the phase comparators in the phase synchronization circuits.

12. The electronic circuit according to claim 8, wherein output signals whose relative phases are controlled by the controller are output to transmitting units that transmit signals based on the output signals.

13. The electronic circuit according to claim 12, wherein the controller is further configured to control at least one of phases of the output signals, which are input to the transmission units from the phase synchronization circuits, so as to reduce a phase difference between the signals that are input to the second oscillators.

14. The electronic circuit according to claim 12, wherein, with respect to the phase synchronization circuits, the controller is further configured to control phases of the output signals that are output from the phase synchronization circuits to the transmission units, based on the signals that are input to the corresponding second oscillators from the phase comparators in the phase synchronization circuits.

15. The electronic circuit according to claim 12, wherein, based on the signals that are input to the second oscillators from the phase comparators in the phase synchronization circuits and a signal corresponding to a predetermined phase difference, the controller is further configured to control a phase difference between output signals, which are output from the phase synchronization circuits, so that the phase difference reaches the predetermined phase difference.

16. The electronic circuit according to claim 8, wherein the controller is further configured to control relative phases of output signals that are input to the phase comparators from the second oscillators in the phase synchronization circuits, based on the signals that are input to the corresponding second oscillators from the phase comparators in the phase synchronization circuits.

17. The electronic circuit according to claim 16, wherein the controller is further configured to control at least one of phases of the output signals, which are input to the phase comparators from the second oscillators in the phase synchronization circuits, so as to reduce a phase difference between the signals that are input to the second oscillators.

18. The electronic circuit according to claim 16, wherein, with respect to the phase synchronization circuits, the controller is further configured to control phases of the output signals input to the corresponding phase comparators from the second oscillators, based on the signals that are input to the corresponding second oscillators from the phase comparators in the phase synchronization circuits.

19. The electronic circuit according to claim 16,
wherein the phase synchronization circuits further include corresponding frequency dividers configured to frequency-divide output signals that are generated by the second oscillators and to input the frequency-divided output signals to the corresponding phase comparators, and wherein the controller is further configured to control relative phases of the output signals that are input to the phase comparators from the frequency dividers in the phase synchronization circuits or relative phases of output signals that are input to the frequency dividers from the second oscillators in the phase synchronization circuits.

20. A control method for an electronic circuit including
a first oscillator configured to generate a plurality of first reference signals, and
a plurality of phase synchronization circuits, each phase synchronization circuit being operable to receive the reference signal and including
a second oscillator configured to generate an output signal having a frequency corresponding to an input to the second oscillator, and
a phase comparator configured to input, to the second oscillator, a signal corresponding to a phase difference between the output signal of the second oscillator and corresponding one of a plurality of second reference signals,
the control method comprising:
obtaining the signals that are input to the corresponding second oscillators from the phase comparators in the plurality of phase synchronization circuits; and
controlling the plurality of first reference signals so as to generate the plurality of second reference signals having relative phases input to each of the plurality of phase synchronization circuits, based on the obtained signals.

* * * * *